United States Patent [19]
Schlotterer et al.

[11] Patent Number: 5,525,985
[45] Date of Patent: Jun. 11, 1996

[54] SURE CHIP

[75] Inventors: John C. Schlotterer, Murrysville; Robert T. Elms, Monroeville Boro, both of Pa.

[73] Assignee: Eaton Corporation, Cleveland, Ohio

[21] Appl. No.: 636,643

[22] Filed: Dec. 28, 1990

[51] Int. Cl.$^6$ .................................................. H03M 1/12
[52] U.S. Cl. ........................................ 341/136; 341/155
[58] Field of Search .................................. 341/136, 139, 341/141, 155, 133, 135

[56] References Cited

U.S. PATENT DOCUMENTS 3,323,034  5/1967  Dubin et al. .
3,754,182  8/1973  Morris et al. .
3,925,709  12/1975  Mitchell et al. .

(List continued on next page.)

FOREIGN PATENT DOCUMENTS 2155266  9/1985  United Kingdom .
WO-A-8701765  3/1987  WIPO .

OTHER PUBLICATIONS

"Interrupt–Driven Microprocessor–Based Overcurrent Relay" by M. A. Manzoul, IEEE Transactions on Industrial Elecronics, vol. 38, No. 1, pp. 8–9, Feb. 1991.
"Rule–Based Coordination Program Evaluates Distribution Overcurrent Protection Alternatives" by S. R. Mendis, M. T. Bishop and D. A. Gonzalez, IEEE Computer Applications in Power, pp. 31–36, Apr. 1991.
"How to Select a Microcontroller", John J. Vaglica and Peter S. Gimour, IEEE Spectrum Magazine, Nov. 1990.
"Using the Motorola MC68HC11", Steve Garcia and Burton Brown, Circuit Gellar Ink Magazine, Dec. 1990, Jan. 1991.
Westinghouse Descriptive Bulletin 8171, "IQ Data", Mar. 1990.
Technical Article, "Monolithic Sensor Interfaces With On–Board Digital Signal Processing", Sharbel E. Noujaim, Proceedings of The American Control Conference, Jun. 1988.
Technical Article, "How to Select a Microcontroller", John J. Vaglica and Peter S. Gimour, IEEE Spectrum Magazine, Nov. 1990.
Technical Article, "Using the Motorola MC68HC11", Steven Ciarcia and Burton Brown, Circuit Cellar Ink Magazine, Dec. '90/Jan. '91.
Commercial Literature, "Spectra RMS Molded Case Circuit Breakers", published by The General Electric Company, 1984.
Technical Data Bulletin MC68HC11A8, "HCMOS Single––Chip Microcomputer", published by Motorola, Inc., 1987.
Publication No. MC6805UM(AD2), "M6805 HMOS M146805 CMOS Family, Microcomputer/Microprocessors User's Manual", published by Motorola, Inc., 1983.

Primary Examiner—Brian K. Young
Attorney, Agent, or Firm—Martin J. Moran

[57] ABSTRACT

A hybrid monolithic IC that is standardized for controlling various types of electrical equipment, such as circuit breakers, motor controllers and the like. The IC is a hybrid monolithic IC, fabricated in CMOS technology. The shortcomings of utilizing CMOS technology for linear or analog circuitry is overcome by the implementation of the IC to provide a hybrid monolithic IC that is relatively less expensive than using multiple IC's or a single IC fabricated from biCMOS technology. Also, by utilizing a single IC, such control and monitoring circuitry can be located in existing electrical equipment. The IC includes an on-board microprocessor, an A/D subsystem and various input/output devices which make it adaptable for use in various types of electrical equipment. In order to improve the resolution of the A/D subsystem, circuitry is provided, which includes current and voltage ranging amplifiers for ranging analog input voltage and current signals and compensating internal offsets, in such amplifiers, inherent in CMOS linear circuits which can affect the accuracy of the least significant bit. The ranging circuitry is controlled either automatically or manually to provide additional resolution of the A/D subsystem.

14 Claims, 33 Drawing Sheets

U.S. PATENT DOCUMENTS

| | | | |
|---|---|---|---|
| 4,114,048 | 9/1978 | Hull et al. . | |
| 4,131,935 | 12/1978 | Clement . | |
| 4,166,205 | 8/1979 | Maier et al. . | |
| 4,245,184 | 1/1981 | Billings et al. . | |
| 4,251,743 | 2/1981 | Hareyama | 307/297 |
| 4,316,136 | 2/1982 | Saxarra et al. . | |
| 4,321,583 | 3/1982 | Baron et al. | 341/139 X |
| 4,331,997 | 5/1982 | Engel et al. . | |
| 4,366,469 | 12/1982 | Michaels et al. | 341/122 X |
| 4,384,321 | 5/1983 | Rippel . | |
| 4,399,416 | 8/1983 | Gillespie | 341/139 X |
| 4,467,260 | 8/1984 | Mallick, Jr. et al. . | |
| 4,471,418 | 9/1984 | Tuma . | |
| 4,503,408 | 3/1985 | Mrenna et al. . | |
| 4,550,360 | 10/1985 | Dougherty . | |
| 4,554,501 | 11/1985 | Baker . | |
| 4,556,838 | 12/1985 | Brasseur . | |
| 4,618,848 | 10/1986 | Parfitt | 341/141 |
| 4,626,831 | 12/1986 | Engel . | |
| 4,644,566 | 2/1987 | Vercellotti et al. . | |
| 4,677,366 | 6/1987 | Wilkinson et al. . | |
| 4,683,415 | 7/1987 | Zimmerman . | |
| 4,698,740 | 10/1987 | Rodgers et al. . | |
| 4,712,169 | 12/1987 | Albach . | |
| 4,722,059 | 1/1988 | Engel et al. | 364/483 |
| 4,731,722 | 3/1988 | Conroy . | |
| 4,746,899 | 5/1988 | Swanson et al. | 341/122 |
| 4,812,736 | 3/1989 | Albach et al. . | |
| 4,831,378 | 5/1989 | Baars et al. | 341/139 |
| 4,851,843 | 7/1989 | Neal | 341/139 |
| 4,864,213 | 9/1989 | Kido . | |
| 4,870,418 | 9/1989 | Kal et al. | 341/133 |
| 4,876,502 | 10/1989 | Verbanets et al. | 341/139 X |
| 4,893,102 | 1/1990 | Bauer . | |
| 4,910,631 | 3/1990 | Murphy . | |
| 4,940,929 | 7/1990 | Williams . | |
| 4,940,981 | 7/1990 | Naylor et al. | 341/155 X |
| 4,942,509 | 7/1990 | Shires et al. . | |
| 4,964,029 | 10/1990 | Severinsky et al. . | |
| 5,003,454 | 3/1991 | Bruning . | |
| 5,006,975 | 4/1991 | Neufeld . | |
| 5,084,639 | 1/1992 | Ribner | 307/490 |

FIG. 4A
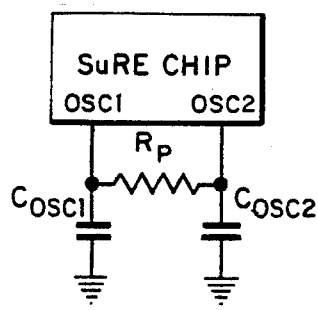
FIG. 4B
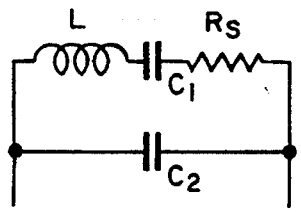
FIG. 4C
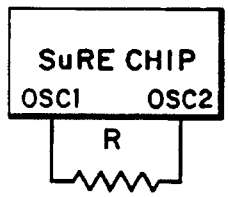
FIG. 4D
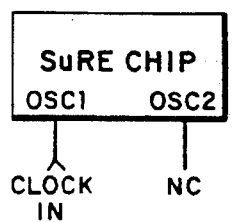
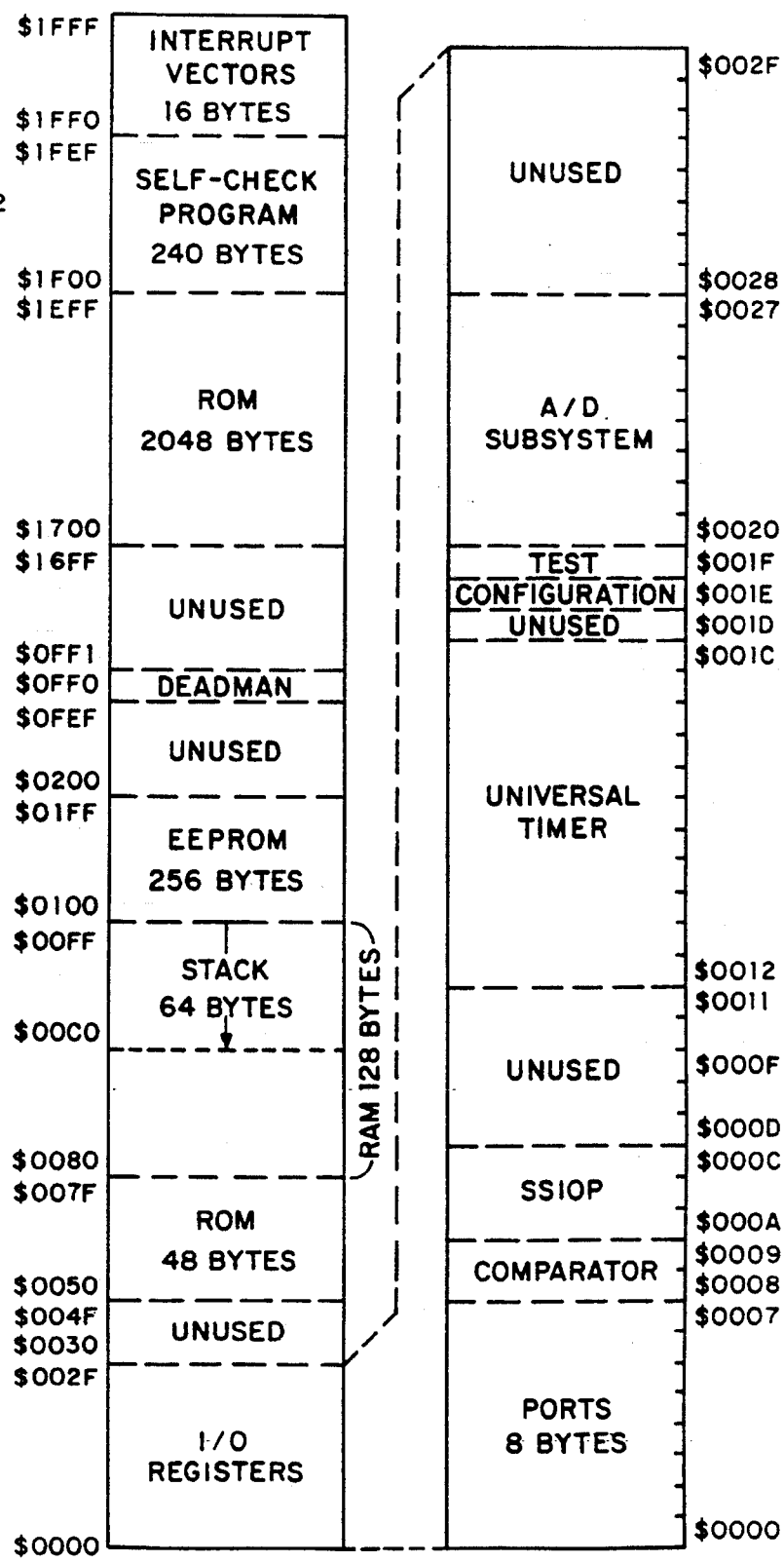
FIG. 5

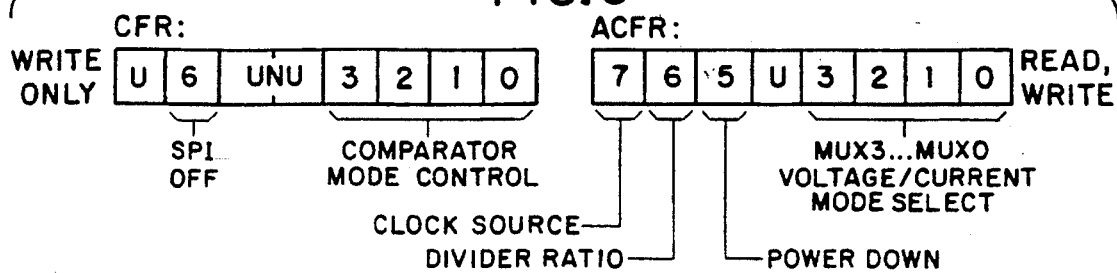
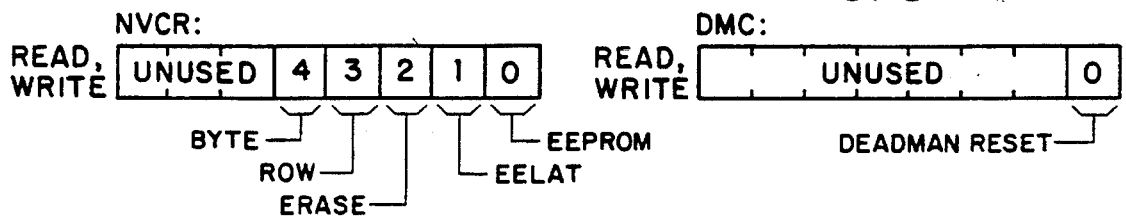
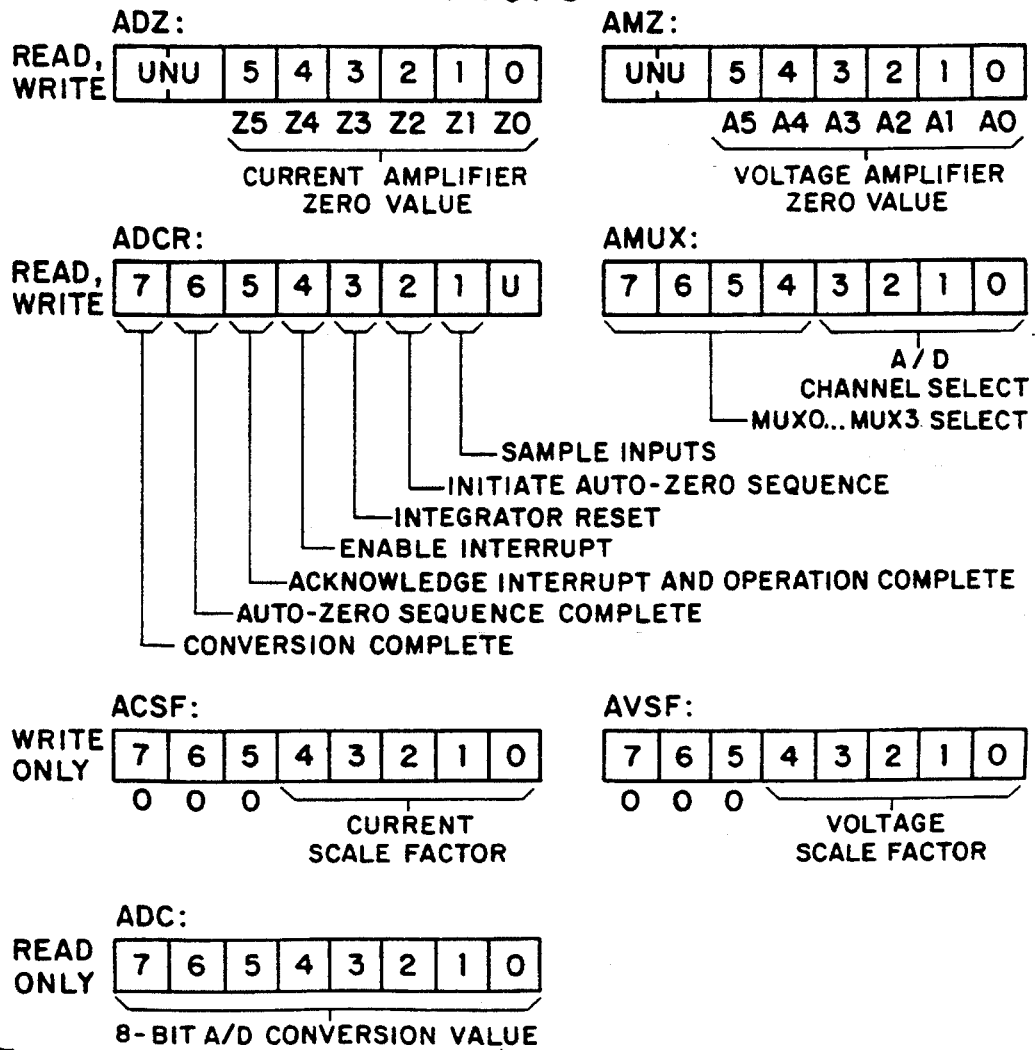

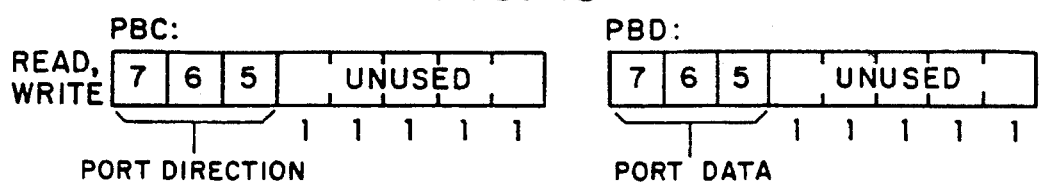
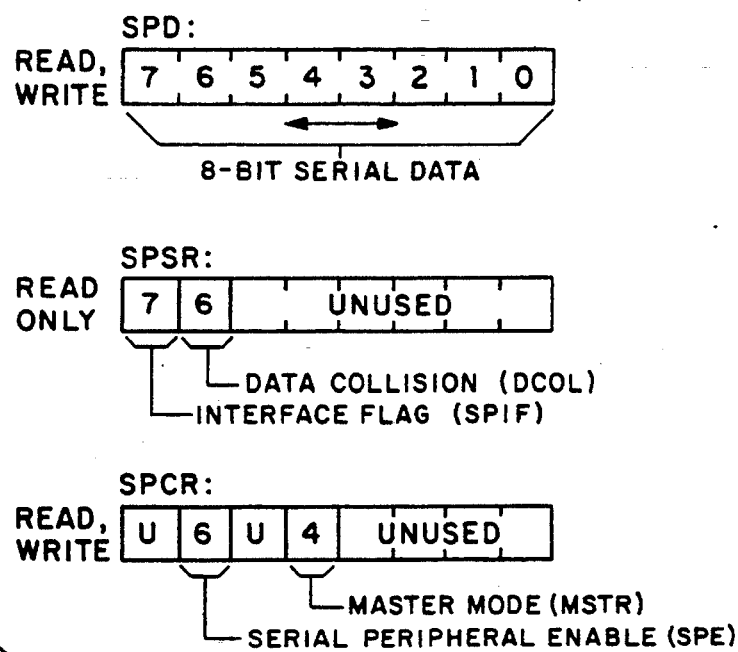
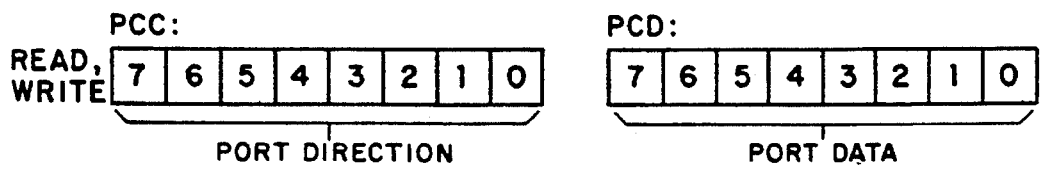
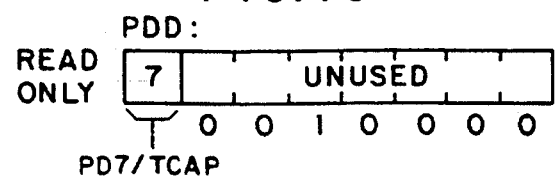

FIG. 26

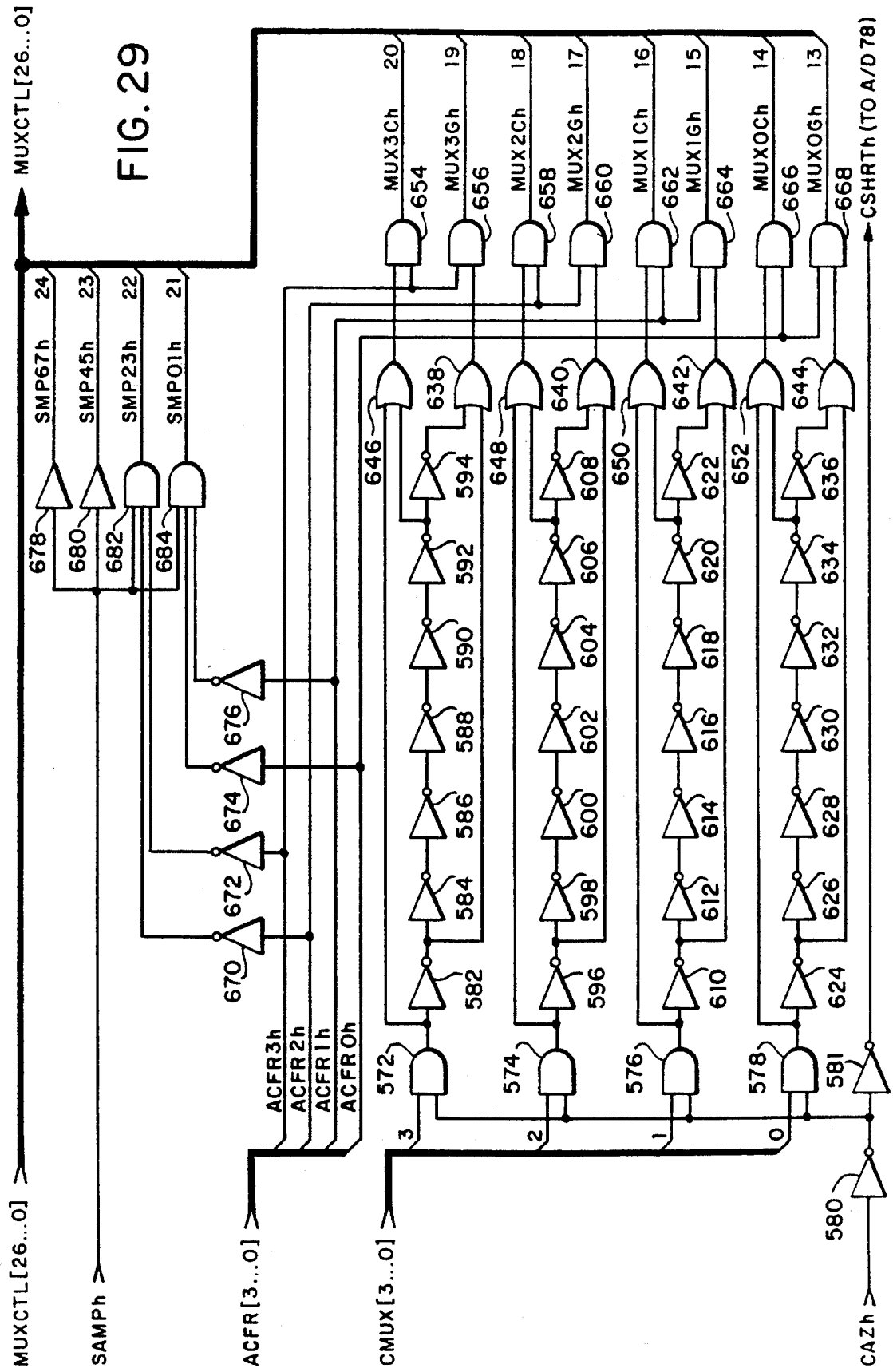

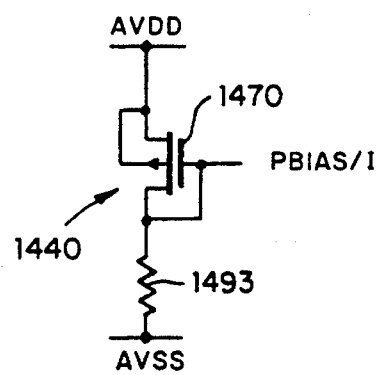
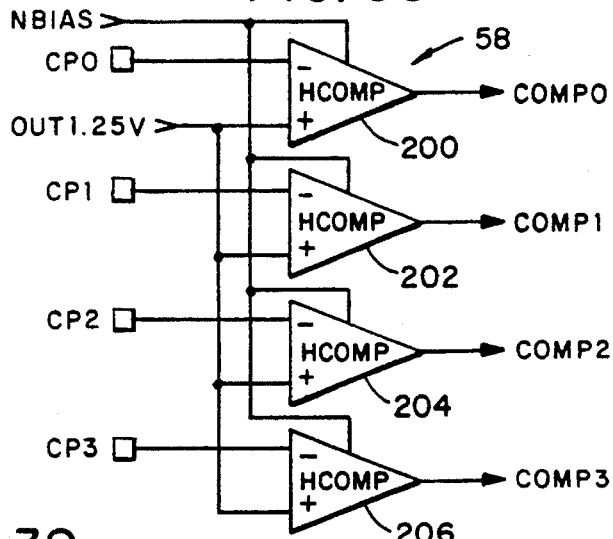
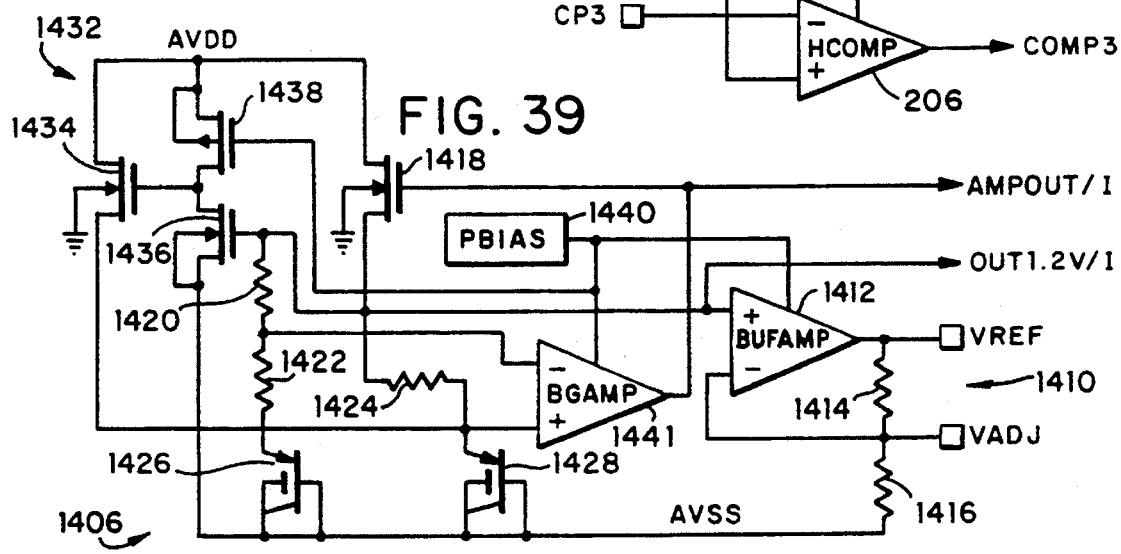
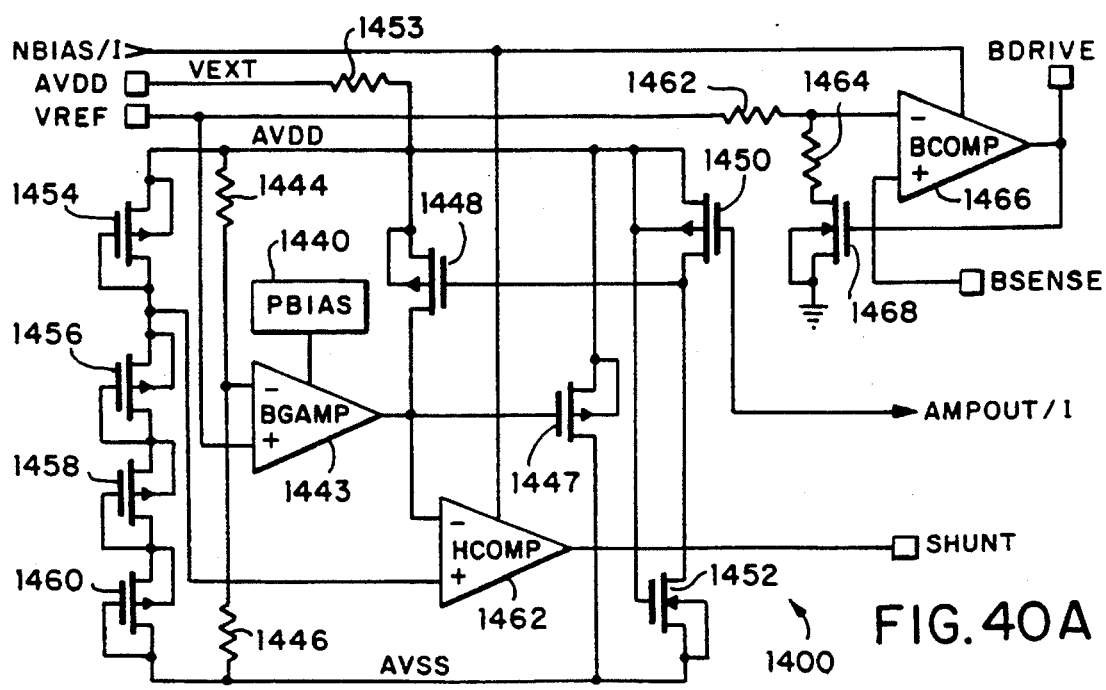

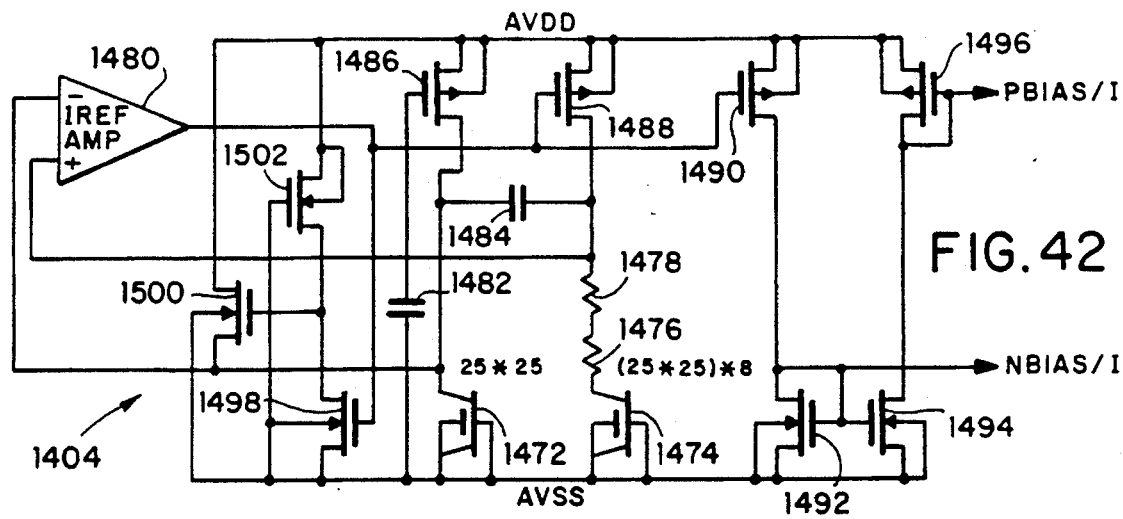
FIG. 42
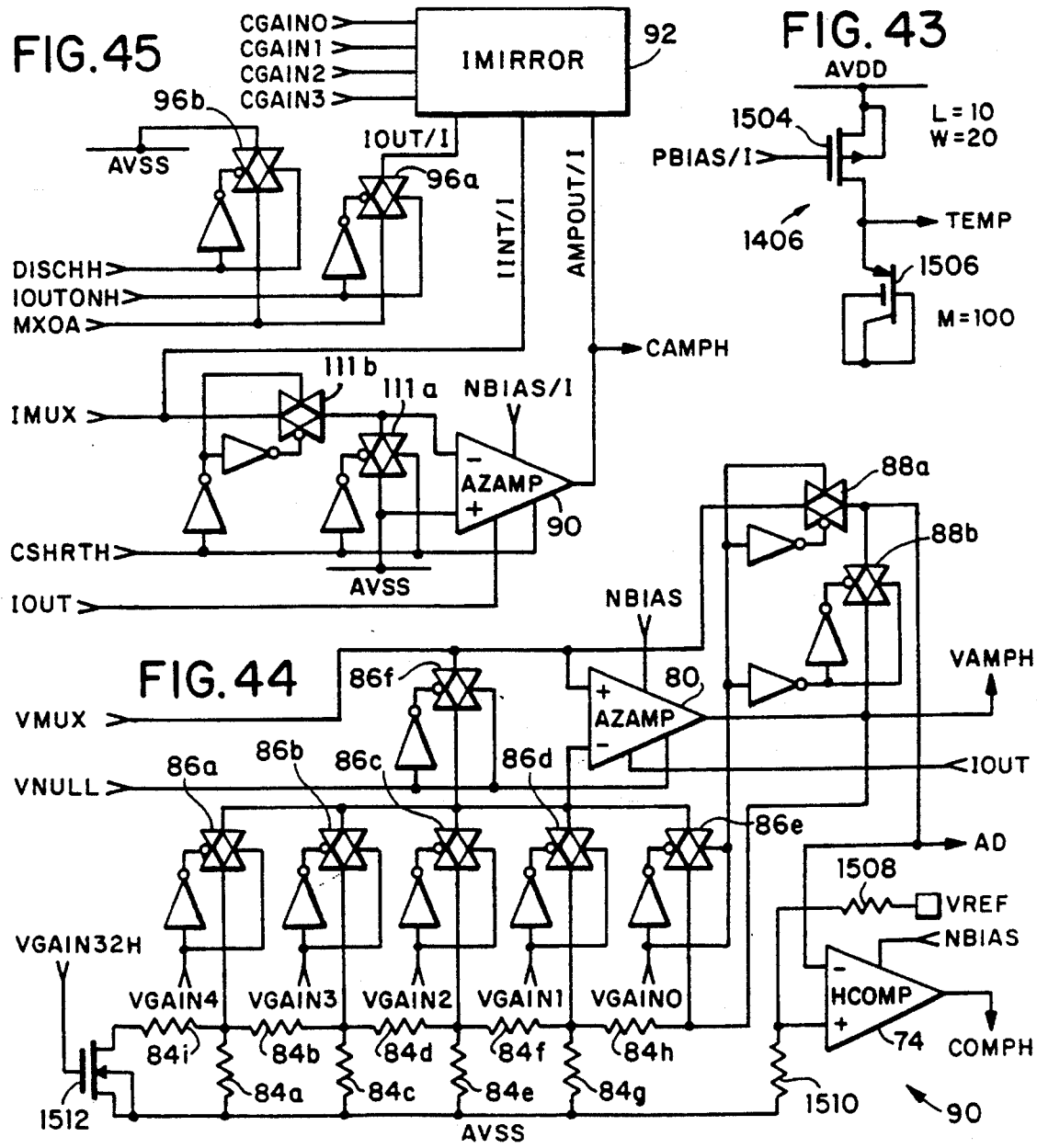
FIG. 45
FIG. 43
FIG. 44

SURE CHIP

CROSS REFERENCE TO RELATED APPLICATIONS

This case is related to the following copending applications: U.S. Pat. No. 5,270,898, entitled SURE CHIP PLUS, by Robert T. Elms, John C. Schlotterer, Joseph C. Engel and William J. Murphy, filed on even date herewith and issued Dec. 14, 1993, Westinghouse Case No. WE-54,218 and Ser. No. 907,131, entitled THERMAL MODELING OF OVERCURRENT TRIP DURING POWER LOSS, by Joseph C. Engel, filed on Jun. 30, 1992, Westinghouse Case No. WE-54,218I-1.

BACKGROUND OF THE INVENTION

1. Field of the Invention

The present invention relates to an integrated circuit (IC) and more particularly, to a complementary metal oxide semiconductor (CMOS) IC which includes an on-board microprocessor, an analog-to-digital (A/D) subsystem, and various input/output devices on a single monolithic chip for use in various types of electrical equipment, such as circuit breakers, motor controllers, contractors and the like for converting analog signals, such as electrical voltages and currents to digital signals for monitoring and control.

2. Description of the Prior Art

There has been a recent trend over the years to utilize digital logic circuitry to control and monitor various types of electrical equipment, such as circuit breakers, motor controllers, and the like, in various industrial, commercial and utility applications. Such circuitry generally consists of four parts or function blocks. One function block generally consists of power supply circuitry to provide a relatively stable voltage to the IC. Another function block generally consists of a microprocessor for allowing the control function to be programmed by a unique set of user generated instructions, for example, software. Since many of the conditions to be monitored are analog (e.g., electrical voltages and currents) an (A/D) converter is necessary to convert these analog values to digital values. The magnitudes of such electrical voltages and currents can be on the order of 120 volts and 5 amperes, respectively. Because such magnitudes would be destructive to most IC's, signal conditioning circuitry is provided to produce usable values for the IC.

Whether the four function blocks are included on a single IC or multiple IC's depends on the state of the art of the IC processing technologies available. Because of the ability to match transistors within an IC, for example, for forming operational amplifiers, bipolar technology, is generally favored for analog or linear circuits. CMOS is generally used for digital applications. However, the current inability to match transistors relatively closely utilizing a CMOS process has heretofore made it rather impractical for use in analog circuits because of the relatively large differential offsets created in operational amplifiers by this inability. Accordingly, given the superior performance characteristics of the bipolar process for analog circuits, the hybrid control analog digital circuitry for the four function blocks identified above is generally accomplished with two or more IC's. However, the use of two or more IC's greatly increases the cost of the circuitry and also the space requirements because of the number of components and the interconnections required therebetween. In many applications, such as in circuit breakers and motor controllers, space requirements are at a premium. Thus, the use of a plurality of IC's dictates that either the circuitry be located external to the device or the size of the device has to be increased. Both options are relatively expensive.

In order to take advantage of the performance characteristics of a bipolar process for analog or linear circuitry and CMOS for digital circuitry on a monolithic chip, a hybrid bipolar-CMOS (biCMOS) process for manufacturing a single IC has evolved. However, due to the complexity of the biCMOS process, it is relatively expensive.

Another problem with designing hybrid circuitry for use in control and monitoring electrical equipment is that such circuitry is often application specific. Thus, such IC's cannot be readily adapted for use in applications other than those for which they are designed. For example, an IC having predetermined functions that are designed for use in a circuit breaker, may be inappropriate for use in a motor controller or the like. Thus, for various end users with different types of electrical equipment, separate custom IC's have to be utilized for each different type of equipment. This can be relatively expensive.

SUMMARY OF THE INVENTION

It is an object of the present invention to solve the problems associated with the prior art.

It is another object of the present invention to provide circuitry capable of controlling and monitoring various types of electrical equipment, such as circuit breakers, motor controllers, and the like.

It is a further object of the present invention to provide analog and digital circuitry for controlling and monitoring electrical equipment with no interconnections therebetween.

It is yet a further object of the present invention to provide analog and digital control circuitry for controlling and monitoring electrical equipment which can rather easily be located in existing space in such equipment.

It is yet a further object of the present invention to provide a monolithic circuitry for controlling and monitoring various types of electrical equipment.

It is yet another function of the present invention to provide a monolithic CMOS circuitry for controlling and monitoring various types of electrical equipment.

It is yet another object of the present invention to provide standardized circuitry which can be utilized with various types of electrical equipment.

Briefly, the present invention relates to a monolithic IC that is standardized for controlling various types of electrical equipment, such as circuit breakers, motor controllers and the like. The IC is a monolithic IC, fabricated in CMOS technology. The shortcomings of utilizing CMOS technology for linear or analog circuitry is overcome by the implementation of the IC to provide a monolithic IC that is relatively less expensive than using multiple ICs or a single IC fabricated from biCMOS technology. Also, by utilizing a single IC, such control and monitoring circuitry can be located in existing electrical equipment. The IC in accordance with the present invention includes an on-board microprocessor, an A/D subsystem and various input/output devices which make it adaptable for use in various types of electrical equipment. In order to improve the resolution of the A/D subsystem, circuitry is provided, which includes current and voltage ranging amplifiers for ranging analog input voltage and current signals and compensating internal offsets, in such amplifiers, inherent in CMOS linear circuits which can affect the accuracy of the least significant bits.

The ranging circuitry is controlled either automatically or by software to provide additional resolution of the A/D subsystem. The current ranging circuit includes a divider for dividing analog input signals into a plurality of composite portions in parallel between an input and output of the current divider. Novel auto-zero circuitry is provided for controlling the offsets in the ranging amplifiers. More specifically, the auto-zero circuitry in accordance with the present invention, controls internal bias currents within the amplifiers without the need or expense of precision resistors as is known in the art.

DESCRIPTION OF THE DRAWING

These and other objects and advantages of the present invention will be more easily understood with reference to the accompanying description and drawings, wherein:

FIGS. 4(a)–4(d) are diagrams of alternate clock generator connections for the IC in accordance with the present invention;

FIG. 5 is a memory address map for the IC in accordance with the present invention;

FIG. 6 is a format diagram for configuration registers CFR and ACFR which form a portion of the IC in accordance with the present invention;

FIG. 7 is a format diagram for an EEPROM control register NVCR which forms a portion of the IC in accordance with the present invention;

FIG. 8 is a format diagram for a dead-man control register DMC which forms a portion of the IC in accordance with the present invention;

FIG. 9 is a format diagram for A/D conversion interface registers ADZ, AMZ, ADCR, AMUX, ACSF, AVSF and ADC which form a portion of the IC in accordance with the present invention;

FIG. 13 is a format diagram for PORT B registers PBC and PBD which form a portion of the IC in accordance with the present invention;

FIG. 14 is a format diagram for PORT B serial peripheral interface registers SPD, SPSR and SPCR which form a portion of the IC in accordance with the present invention;

FIG. 15 is a format diagram for PORT C registers PCC and PCD which form a portion of the IC in accordance with the present invention;

FIG. 16 is a format diagram for a PORT D register PDD which forms a portion of the IC in accordance with the present invention.

FIG. 22 is a schematic diagram of the address decode logic for the comparator control registers CMPST and CMPI and the configuration register CFR in accordance with the present invention;

FIG. 26 is a schematic diagram of the control and status registers in accordance with the present invention;

FIG. 28 is a block diagram of the analog subsystem digital control logic in accordance with the present invention;

FIG. 29 is a schematic diagram of the current multiplexer (MUX) control logic in accordance with the present invention;

FIG. 38 is a block diagram of the analog quad comparator system in accordance with the present invention;

FIG. 39 is a schematic diagram of the band gap regulator in accordance with the present invention;

FIG. 40A is a schematic diagram of the shunt regulator, B+ comparator and the power monitor in accordance with the present invention;

FIG. 41 is a schematic diagram of a biasing circuit in accordance with the present invention;

FIG. 42 is a schematic diagram of another biasing circuit in accordance with the present invention;

FIG. 43 is a schematic diagram of the temperature sensing circuit in accordance with the present invention;

FIG. 44 is a schematic diagram of the ranging circuitry for the voltage amplifier in accordance with the present invention;

FIG. 45 is a schematic diagram of the current mirror and amplifier in accordance with the present invention;

DETAILED DESCRIPTION DEFINITIONS

Figure 1:
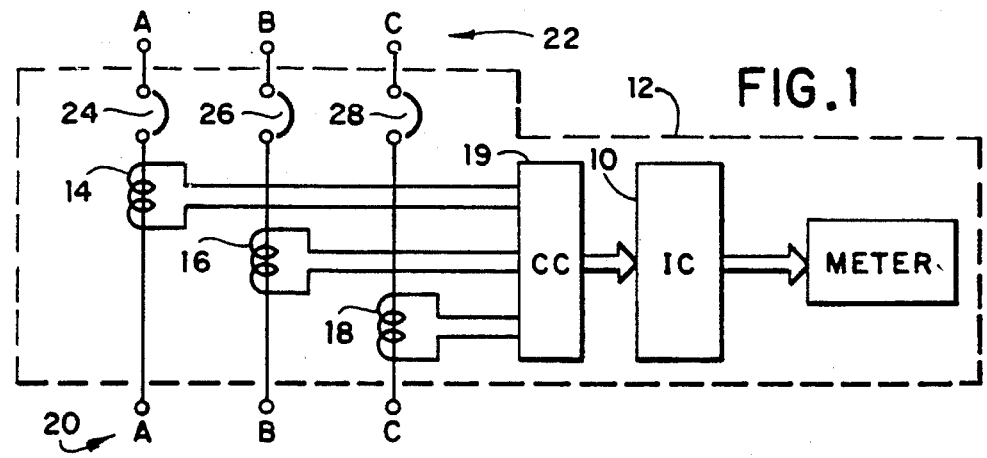
FIG. 1 is a functional representation of an application of the IC in accordance with the present invention.

The following definitions are to be used throughout:

Bit designations: Bits within a register will be designated by placing the bit number within square brackets. For example, bit 5 of register ABC is designated as: ABC[5]. Bits 5 through 0 of register ABC are designated: ABC[5 . . . 0]. Bits 4 and 5 of register ABC are designated as ABC[5,4], etc.

Hexadecimal. Base 16 numbers written with a dollar sign prefix. For example, $0100=256 decimal.

High-true: These signals are designated with the suffix "h" and are defined to be asserted (true or logical 1) when their electrical level is at or near the +VDD supply and are defined to be negated false or a logical zero) when their electrical level is at or near zero volts direct current (Vdc).

Low-true: These signals are designated by the suffix "b" and are defined to be asserted (true, or a logical 1) when their electrical level is at or near zero Vdc and are defined to be negated (false or a logical zero) when their electrical level is at or near +VDD supply.

Input: An input signal is received by the IC 10

Output: An output signal is driven by the IC 10.

Referring to the drawings, the IC in accordance with the present invention is generally identified with the reference numeral 10. The circuitry of the IC 10 has been standardized to enable it to be utilized with various types of electrical equipment including circuit breakers, motor controllers, and the like. For illustration and discussion purposes only, the IC 10 is shown utilized in a circuit breaker 12 in FIG. 1. The circuit breaker 12 is shown as a three phase circuit breaker having phases identified as "A", "B" and "C". It is to be understood by those of ordinary skill in the art that the IC 10 is capable of being utilized with various other types of electrical equipment, such as motor controllers, and the like.

The circuit breaker 12 does not form a portion of the present invention. As shown, the circuit breaker 12 is provided with three current transformers 14, 16 and 18. These current transformers 14, 16 and 18 are disposed on a load side 20 of the circuit breaker 12 to allow the circuit breaker 12 to be monitored and controlled. The line side 22 of the circuit breaker 12 is generally connected to a three phase source of electrical energy (not shown). A load side 20 is generally connected to a three phase load (not shown), such as an electrical motor.

Figure 40B:
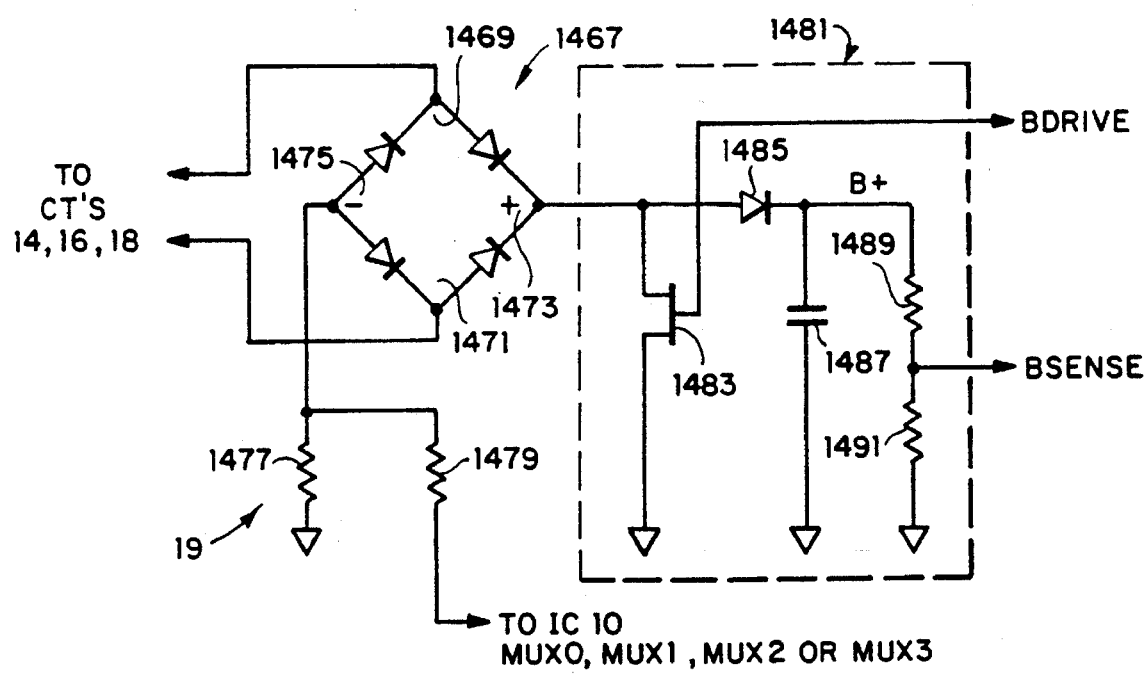
FIG. 40B is a schematic diagram of an exemplary external conditioning circuit for use with the IC in accordance with the present invention.

An important aspect of the invention relates to the fact that the IC 10 is current driven as will be discussed below. As illustrated in FIGS. 1 and 40B, the output of the current transformers 14, 16 and 18 is applied to the IC 10 by way of conditioning circuitry 19. The conditioning circuitry is used to provide electrical current of about 20 microamperes to the IC 10.

Figure 2:
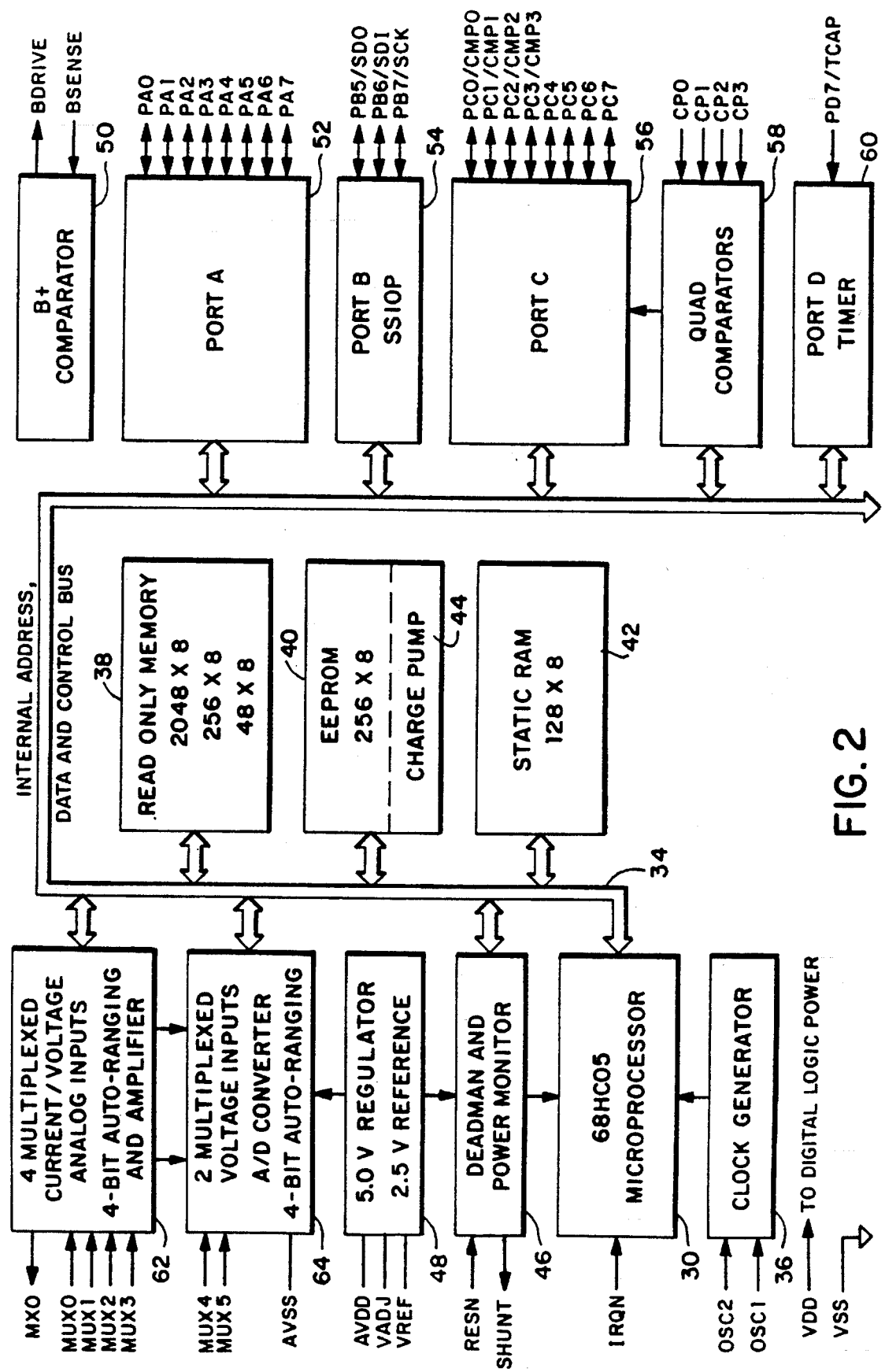
FIG. 2 is a functional block diagram of the IC in accordance with the/present invention.

A block diagram of the digital portion of an exemplary embodiment of the IC 10 is shown in FIG. 2. Various configuration options are selectable by software programming and mask options for specific applications as will be discussed below. In order to provide an IC 10 with universal application for controlling and monitoring various types of electrical equipment, such as circuit breakers, motor controllers and the like, various peripherals may be provided. These peripheral devices may include a microprocessor 30 with a multiply instruction, for example, a Motorola type MC68HO5. The microprocessor 30 communicates with the various other peripherals and external pins on the chip 10 by way of an internal address, data and control bus 34. A clock generator 36 provides timing for the microprocessor 30. An on-board memory subsystem is provided which may include read only memory (ROM) 38, electrically erasable read only memory (EEPROM) 40 and random access memory (RAM) 42. The EEPROM may be provided with an internal charge pump 44 for obviating the need to provide an external high voltage source for erasure in programming of the EEPROM 40.

Exemplary memory sizes are provided for illustration and discussion purposes only. For example, 256 bytes of EEPROM 40 and 128 bytes of RAM 42 may be provided. The ROM 38 may include 2,048 bytes of mask programmable user instruction memory, 240 bytes of self-test memory, 48 bytes of zero page memory and 16 bytes for vectors.

Figure 40C:
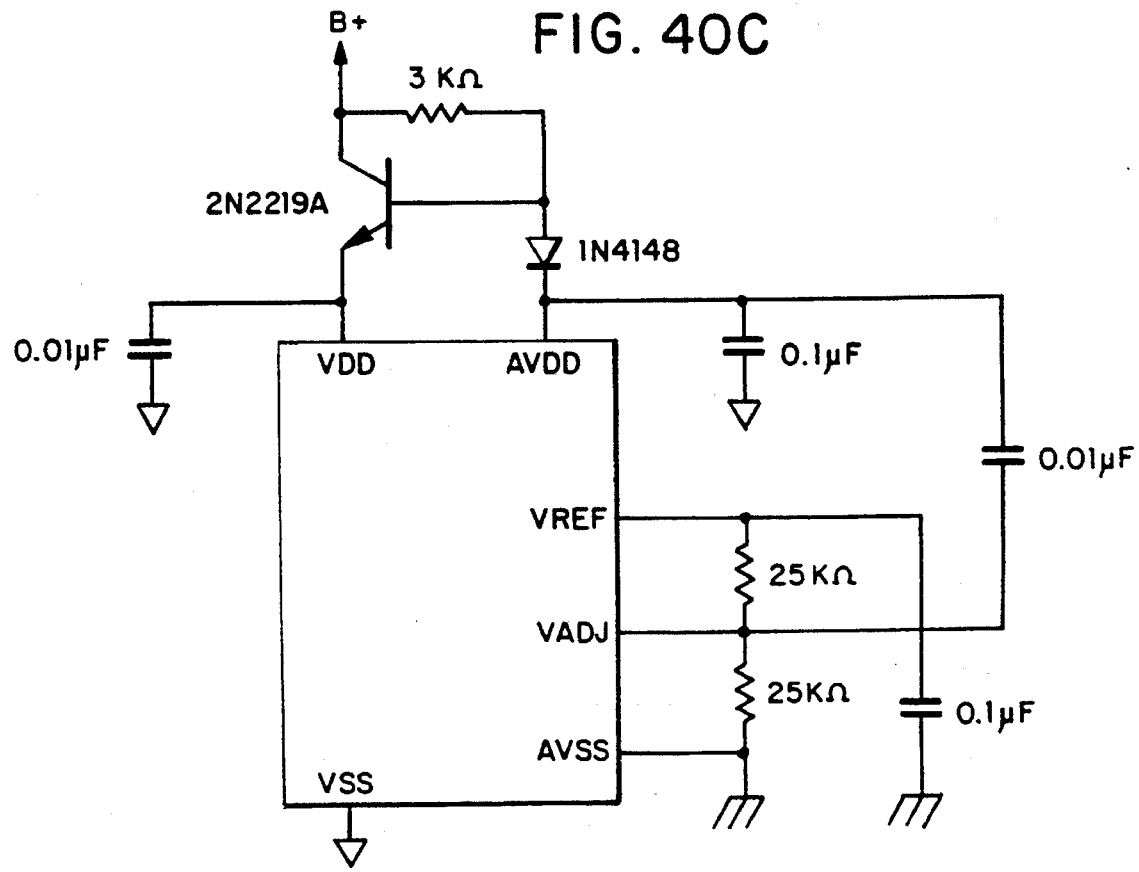
FIG. 40C is a schematic diagram of an exemplary regulator circuit for use with the IC in accordance with the present invention.

The IC 10 has separate digital and analog power supply systems. These power supply systems are segregated to prevent digital noise from affecting the analog circuitry. The digital power supply is directed to a VDD pin on the IC 10 formed from an external voltage regulator (FIG. 40C). The analog power supply is directed to a AVDD pin. In many applications, an external transistor, diode and resistor are adequate.

Dead-man and power monitor circuitry 46 is provided. The power monitor circuitry includes an internal voltage level detector for monitoring the gate drive to the shunt regulator associated with the pin AVDD. The power monitor circuitry deactivates a SHUNT output pin which, when connected to a RESN pin, provides a reset when the analog supply voltage AVDD begins to fall below a preset threshold. The dead-man circuitry monitors operation of the microprocessor 30 and activates a reset upon detection of spurious operation.

An analog power supply subsystem 48 is provided for the analog circuitry. This subsystem 48 includes a +1.25 Vdc band gap regulator and a buffer amplifier to generate a +2.5 Vdc reference. An external current source is used to power the analog power supply subsystem 48. The current source is directed to an external pin AVDD. An adjustment pin VADJ is provided to allow the voltage reference to be trimmed to exactly +2.5 Vdc. Trimming may be provided by a voltage divider circuit, for example, two series connected resistors connected between the VREF pin and an analog ground pin AVSS. The interface between the series connected resistors is connected to the VADJ pin. A shunt regulator provides a nominal +5.0 Vdc source at the AVDD pin based on the reference voltage at the VREF pin. The buffer amplifier is provided with an open drain output such that it can only source current. This will permit multiple devices to be paralleled. The regulator can also be slaved to another IC. This is accomplished by connecting the VADJ pin to the VREF pin on the slave IC and connecting the VREF pin on the slave IC to the VREF pin on the master IC.

A comparator subsystem is provided which includes a B+ comparator 50 and a quad comparator system 58. The B+ comparator 50 is provided for external power supply generation as discussed below and illustrated in FIG. 40B. The inverting input of the B+ comparator 50 is referenced to the VREF pin (nominally, +2.5 Vdc). The input signal is applied to a non-inverting input pin, BSENSE, of the comparator 50. The B+ comparator 50 output is connected to an external pin BDRIVE. The quadcomparators include four comparators referenced, for example, to +1.25 Vdc.

Various other peripheral devices may also be provided on the IC 10 to allow it to be adapted for various applications, such as circuit breakers, motor controllers, contactors and the like. For example, these peripheral devices, may include an 8-bit bidirectional port A, identified with the reference numeral 52, a special purpose 3-bit bidirectional port B, identified with the reference numeral 54. The port B may be used as an input/output port or in conjunction with a synchronous serial input/output port (SSIOP). A dual function 8-bit bidirectional port C, identified with the reference numeral 56, may also be provided. This port may be used as an input/output port or as a special function port. For example, the least significant bits of this port may be ORed with the output channels from the quadcomparator subsystem 58. A port D timer 60 may also be provided. This timer 60 may be used for time base or waveform generation, periodic measurement or other periodic functions.

Figure 3:
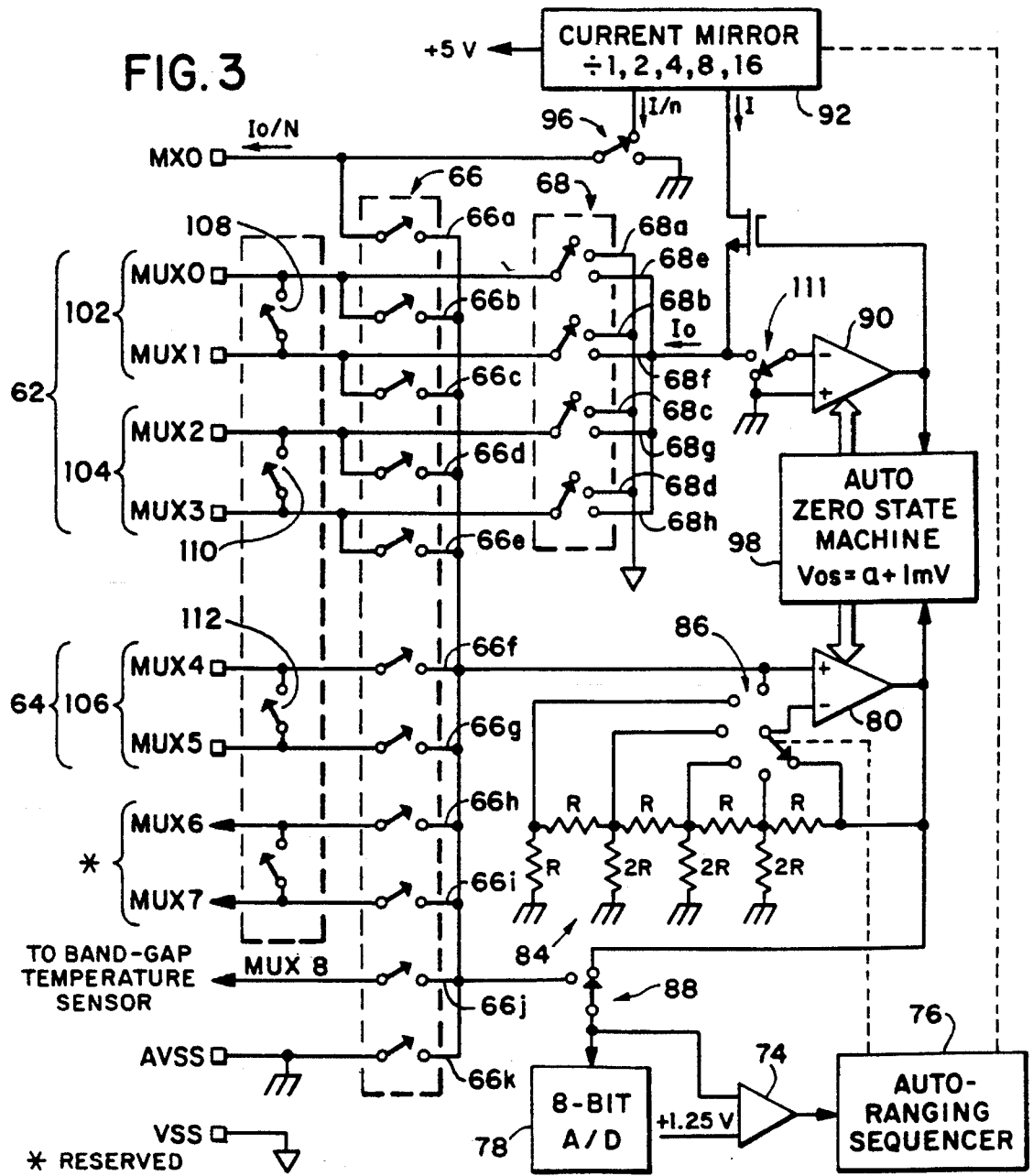
FIG. 3 is a functional block diagram of a portion of the IC in accordance with the present invention.

An important aspect of the invention relates to an analog subsystem, identified by the function blocks 62 and 64 in FIG. 2. A block diagram for this subsystem is illustrated in FIG. 3. The analog subsystem includes, for example, six analog input channels for receiving analog voltage and current signals and converting these signals to an 8-bit digital signal with 12-bit resolution. Four of the input channels 62 can be selected by the software to operate as either voltage inputs or current inputs. The other input channels 64 can only be operated as voltage inputs. Current and voltage input operation of the input channels 62 and 64 is controlled by multiplexers (MUXes) 66 and 68, which are selected by the software.

The voltage input channels can accept positive voltages in the range of 0-2.5 Vdc and are applied to an auto-zeroable adjustable gain voltage amplifier 80. These signals can be processed in either an auto-ranging mode or a fixed gain mode, selectable by the software. If the auto-ranging mode is selected, the selected voltage input channel 62 or 64 is ranged by values stored in an internal auto-ranging register to allow the gain to be automatically adjusted until the signal is at least one-half of full scale but not in overflow. The ranged signal is then converted directly to an 8-bit digital value by an A/D 78 and stored in an internal register. If fixed ranging is selected, the voltage mode inputs 62 or 64 can be operated at preselected gain settings, for example, 1, 2, 4, 8 or 16. The preselected gain settings are provided by gain circuitry which includes a resistor network 84, connected to an inverting terminal of the voltage amplifier 80 by way of a MUX 86. The MUX 86 is controlled by the software. The output of the voltage amplifier 80 is connected to the A/D circuitry 78 by way of another MUX 88. The MUX 88 is in the position shown in FIG. 3 when voltage gains other than one have been selected. However, when a gain of one is selected, the voltage amplifier 80 is disconnected from the ranging circuitry and the input voltage channel 62 or 64 is applied directly to the A/D 78.

Current mode inputs 62 accept negative currents (e.g., currents flowing out of a MXO pin) with a −1.6 mA, for example, representing full scale. Unselected current input channels are tied to a digital ground pin (VSS) by the MUXes 68 which provide for make-before-break switching. The selected input current channel is connected to an inverting input of an auto-zeroable current amplifier 90, referenced to analog ground (AVSS). The source follower output is configured to maintain the inverting input at a virtual ground by providing current to the selected channels through an adjustable current mirror 92. The current mirror 92 can be set by auto-ranging circuitry, which can be overwritten by the software, to one of the following exemplary ratios: 1/1, 1/2, 1/4, 1/8 or 1/16. The ratioed mirror output current is directed to the MXO pin. Thus, the current flowing out of the MXO pin will be a programmable fraction of the sum of the currents flowing out of the selected current input channel pin. Two modes of operation are possible:

Non-integrating mode. An external resistor (not shown) may be connected between the analog ground pin (AVSS) and the MXO pin to convert the ratioed current to a voltage. This voltage may then be converted to a digital value in a similar manner as discussed above. In this mode of operation, the default amplifier gain is set at times one unless overwritten by the software.

Integrating mode. An external capacitor (not shown) may be connected between the analog ground pin (AVSS) and the MXO pin to integrate the ratioed current. A shorting switch 96 is provided to discharge this capacitor under program control. Integrated voltages are then converted by the A/D 78 as discussed above.

The voltage and current amplifiers 80 and 90 have offset voltage compensation circuitry 98 to compensate for offsets inherent in CMOS amplifiers. These uncorrected offsets can be on the order of, for example, ±20 millivolt (mV) which can affect the accuracy of the least significant bits of the converted digital value. This circuitry 98 assures that the offset is always a negative voltage between 0 and 0.5 mV and forces the amplifier 80, 90 to have a positive output when the differential input voltage is zero. This offset correction can be done either automatically by the hardware or controlled by the software.

Sample and hold capability is provided for the input channels 62 and 64. More specifically, the six analog input channels 62 and 64 are grouped into three pairs of channels 102, 104 and 106. Each pair of channels 102, 104 and 106 can be used as a single channel with sample and hold capability. A capacitor (not shown) may be connected between one channel input and the analog ground pin AVSS while the other channel of the pair is connected to a voltage input. A sample command permits the software to connect the two channels of each pair together by way of sample and hold MUXes 108, 110 and 112, thus storing the input voltage on the capacitor of the adjacent channel. Only channel pairs in which both channels are configured for voltage mode operate in this fashion. All three channel pairs 102, 104 and 106 may be sampled simultaneously.

There are other important aspects of the invention. For example, the IC 10 is adapted to respond to either analog signals or digital signals and provide a digital output signal. Another important aspect relates to the fact that the IC 10 is provided with circuitry which enables it to sense the ambient temperature in which it is disposed and generate a corresponding electrical signal.

CONFIGURATION METHODS

Since the IC 10 is intended for universal application of various types of electrical equipment, certain configuration information is required to tailor the IC 10 for a specific application. The configuration information is defined by either mask options, software, constants or run time configuration.

Regarding mask options, the contents of the ROM 38 may be specified at the time the IC 10 is manufactured. Certain other mask configuration options may be determined by modification of a single mask. These other configuration options include the dead-man subsystem 46, IRQN triggering, an oscillator option, comparator hysteresis option and an SSIOP option. A predetermined hysteresis, for example, 20 millivolts (mV) or no hysteresis at all can be selected on an individual comparator basis.

A mask programmable option also permits selection of the type of interrupt generated associated with an IRQN pin. One of two triggering methods may be selected as follows: 1) negative edge sensitive triggering only, or 2) both negative edge-sensitive and low level-sensitive triggering. If option 2) is selected, either type of input to the IRQN pin will produce an interrupt. The IC 10 can be configured to accept either a crystal/ceramic resonator input or an RC network to control the internal oscillator. More specifically, the IC 10 can be configured by mask option to accept either a crystal/ceramic resonator input or an RC network to control the internal oscillator. The internal clocks are derived by a divide-by-two of an internal oscillator, which operates with an AT-cut parallel resonant quartz crystal resonator in the frequency range of 1 MHz to 8 MHz. Use of an external oscillator is recommended when crystals outside the specified range are to be used. The crystal and components are mounted as close as possible to the input pins to minimize start-up and stability problems. Table 1 shows recommended parameters for crystal resonators.

TABLE 1

CRYSTAL/CERAMIC RESONATOR PARAMETERS

| PARAMETER | CRYSTAL | | CERAMIC | |
|---|---|---|---|---|
| | 2 MHz | 4 MHz | 2–4 MHz | UNITS |
| $R_S$ | 400 | 75 | 10 | ohms |
| $C_0$ | 5 | 7 | 40 | pF |
| $C_1$ | 8000 | 12000 | 4.3 | pF |
| $C_{OSC1}$ | 15–40 | 15–30 | 30 | pF |
| $C_{OSC2}$ | 15–30 | 15–25 | 30 | pF |
| $R_P$ | 10 | 10 | 1–10 | Megohms |
| Q | 30 | 40 | 1.25 | $10^3$ |

A ceramic resonator may be used in place of the crystal in cost-sensitive applications. The circuit shown in FIG. 4(a) is recommended when using a ceramic resonator. Its equivalent circuit is shown in FIG. 4(b). Table 1 shows the recommended parameters for various resonators.

A mask programmable oscillator option may be selected to permit the use of a single external resistor R between external oscillator pins OSC1 and OSC2 as illustrated in FIG. 4(c). With this option, frequencies between 5 MHz and 70 KHz are practical. An external clock input should be used with either mask oscillator option. This external clock is connected to the OSC1 pin with the OSC2 pin unconnected as shown in FIG. 4(d).

Two mask options are available for the SSIOP. These mask options relate to serial data transmission format and the clock rate. The first mentioned option allows data to be shifted out of an SSIOP register SPO either most significant bit first or least significant bit first. The clock rate option is provided to select the master clock rate. This option permits microprocessor's phase 2 clock to be divided either by 4 or 32 to provide the master clock rate. This will produce a data transmission bit of 1 MHz or 125 KHz for a device operating with an 8 MHz crystal.

In addition to the mask options, software constants are also used for configuration of the IC 10. More specifically, internal configuration registers are loaded by the microprocessor software from application dependent software constants stored in the program ROM 38 or the EEPROM 40. A pair of internal configuration registers (CFR, ACFR) are used to control these options in the IC 10. The CFR and ACFR registers are loaded on program initialization and are not intended to be altered during normal program operation and will be discussed in detail below.

Lastly, the IC 10 can be configured by run time configuration. With this option, configuration data is read from external devices through the microprocessor's I/O subsystem. This can be done by utilizing the input/output ports A, B or C in either a parallel or serial fashion.

CONFIGURATION REGISTERS

The configuration registers CFR and ACFR are used to specify various software configuration options available in the IC 10 architecture. These registers CFR, ACFR are programmed during software initialization to configure input/output pins to their appropriate function as well as setting other major configuration parameters. In order to avoid improper operation of the IC 10, the CFR and ACFR registers are not intended to be altered during normal operation.

The CFR register is a write only register. The ACFR register is a read-write register. The bit format for the CFR and ACFR registers is illustrated in FIG. 6. Both the CFR and ACFR configuration registers are initialized to zeros on power-up or reset. This defines the state of the IC 10 after power has been applied and before the microprocessor 30 alters it for the application.

CFR REGISTER

The CFR register is a write-only register used to configure the comparator output options. Bits 4–7 are unimplemented. The remainder of the bits in the CFR register are defined below.

CFR[3 . . . 0]: Comparator Mode Control. These four configuration bits enable the comparator outputs to be "ORed" with the least significant four bits of Port C. A zero in these configuration bits enables the OR operation for the associated port pin. In this mode each output pin will be low during device reset if the respective comparator is above the threshold voltage (+1.25 V). Reset will clear the microprocessor's Port C output register, making the output pin a function of the comparator input. When the microprocessor writes a "1" into the port output register, the output pin will be forced high independent of the state of the comparator.

A one in these configuration bits disables the OR operation. In this mode, the low port pins are in a high impedance state after reset. The configuration bits are assigned in sequential order with CFR[0] controlling PC0/CMP0 and CFR[3] controlling PC3/CMP3.

ACFR REGISTER

The ACFR register is a 7-bit read-write register and is used to configure the analog subsystem. This register is set to zero on device reset or power-up. Bit 4 is unimplemented. Bit definitions of the ACFR register are as follows:

ACFR[7]: Clock Source. This bit selects the clock source for the analog subsystem and the EEPROM charge pump 44. They can be configured to use either an internally generated clock or a clock derived from an external crystal oscillator of the IC 10. If the crystal oscillator is selected (ACFR[7] =1), the oscillator frequency must be in the range of 2-8 MHz. Other crystal values must use the internal clock source option (ACFR[7] =0). This bit is set to 0 (internal clock source) by reset. A delay of 10 milliseconds (ms) is required after selecting the internal clock to permit the oscillator to stabilize. During the stabilization time, A/D subsystem and EEPROM 40 operations are not intended to be performed. Table 2 defines the meaning of this bit.

TABLE 2

| ACFR[7] DECODE | |
|---|---|
| 0 | INTERNAL OSCILLATOR |
| 1 | CRYSTAL OSCILLATOR |

ACFR[6]: Divider ratio. This bit selects the clock divider ratio for the A/D 78. This bit selects a divider ratio of 1/2 or 1/4, permitting crystals in the range of 2–8 MHz to be used. The selection of the external crystal and the state of ACFR [7] will determine the A/D conversion, autoranging and auto-zero times. Table 3 defines the configuration bit and demonstrates the effect on conversion times.

TABLE 3

A/D CONVERTER CLOCK SOURCE

| ACFR [7, 6] | Divider | Crystal (MHz) | A/D Conv. (μs) | Auto-zero* (μs) | Auto-range** (μs) |
|---|---|---|---|---|---|
| 0 X | Internal | NA | 16–32 | 28 - 3,080 | 35–166 |
| 1 0 | ½ | 2 | 32 | 56 - 3,080 | 70–166 |
| 1 0 | ½ | 4 | 16 | 28 - 1,540 | 35–83 |
| 1 1 | ¼ | 4 | 32 | 56 - 3,080 | 70–166 |
| 1 1 | ¼ | 8 | 16 | 28 - 1,540 | 35–83 |

*The auto-range time depends on the number of gain steps required to range.
**The auto-zero time depends on the amount of offset correction required.

ACFR[5]: A/D power-down. This bit controls power down operation of the A/D 78. When set, it will power up the A/D 78. When the bit is reset, the A/D 78 will power down. This bit is set to zero by reset on power-on. At least 100 μs should be allowed for the A/D 78 to stabilize after power-up.

ACFR[3 . . . 0]: MUX3 . . . MUX0 mode select. These configuration bits control the input mode of the analog input channels 62 and 64. The input channels 62 (MUX0 . . . MUX3) can be placed in either a voltage input mode or a current input mode. A zero in these configuration bits selects the voltage mode, while a one selects the current mode. These bits are assigned sequentially with ACFR[0] controlling MUX0 and ACFR[3] controlling MUX3 as shown in Table 4.

TABLE 4

ANALOG INPUT MODE DEFINITIONS

| | |
|---|---|
| ACFR[0] | = 0 = voltage mode, 1 = current mode |
| ACFR[1] | = 0 = voltage mode, 1 = current mode |
| ACFR[2] | = 0 = voltage mode, 1 = current mode |
| ACFR[3] | = 0 = voltage mode, 1 = current mode |

MICROPROCESSOR 30

The microprocessor 30 is based on a Motorola type MC68HC05 architecture, a Von Neumann type machine, which places all data, program and I/O interfaces into a single address map. This reduces the number of special purpose instructions that must be supported and therefore results in a relatively small and easy to remember instruction set.

The microprocessor 30 is described in detail in *M6805 HMOS/M146805 CMOS FAMILY USERS MANUAL* by Motorola, Inc., copyrighted 1983, hereby incorporated by reference. The microprocessor 30 architecture is based on five registers: an accumulator (A), an index register (X), a program counter (PC), a stack pointer (SP) and a condition code register (CC).

The accumulator is a general purpose 8-bit register used by the program for arithmetic calculation and data manipulations. A full set of read/modify/write instructions operate on this register. The accumulator is used in the register/memory instructions for data manipulation and arithmetic calculation. The index register is used in the index mode of addressing or as an auxiliary accumulator. It is an 8-bit register that can be loaded either directly or from memory, having its contents stored in memory, or its contents compared to memory. In index instructions, the index register provides an 8-bit value that is added to an instruction provided value to create an effective address. The index register is also used for limited calculations and data manipulation.

The program counter is a 16-bit register and contains the memory address of the next instruction that is to be fetched and executed. Normally, the program counter points to the next sequential instruction, however, it may be altered by interrupts or certain instructions. During an interrupt, the program counter is loaded with the appropriate interrupt vector. Jump and branch instructions may modify the program counter so that the next instruction to be executed is not necessarily the next instruction in memory.

The stack array or stack is an area in memory used for the temporary storage of important information. It is essentially a sequence of RAM locations used in a last-in-first-out (LIFO) fashion. The stack pointer always points to the next free location on the stack. Interrupts and subroutines make use of the stack to temporarily save important information. The stack pointer is used to automatically store the return address (2 byte program counter) on subroutine calls and to automatically store all registers (5 bytes: A, X, PC and CC) during interrupts. The stack starts at location $00FF and extends downward 64 locations.

The condition code register is a 5-bit register that indicates the results of the instruction just executed, as well as the state of the processor. These bits can be individually tested by a program instruction and specified action taken as a result of their state. The following condition code bits are defined: half-carry (H), interrupt mask (I), negative (N), zero (Z) and carry/borrow (C).

MEMORY MAPPING

The microprocessor 30 is capable of addressing 65,536 bytes of memory. However, the address decoding circuitry only decodes 13 bits of address information, therefore, the memory space is limited to 8192 bytes in the range of $0000 to $1FFF. FIG. 5 is a diagram of memory allocation for the IC 10.

1. ROM 38

The IC 10 memory map has three sections of mask programmable ROM 38. This memory 38 is programmed at device manufacture. The three sections of the ROM 38 are located as defined in Table 5.

TABLE 5

ROM ASSIGNMENTS

| ADDRESS RANGE | SIZE | FUNCTION |
|---|---|---|
| $0050–$007F | 48 bytes | Zero page |
| $1700–$1EFF | 2048 bytes | User instruction memory |
| $1F00–$1FEF | 240 bytes | Self-check program |
| $1FF0–$1FFF | 16 bytes | Vectors |

2. RAM 42

The IC 10 is configured with 128 bytes of RAM starting at location $0080 extending to $00FF. The top of this area is reserved for the stack. The stack starts at location $00FF and extends downward a maximum of 64 locations to $00C0. Unused stack locations may be used by the program for general storage. However, care must be exercised to avoid data being stored in these locations being overwritten by stack operations.

3. EPROM 40

The IC 10 has 256 bytes of EEPROM 40 located at addresses $0100 through $01FF.

4. INTERRUPT AND RESET VECTORS

The upper 16-bytes of the memory map are reserved for interrupt vectors. The address assignments for each are described below:

$1FFE–1FFF: Reset Vector. This vector is used on processor reset.

$1FFC–1FFD: Software Interrupt. This vector is used during execution of an SWI instruction.

$1FFA–1FFB: External Asynchronous Interrupt. This interrupt is assigned the highest priority of the four interrupts. The external interrupt (IRQN pin) uses this vector.

$1FF8–1FF9: Timer Interrupt. This interrupt is assigned the second-highest priority of the four interrupts. It is used by the timer.

$1FF6–1FF7: Comparator Subsystem Interrupt. This interrupt is assigned the third-highest priority of the four interrupts. It is used by the comparator subsystem.

$1FF4–1FF5: A/D Subsystem Interrupt. This interrupt is assigned the lowest priority of the four interrupts. It is used by the A/D subsystem.

$1FF2–1FF3 and $1FF0–1FF1: Reserved.

5. DATA TRANSFER AND CONTROL

Data transfer and control functions are implemented using byte-wide register interfaces accessed by the microprocessor 30 in its memory address space as defined in Table 6.

TABLE 6

REGISTER ADDRESS MAP

| ADDR | REGISTER | ADDR | REGISTER | ADDR | REGISTER |
|---|---|---|---|---|---|
| $0000 | PAD | $0010 | * | $0020 | ADCR |
| $0001 | PBD | $0011 | * | $0021 | AMUX |
| $0002 | PCD | $0012 | TCR | $0022 | ADC |
| $0003 | PDD | $0013 | TSR | $0023 | ACFR |
| $0004 | PAC | $0014 | TICH | $0024 | ADZ |
| $0005 | PBC | $0015 | TICL | $0025 | AMZ |
| $0006 | PCC | $0016 | TOCH | $0026 | AVSF |
| $0007 | * | $0017 | TOCL | $0027 | ACSF |
| $0008 | CMPST | $0018 | TCRH | $0028 | * |
| $0009 | CMPI | $0019 | TCRL | $0029 | * |
| $000A | SPCR | $001A | TARH | $002A | * |
| $000B | SPSR | $001B | TARL | $002B | * |
| $000C | SPD | $001C | NVCR | $002C | * |
| $000D | * | $001D | * | $002D | * |
| $000E | * | $001E | CFR | $002E | * |
| $000F | * | $001F | TEST | $002F | * |
| $0FF0 | DMC | | | | |

*Reserved

EEPROM CONTROL

The microprocessor 30 controls the operation of the EPROM 40 by a single read-write register NVCR, located in memory address space. FIG. 7 shows the format of this register. Reset clears this register to zero. This will configure the EEPROM 40 for normal read operation. A description of the bit assignments for the NVCR register is provided below:

NVCR[7 . . . 5]: Unused. These bits are reserved for device testing.

NVCR[4]: Byte Erase Select (BYTE). This bit selects byte erase operations. When set, it overrides the row bit. If BYTE is set to a 1, erase operations effect the selected byte. If BYTE is set to zero, erase operations are either row or bulk.

NVCR[3]: Row Erase Select (ROW). This bit selects row or bulk erase operations. If BYTE is set, this bit is ignored. If ROW is set to a 1, erase operations effect the selected row. If ROW is set to a 0, bulk erase is selected.

NVCR[2]: EEPROM Erase (ERASE). This bit controls erase operations in the following manner: If ERASE is set to a 1, erase mode is selected. If ERASE is set to a 0, normal read or program mode is selected.

NVCR[1]: EEPROM Latch Control (EELAT). This bit controls EEPROM address and data latch operations as follows: If EELAT is set to a 1, address and data can be latched into the EEPROM 40 for programming or an erase operation. If EELAT is set to a 0, data can be read from the EEPROM 40. If an attempt is made to set both the EELAT and EEPGM bits in the same write cycle, neither will be set.

NVCR[0]: EEPROM Program Voltage Enable (EEPGN). This bit determines the operating mode of the EEPROM 40 as follows: If the EEPGM is set to a 1, the charge pump 44 is on and the resulting high voltage is applied to the EEPROM array. If EEPGM is set to 0, the charge pump generator is off. If an attempt is made to set both the EELAT and the EEPGM in the same write cycle, neither will be set. If a write to a EEPROM address is performed while the EEPGM bit is set, the write is ignored and the programming operation currently in progress is not disturbed. These two safeguards prevent accidental EEPROM 40 changes.

EEPROM OPERATION

Specifications for the EEPROM 40 are provided in Appendix A. An internal charge pump 44 avoids the necessity of supplying a high voltage for erase and programming. To reduce programming time, bulk, row and byte erase operations are supported.

The erase state of an EPROM byte is $FF. Programming changes ones to zeros. If any bit in a location needs to be changed from a zero to a one, the byte must be erased in a separate operation before it is reprogrammed. If a new byte has no ones in bit positions which were already programmed to zero, it is acceptable to program the new data without erasing the EEPROM byte first.

Programming and erasure of the EEPROM 40 relies on an internal high voltage charge pump 44. The clock source for the charge pump 44 is the same as the A/D subsystem and is selected by ACFR[7,6] as discussed above. Clock frequencies below 2 MHz reduce the efficiency of the charge pump 44 which increases the time required to program or erase a location. The recommended program and erase time is 10 ms when the selected clock is 2 MHz and should be increased to as much as 20 ms when the clock is between 1 MHz and 2 MHz. At least 10 ms should be allowed after changing the clock source for the charge pump 44 to stabilize.

The EEPROM 40 operation is controlled by the NVCR register. Various operations are performed by the EEPROM 40 as described below. Other processor operations can continue to be performed during EEPROM programming and erasure provided these operations do not require a read of the data from the EEPROM 40. The EEPROM 40 is disconnected from the internal read/data bus 34 during program and erase operations.

To read data from the EEPROM 40, the EELAT bit must be zero. When this bit is cleared, the remaining bits in the NVCR register have no meaning or effect and the EEPROM 40 may be read as if it were a normal ROM.

During EEPROM 40 programming, the ROW and BYTE bits are not used. The zero bits in a byte must be erased by a separate erase operation prior to programming. The following sequence of operations is required to initiate a programming cycle as follows:

1. Set the EELAT bit with EEPGM=0
2. Store data to the EEPROM memory location
3. Set the EEPGM bit to turn on the high voltage
4. Wait 10 ms
5. Reset both EEPGM and EELAT bits to return to normal operation (clear NVCR)

The following sequence of operations is required to initiate a bulk erase of the EEPROM memory as follows:

1. Set the ERASE and EELAT bits with EEPGM=0
2. Write any data to any EEPROM address
3. Set the EEPGM bit to turn on the high voltage
4. Wait 10 ms
5. Reset ERASE, EELAT and EEPGM bit to return to normal operation (clear NVCR).

A row in the EEPROM 40 is a group of 16 bytes whose starting address is $xxN0 and whose ending address is $xxNF. The x's indicate don't care address bits. The N is the row number. This type of erase operation saves time compared to byte erase operations when large sections of EEPROM are to be erased. The sequence of operations required to initiate a row erase in the EEPROM 40 is as follows:

1. Set the ROW, ERASE and EELAT bits with EEPGM=0
2. Write any data to any EEPROM address in the selected row
3. Set the EEPGM bit to turn on the high voltage
4. Wait 10 ms
5. Reset ROW, ERASE, EELAT and EEPGM bit to return to normal operation (clear NVCR)

DEAD-MAN AND POWER MONITOR SUBSYSTEM 46

The power monitor circuitry is discussed below in connection with the analog power supply. The dead-man circuitry monitors the microprocessor 30 for proper operation. This function is a mask-enabled option that interacts with the microprocessor 30 through a single register (DMC) located at address $0FF0. The dead-man circuitry may implemented as a 17-bit ripple counter that provides a timeout period of 32.8 milliseconds at a bus rate of 4 MHz (262,144 oscillator cycles). If the counter overflows, a processor reset will occur and the device will be reinitialized.

The dead-man timer is reset by writing a zero to DMC[0]. This will reset the counter and begin the timeout period again. The location of the DMC register was chosen such that a normal bit manipulation instruction cannot reset the timer. Only extended or indexed, 16-bit offset addressing modes can access this location.

DEAD-MAN INTERFACE REGISTER

The dead-man subsystem is controlled by a 1-bit register (DMC) located in memory address space. FIG. 8 defines the register's format.

DMC[0]: Dead-man Reset. This write-only bit is used to reset the dead-man timer. Writing a zero to it will reset the dead-man counter and restart the dead-man timeout time.

ANALOG SUBSYSTEM INTERFACE REGISTERS

The microprocessor 30 interface consists of seven registers (ADZ, AMZ, AMUX, ACSF, AVSF, ADC, and ADCR) located in the memory address space. The format of these registers is shown in FIG. 9.

ADZ: A/D Auto-zero Value. This 6-bit read-write register contains the offset correction value for the voltage input amplifier 80. The ADZ register is loaded with the correction value at the completion of an auto-zero sequence. A value of zero represents the intrinsic positive offset built into the amplifier 80. As the ADZ value increases, the offset decreases. A least-significant-bit represents approximately 0.5 mV offset. The correction value may be changed by writing to this register. Write operations to the ADZ register are intended for diagnostic and verification purposes and are not intended in normal operation. The auto-zero sequence should provide the proper offset value for nominal device operation. At the completion of the auto-zero, the offset of the amplifier 80 should be in the range of 0 to −0.5 mV.

AMZ: Amplifier Auto-zero Value. This 6-bit read-write register contains the offset correction value for the current amplifier 90. The AMZ register will be loaded with the correction value at the completion of an auto-zero sequence. As the AMZ value increases, the offset decreases. A least-significant-bit represents approximately 0.5 mV offset. The correction value may be changed by writing into this register. Write operations to this register are intended for diagnostic and verification purposes and should not be done in normal operation. The auto-zero sequence should provide the proper offset value for nominal device operation. At the completion of the auto-zero, the offset of the amplifier should be in the range of 0 to −0.5 mV.

ACSF: Current Scale Factor. This read-write register is used to control operation of the current input auto-ranging. The value written into this register determines the current subsystem auto-ranging operating mode. If a zero is written, the current subsystem is placed in auto-ranging mode. A nonzero value inhibits auto-ranging and sets the current mirror 92 into a fixed scale value. Table 7 defines possible values for ACSF write operations. Values other than these will cause unpredictable operation.

This register is not a true 'read-write' register. The value read from it is not necessarily the value that was written into it. Writing a zero into ACSF enables auto-ranging, however, a zero will never be read from ACSF. There are only five possible values that will be read: $10, $08, $04, $02, and $01.

The value read from this register is one of the scale factors required to properly scale the 8-bit A/D output. Five values are possible: x1, x2, x4, x8 and x16. Scale factors are shown in Table 7.

TABLE 7

CURRENT SCALE FACTOR CONTROL VALUES

| ACSF[7 ... 0] | HARDWARE MODE | SOFTWARE SCALE FACTOR |
|---|---|---|
| $00 | Auto-ranging enable | |
| $10 | Divide by 16 | × 16 |
| $08 | Divide by 8 | × 8 |
| $04 | Divide by 4 | × 4 |
| $02 | Divide by 2 | × 2 |
| $01 | Divide by 1 | × 1 |

AVSF: Voltage Scale Factor. This read-write register is used to control operation of the voltage input auto-ranging. The value written into this register determines the voltage amplifier 80 auto-ranging operating mode. If a zero is written, the voltage amplifier 80 is placed in auto-ranging mode. A nonzero value inhibits auto-ranging and sets the voltage amplifier 80 in a fixed-gain mode of operation. Table 8 defines legal values for AVSF write operations. Values other than these will cause unpredictable operation.

This register is not a true read-write register. The value read from it is not necessarily the value that was written into it. Writing a zero into AVSF enables auto-ranging, however, a zero will never be read from AVSF. There are only five possible values that will be read: $10, $08, $04, $02 and $01.

TABLE 8

A/D VOLTAGE AMPLIFIER CONTROL VALUES

| ACSF[7 ... 0] | HARDWARE MODE | SOFTWARE SCALE FACTOR |
|---|---|---|
| $00 | Auto-ranging enable | |
| $01 | × 16 gain | × 1 |
| $02 | × 8 gain | × 2 |
| $04 | × 4 gain | × 4 |
| $08 | × 2 gain | × 8 |
| $10 | × 1 gain | × 16 |

The value read from this register is one of the scale factors required to properly scale the A/D output. Five values are possible: x1, x2, x4, x8 and x16. Scale factors are shown in Table 8. This register should not be read or written to while a conversion is in progress.

AMUX: Input Multiplexer Controls. This 8-bit read-write register is used to select the MUXes 66 and 68 connected to the voltage and current input channels 62 and 64. The register is divided into two 4-bit fields; one for controlling the voltage input channels and the other for controlling the current input channels. It is also used to initiate the A/D conversion process. Writing to this register will initiate an A/D conversion.

AMUX[3 ... 0]: A/D Channel Select. These four bits control operation of the voltage input channels 62 and 64. These bits are decoded as shown in Table 9. Values indicated as "reserved" are dedicated to test and verification and should not be selected during normal operation. When the current channels 62 are selected (AMUX[3 ... 0]=1000), auto-ranging of the voltage amplifier 80 will be inhibited and the gain set to x1. If a nonzero value has previously been written into the AVSF register, the selected gain will be used instead of an x1 gain factor.

TABLE 9

A/D CHANNEL SELECT DECODE

| AMUX [3...0] | SOURCE | AMUX [3...0] | SOURCE |
|---|---|---|---|
| 0000 | MUX0 | 1000 | MXO(Current Channel) |
| 0001 | MUX1 | 1001 | Reserved |
| 0010 | MUX2 | 1010 | Reserved |
| 0011 | MUX3 | 1011 | Reserved |
| 0100 | MUX4 | 1100 | Reserved |
| 0101 | MUX5 | 1101 | Reserved |
| 0110 | Reserved | 1110 | Temp. Sensor |
| 0111 | Reserved | 1111 | AVSS (0 volts) |

AMUX[7 ... 4]: Current MUX Select. These four bits control operation of the current input channels 62. Each bit controls a channel independent of the other three bits. Bits are assigned sequentially with AMUX[4] assigned to input pin MUX0 and AMUX[7] assigned to input pin MUX3. These bits have no effect if the associated channel is configured for voltage mode by the CFR register. A zero in AMUX[7 ... 4] connects the appropriate input pin(s) to digital ground (VSS), while a one connects the pin(s) to the current mirror 92 output. The currents can be summed by selecting multiple current inputs. If all four bits of this field are zero, no input channels are connected to the current mirror 92 output. Since the inverting input of the current amplifier 90 remains connected to the current mirror 92 output, the current amplifier 90 output will be low, and the current mirror 92 will have no current flowing out of it.

ADC: A/D CONVERTER OUTPUT This read-only register is used to return the 8-bit output value. The least-significant bit is in ADC[0]. This value must be multiplied by the voltage and current scale factors found in ACSF and AVSF. Depending on the mode of operation, both scale factors may not be needed:

Voltage Inputs: The ADC register should be multiplied by AVSF for all voltage inputs. The contents of ACSF register should not be used to scale a voltage reading.

Current Inputs: The ADC register should be multiplied by the value in the ACSF register and then the AVSF register for scaling of the current subsystem output (MSO). If the voltage amplifier 80 is set to auto-ranging, the AVSF software scale factor will always be x16, since the voltage gain will be forced to x1 by the selection of MXO.

If an input voltage is converted that is not in the range of AVSS to VREF, the A/D converter will return either $00 (voltages less than AVSS) or $FF (voltages greater than VREF). No additional indication is provided.

ADCR: A/D Subsystem Control This byte-wide register is used to control operation of the A/D 78. It is implemented as a read-write register to permit read-modify-write instructions to properly manipulate bits. All command bits will read as zero. Control bits will read the current value of the control bit.

ADCR[0]: Unused. This bit is not used. The ADCR[0] bit will always read zero.

ADCR[1]: Sample Inputs. This control bit is used to close the three MUXes 108, 110 and 112 that connect the pairs of channels 102, 104 and 106 together to form the sample and hold function. The channels are closed when ADCR[1]=1 and open when ADCR[1]=0. ADCR[1] is set to zero by device reset. Each of the sample and hold switches 108, 110 and 112 will close only if both channels it is associated with are configured in the voltage mode.

ADCR[2]: Initiate Auto-Zero Sequence. When this command bit is written with a one, the voltage and current amplifiers 80 and 90 will initiate an autozero sequence. When the sequence is completed, the ADCR[6] bit will be set to a one. An interrupt will be generated, if enabled, at the completion of the autozero sequence. The ADCR[2] bit will always read zero.

ADCR[3]: Integrator Reset. When this control bit is written with a one, the MUX 96 disconnects the MXO pin from the current mirror 92 and shorts MXO to analog ground. The MUX 96 will remain shorted as long as this bit remains set. To open the MUX 96 a zero must be written to ADCR[3]. This bit will read the present state of the MUX 96.

ADCR[4]: Enable Interrupt. This control bit enables interrupts from the A/D subsystem 78. When the ADCR[4] bit is set to one, interrupts are enabled. The ADCR[4] bit will read the present state of the interrupt enable.

ADCR[5]: Acknowledge Interrupt And Operation Complete. This command bit resets the operation complete flags when written with a one. It will reset ADCR[6 . . . 7], removing the interrupt request from the processor. ADCR[5] should be written with a one prior to initiation of another conversion. This bit will always read as a zero.

ADCR[6]: Auto-Zero Sequence Complete. This read-only status bit indicates the completion of an auto-zero sequence. It will be set to a one after completion of the auto-zero cycle. Registers ADZ and AMZ will be updated with the new value of offset correction calculated by the auto-zero sequence. This bit is reset by writing to the ADCR[5] bit with a one. The ADCR[6] bit cannot be written.

ADCR[7]: Conversion Complete. This read-only status bit indicates the completion of an A/D conversion cycle. It will be set to a one after completion of the A/D conversion and indicates that data is available in the ADC, ACSF, and AVSF registers. It is reset by writing the ADCR[5] bit with a one. This bit cannot be written.

A/D SUBSYSTEM OPERATION

The A/D subsystem should be initialized during the power-up routine. The following initialization operations are required.

The ACFR register should be written with the appropriate value to select the proper operating mode of the MUX4 . . . MUX1 inputs. Care should be used when placing an input channel in the current mode, since this will produce a low-impedance on the input pin.

The clock source and divider ratio should be selected with the ACFR[7,6] bits based on the application's crystal value. If the RC oscillator mask option is selected, the clock source should be set to internal (ACFR[7]=0). The ACFR[5] bit should be written with a one to enable A/D subsystem operation.

The control register (ADCR) should be written with an appropriate value. Bits 1, 3 and 4 should be set to establish initial operation conditions. An auto-zero sequence should be initiated by setting the bit ADCR[2]=1. This will cause the offset voltages in the voltage and current amplifiers 80 and 90 to be canceled and the ADZ and AMZ registers to be set to the correct values.

The two scale factor registers (ACSF and AVSF) should be initialized. If auto-ranging is desired, a zero should be written into both registers, otherwise the required scale factors should be selected.

OPERATION WITH VOLTAGE INPUTS

To initiate a conversion of a voltage input, the AMUX register should be written with a value that contains the desired input channel in the low-order four bits and the present current switch selection in the high-order four bits. This will start the conversion of the selected voltage input. When the conversion is complete, an interrupt will be generated (if enabled) and the ADCR[7] bit will be set. The ADCR[5] bit should be written with a one to clear the interrupt and acknowledge the operation complete flag. This will reset the ADCR[7] bit. The conversion value is read from ADC register and then multiplied by the value in the AVSF register to produce a 12-bit value. It should be noted that a voltage gain factor of x1 produces a scale factor of x16.

Moreover, it is not intended to write to the AVSF register prior to each conversion. The ADCR[7] bit must be cleared after every conversion operation by writing to the ADCR[5] bit with a one.

OPERATION WITH CURRENT INPUTS

To initiate a conversion of a current input, the AMUX register should be written with a value that contains $8 in the low-order four bits and the present current switch selection in the high-order four bits. This will start the conversion of the MXO input. When the conversion is complete, an interrupt will be generated (if enabled) and ADCR[7] will be set. ADCR[5] should be written with a one to clear the interrupt and acknowledge the operation complete flag. This will reset ADCR[7]. The conversion value is read from the ADC register and then multiplied by AVSF and ACSF to produce a 16-bit value. If voltage auto-ranging has been enabled by writing AVSF with a zero, it is not necessary to multiply the result by AVSF as long as a 12-bit result is desired. It should be noted that a voltage gain factor of X1 produces a scale factor of X16. As long as AVSF is not written with an overriding gain factor, the X16 scale factor can be ignored for current conversions.

The A/D subsystem generates a synchronous interrupt at vector address $1FF4–$1FF5. The interrupt must be acknowledged prior to resetting the 1 bit in order to not reprocess the interrupt.

SUBSYSTEM OPERATION

1. QUADCOMPARATORS SUBSYSTEM 58

Four individual inverting comparators are available. The non-inverting input of each is referenced to +1.25 volts. The comparators are discussed in detail below. Specifications for the subsystem are provided in Appendix B. The comparator output states can be read from a register (CMPST) and can also be directly connected to the least significant four output pins of port C. One comparator interrupts on both rising and falling output signals while the other three comparators interrupt only on rising outputs.

The quadcomparator subsystem 58 is controlled by 4 bits of the Configuration Register as defined in FIG. 6.

CFR [3 . . . 0]: Comparator Mode Control. These four configuration bits enable the comparator outputs to be ORed with the least-significant four bits of port C. A zero in a configuration bit enables the OR operation for the associated port pin. In this mode, each output pin will be low during device reset if the respective comparator input is above the threshold voltage (+1.25 V). A reset will clear the port C output register making the output pin only a function of the comparator input. When the microprocessor 30 writes a 1 into this port output register bit, the corresponding output pin will be forced high independent of the state of the comparator input.

A one in these configuration bits disables the OR operation. In this mode, the port pins behave as a normal output pin. The configuration bits are assigned sequentially, with CFR[0] controlling PC0/CMP0 and CFR[3] controlling PC3/CMP3. See Table 10 for assignments.

TABLE 10

| COMPARATOR MODE CONTROL | |
|---|---|
| CFR[3]: | PC3/CMP3 |
| CFR[2]: | PC2/CMP2 |
| CFR[1]: | PC1/CMP1 |
| CFR[0]: | PC0/CMP0 |

Figure 10:
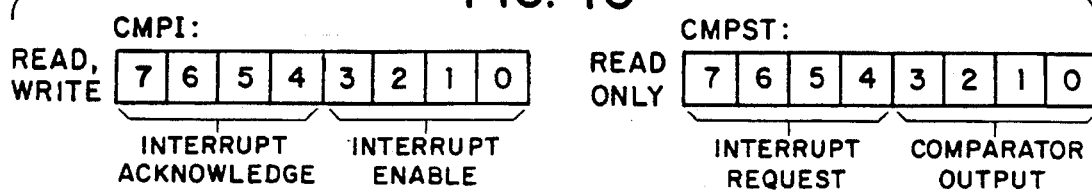
FIG. 10 is a format diagram for comparator mode control registers CMPI and CMPST which form a portion of the IC in accordance with the present invention.

The comparator subsystem 58 communicates with the microprocessor 30 through a set of two control and status registers (CMPI and CMPST) located in memory address space. The state of each comparator output can be read through the CMPST register. An external interrupt facility is provided to generate interrupts on selected edges of the comparator outputs. These comparators have approximately 20 mV of optional hysteresis. FIG. 10 shows the format of these registers.

CMPI REGISTER

CMPI[7 . . . 4]: Interrupt Acknowledge. These four command bits are used to reset the interrupt request generated by the quadcomparator subsystem 58. They always read as zero. When a one is written into a command bit, the corresponding interrupt request is cleared. These four bits are not read-write registers. The interrupt request must be reset prior to clearing the 1-bit to prevent reprocessing the interrupt. Bit assignments are defined in Table 11.

TABLE 11

| CMPI[7 . . . 4] BIT ASSIGNMENTS | |
|---|---|
| CMPI[4]: | CP0 |
| CMPI[5]: | CP1 |

TABLE 11-continued

| CMPI[7 . . . 4] BIT ASSIGNMENTS | |
|---|---|
| CMPI[6]: | CP2 |
| CMPI[7]: | CP3 |

CMPI[3 . . . 0]: Interrupt Enable. These four control bits are used to enable the comparator interrupts. A one enables a comparator interrupt, while a zero disables it. They are true enables in that transitions prior to the enable will be ignored. Clearing the enable with an interrupt pending will remove the interrupt request. These four bits are implemented as true read-write registers. Bit assignments are defined in Table 12.

TABLE 12

| CMP[3 . . . 0] BIT ASSIGNMENTS | |
|---|---|
| CMP[0]: | CP0 |
| CMP[1]: | CP1 |
| CMP[2]: | CP2 |
| CMP[3]: | CP3 |

CMPST REGISTER

CMPST[7 . . . 4]: Interrupt Request. These four read-only status bits indicate which comparator interrupt(s) are active. They are read to determine the cause of the microprocessor interrupt. A one indicates an interrupt request for its respective comparator output. Bit assignments are defined in Table 13.

TABLE 13

| CMPST[4]: | CP0 |
|---|---|
| CMPST[5]: | CP1 |
| CMPST[6]: | CP2 |
| CMPST[7]: | CP3 |

CMPST[3 . . . 0]: Comparator Output. These four read-only status bits indicate the state of the four comparator outputs. A one indicates the comparator output is high and that the comparator input is below the threshold. Bit assignments are defined in Table 14.

TABLE 14

| CMPST[0]: | CP0 |
|---|---|
| CMPST[1]: | CP1 |
| CMPST[2]: | CP2 |
| CMPST[3]: | CP3 |

The comparator subsystem 30 generates a synchronous interrupt at vector address $1FF6–$1FF7.

2. B+ COMPARATOR 50

The B+ comparator 50 is discussed in detail below. This comparator is provided for power supply generation (see FIG. 40B). The negative input of this comparator is connected to the VREF pin (+2.5 V nominal). The positive pin is BSENSE. The comparator output is located at BDRIVE. Comparator specifications are provided in Appendix B.

3. PORT A SUBSYSTEM 52

Figure 11:
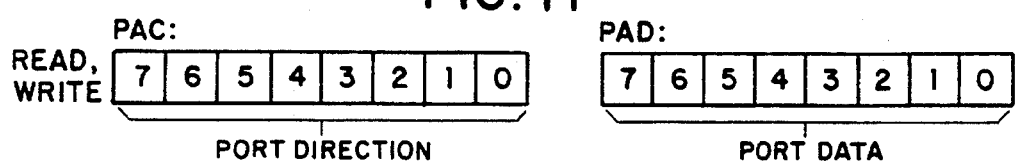
FIG. 11 is a format diagram for PORT A registers PAC and PAD which form a portion of the IC in accordance with the present invention.
Figure 12:
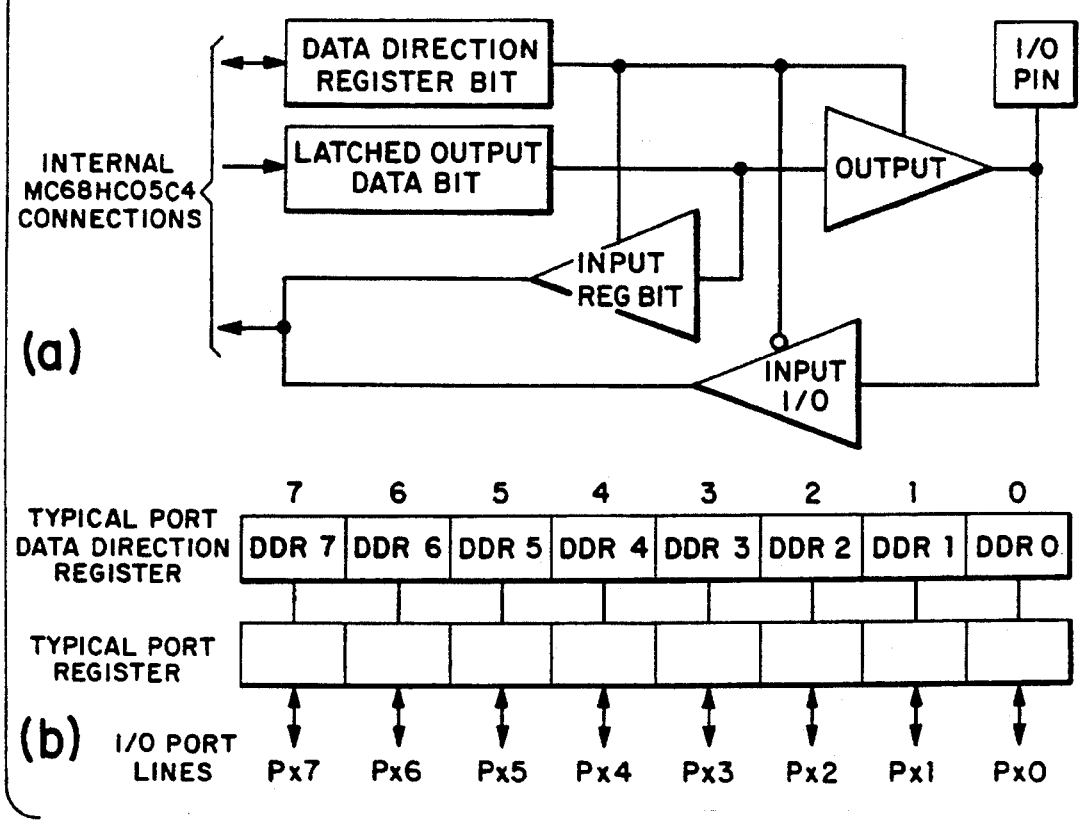
FIG. 12 is s a block diagram of a parallel port which forms a portion of the IC in accordance with the present invention.

Port A is an 8-bit bidirectional input/output port. FIG. 12 illustrates the operation of typical parallel port I/O circuitry discussed in detail below. The eight port A pins can be individually programmed as input or output. The port A subsystem 52 communicates with the microprocessor 30 through a set of two registers (PAD, PAC) located in memory address space. The direction of each port bit is determined by PAC, while the state of the port pins is controlled by PAD. The format of these registers is provided in FIG. 11.

PAC REGISTER

PAC[7 . . . 0]: Port Direction. These eight bits are used to control the direction of the corresponding port pin. The port pin is an input if the port direction bit is zero. At reset, the port direction bits are cleared to zero, defining the port pins as inputs.

PAD REGISTER

PAD[7 . . . 0]: Port Data. These eight bits are used to read the state of the port pin if an input, and to control the state of a port pin if it is an output. A zero corresponds to an electrical low on the port pin. Bits are assigned sequentially, with PAD[0] controlling pin PA0. Device reset does not affect the data register.

PORT OPERATION

Each of the eight bits of the port operates independently of the others. The following paragraphs describe the operation of a single port bit.

Each port pin can be programmed to be either an input or output as determined by the port direction register bits. A pin is configured as an input if its port direction register bit is set to zero. At power-on or reset, all port direction register bits are cleared, which configures port pins as inputs. When the port direction register bit is set, the port pin becomes an output, driving the state of the port data register bit onto the port pin. A one in the port data register causes a high on the port pin. When the port data register is written, the eight data bits are latched in the port data register.

When the port data register is read, the source of the data is determined by the port direction register. If the port pin is configured as an output, the read operation data source is the port data register, not the port pin. If the port pin is configured as an input, the read operation data source is the port pin itself. This prevents read-modify-write operations from altering the state of output pins that may be loaded by external circuitry.

Whenever a port pin's direction is changed to output, its data register should be loaded with the desired output state prior to direction change.

4. PORT B SUBSYSTEM 54

Port B is a 3-bit bidirectional input/output port. The three port B pins can be individually programmed as input or output. They are shared with the synchronous serial I/O port (SSIOP) and their functionality may be changed when that system is in use.

The port B subsystem 54 communicates with the microprocessor 30 through a set of two registers (PBD, PBC) located in memory address space illustrated in FIG. 13. The direction of each port bit is determined by PBC, while the state of the port pins is controlled by PBD.

PBC REGISTER

PBC[7 . . . 5]: Port Direction. These three bits are used to control the direction of the corresponding port pin. The port pin is an input if the port direction bit is zero. At reset, the port direction bits are cleared to zero, defining the port pins as inputs. Bit assignments are in ascending order with PBC[5] assigned to pin PB5/SDO and PBC[7] assigned to pin PB7/SCK. Bits 0 through 4 of this register are unused and read as ones.

PBD REGISTER

PBD[7 . . . 5]: Port Data. These three bits are used to read the state of the port pin if an input, and to control the state of a port pin if it is an output. A zero corresponds to an electrical low on the port pin. Bits are assigned sequentially, with PBD[5] controlling pin PB5/SDO. Device reset does not affect the data register. Bits 0 through 4 of this register are unused and read as ones.

5. SYNCHRONOUS SERIAL I/O PORT

The synchronous serial input/output port (SSIOP) subsystem is designed to provide a simple interface to peripheral devices that communicate over a serial bus. It may also be used for inter-processor communication in a multi-processor system. The SSIOP is essentially an 8-bit shift register with separate pins for incoming (PB6/SD1) and outgoing (PB5/SDO) data and a third pin for serial clock (PB7/SCK).

The SSIOP communicates with the microprocessor 30 through three registers located in memory address space: SPD, SPSR and SPCR. FIG. 14 defines the registers formats.

SPD: SSIOP DATA REGISTER

This 8-bit read-write register is used to transmit and receive data on the synchronous serial bus. This system is not double buffered and thus any write to this register will destroy the previous contents. The SPD register can be read at any time, but if a transmission is in progress, the results may be ambiguous. Writes to the SPD register while a transmission is in progress can cause invalid data to be transmitted and/or received.

SPSR: SSIOP STATUS REGISTER

This 2-bit, read-only register is used to indicate operational status of the SSIOP. The two bits are cleared by device reset.

SPSR[7]: SSIOP Interface Flag (SPIF). This operation flag is set upon occurrence of the last rising clock edge and indicates that a data transfer has taken place. It has no effect on any further transmissions and can be ignored without problem. SPIF is cleared by reading the SPSR with SPIF set (SPSR[7]) followed by a read or write of the serial data register SPD. If SPIF is cleared before the last edge of the next byte, it will be set again. Reset clears this bit.

SPSR[6]: Data Collision (DCOL). This read-only status bit indicates an invalid access to the data register has been made. This can occur any time after the first falling edge of PB7/SCK until SPIF is set. A read or write of the data register during this time will result in invalid data being transmitted or received. DCOL is cleared by reading the SPSR with SPIF set followed by a read or write of the data register. If the last part of the clearing sequence is done after another transmission has been started, DCOL will be set again. Reset also clears this bit.

SPCR: SSIOP CONTROL REGISTER

This 2-bit register is used to control operation of the SSIOP subsystem. It is implemented as a read-write register to permit read-modify-write instructions to properly manipulate bits. These control bits will read the current value of the bit.

SPCR[6]: SIOP Enable (SPE). This control bit enables the synchronous serial I/O port and initializes the port B control register such that PB5 (SDO) is output, PB6 (SD1) is input and PB7 (SCK) is input (slave mode only). The port B control register can be subsequently altered as the application requires and the port B data register (except for PB5) can be manipulated as usual, however, these actions could affect the transmitted or received data. When the SPE register is cleared, port B reverts to a standard parallel I/O port without affecting the port B data or control register. The SPE register is readable and writable any time, but clearing the SPE register while a transmission is in progress will abort the transmission, reset the bit counter, and return port B to its normal I/O function. Reset clears this bit.

SPCR[4]: Master Mode (MSTR). This control bit is used to configure the SSIOP for master mode. In this mode the transmission is initiated by writing to the data register (SPD). The PB7/SCK pin is configured as an output providing a synchronous data clock at a fixed rate of either a processor phase 2 divided by 4 or 32 as determined by a mask option. While the device is in master mode, the PB5/SDO and PB6/SD1 pins do not change function. These pins behave exactly the same as in slave mode. Device reset clears SPCR[4] and returns the SSIOP to slave mode. This control bit may be set at any time regardless of the state of SPE. Clearing MSTR will abort any transmission in progress.

SSIOP OPERATION

The SSIOP operates as a synchronous serial communication interface. Data is transmitted by the master device in parallel to all slave devices over a single wire connected to the PB5/SDO pin. The selected slave device transmits data over a separate wire connected to the PB6/SD1 pin in a full duplex fashion. A common clock PB7/SCK, serves both input and output data streams. Thus, the byte transmitted by the master is replaced by the byte received from the slave. Slave selection in multiple-slave configurations will require the use of additional port pins or external decoding logic if more than one slave is employed.

This bidirectional I/O pin PB7/SCK is used as the data clock for the SSIOP. The state of PB7/SCK between transmissions must be a logic one. The first falling edge of PB7/SCK signals the beginning of a transmission. At this time, the first bit of transmitted data is presented at the PB5/SDO pin. Data is captured at the PB6/SD1 pin on the rising edge of PB7/SCK. Subsequent falling edges shift the data and present the next bit. The transmission is ended upon the eighth rising edge of PB7/SCK. The maximum frequency of PB7/SCK in slave mode is equal to the processor's phase 2 clock divided by 4. For an 8 MHz oscillator, the maximum PB7/SCK frequency is 1 MHz. There is no minimum clock rate.

In master mode, the format is identical, except that the PB7/SCK pin is an output and the shift clock now originates internally. The master mode transmission frequency is selected by mask option at either crystal frequency divided by 8 or 64.

The PB6/SK1 pin becomes an input as soon as the SSIOP is enabled. New data may be presented to the PB5/SD1 pin on the falling edge of PB7/SCK. Valid data must be present at least 100 ns prior to the rising edge of the serial clock.

The PB5/SDO pin becomes an output as soon as the SSIOP is enabled. A mask programming option configures data transmission to be either MSB or LSB first. In either case, the state of the PB5/SDO pin will always reflect the value of the first bit received on the previous transmission if there was one. Prior to enabling the SSIOP, PB5/SDO can be initialized to determine the beginning state if necessary by normal port operations. While the SSIOP is enabled, PB5/SDO cannot be used as a standard port since the pin is coupled to the last stage of the serial shift register. On the first falling edge of PB7/SCK, the first data bit to be shifted out is presented to the output pin.

6. PORT C SUBSYSTEM 45

Port C is an 8-bit bidirectional input/output port. The eight port C pins can be individually programmed as input or output. Four pins can be assigned specialized output functions by the configuration register CFR.

CFR[3 . . . 0]: Comparator Mode Control. These four configuration bits enable the comparator outputs to be ORed with the least-significant four bits of port C. A zero in these configuration bits enables the OR operation. In this mode, device reset places the four port pins in input mode and causes the port pins to be low unless the respective comparator outputs are above the threshold of +1.25 V.

A one in these configuration bits disables the OR operation. In this mode, the port pins behave as normal I/O pins. The configuration bits are assigned in sequential order with CFR[0] controlling PCD/CMPO and CFR[3] controlling PC3/CMP3.

INTERFACE REGISTERS

The port C subsystem 56 communicates with the microprocessor 30 through a set of two registers (PCD, PCC) located in memory address space, illustrated in FIG. 15. The direction of each port bit is determined by PCC, while the state of the port pins is controlled by PCD.

PCC REGISTER

PCC[7 . . . 0]: Port Direction. These eight bits are used to control the direction of the corresponding port pin. The port pin is an input if the port direction bit is a zero. At reset, the port direction bits are cleared to zero, defining the port pins as inputs. Note that the low-order four bits can be set to be outputs by the CFR. Bit assignments are in ascending order with PCC[0] assigned to pin PC0 and PCC[7] assigned to pin PC7.

PCC[7 . . . 4]: The high-order nibble of the port control register operates as a normal set of bidirectional port control bits. The following conditions apply:

Reset clears PCC[7 . . . 4].

Writing a zero to a PCC[7 . . . 4] bit will cause the corresponding port pin to become an input, with its state readable by the respective bit in the PCD.

Writing a one to a PCC[7 . . . 4] bit will cause the corresponding port pin to become an output, with its state driven by the last state written to the respective bit in the PCD.

Reading PCC[7 . . . 4] will reflect the current state of those bits allowing for bit manipulation using read-modify-write instructions.

PCC[3 . . . 0]: The low-order nibble of the port control register operates differently from the high-order depending on the state of the configuration control register bits CFR[3 . . . 0]. The following conditions apply:

A zero in one of the lower four bits of the CFR (CFR[3 . . . 0]) will set the corresponding bit in the PCC.

Since device reset clears CFR[3 . . . 0], the low-order nibble of the port control register (PCC[3 . . . 0]) will be set after reset.

Writing a zero to one of the lower four bits of the PCC (with the corresponding CFR bit set), will cause the respective port pin to become an input, with the pin's state readable in the data register PCD.

Writing a one to one of the lower four bits of the PCC (with the corresponding CFR bit set), will cause the respective port pin to become an output, with its state driven by the last state written to the appropriate PCD bit.

Writing a one to one of the lower four bits of the PCC will be ignored if the respective bit in the CFR is clear.

Reading the lower four bits of the PCC will reflect the current state of those bits as stored in the PCC allowing for bit manipulation using read-modify-write instructions.

PCD REGISTER

PCD[7 . . . ]: Port Data. These eight bits are used to read the state of the port pins if configured as an input and to control the state of a port pin if it is configured as an output. A zero corresponds to an electrical low on the port pin. Bits are assigned sequentially, with PCD[0] controlling pin PC0. Device reset does not affect the data register PCD[3 . . . 0]. The high-order four bits are not changed by reset.

PCD[7 . . . 4]: The high-order nibble of PCD operates as a normal bidirectional port data register. The following conditions apply:

Reset does not affect the upper four bits of the PCD.

A read of the upper four bits of the PCD will reflect the state of the respective port pin if the corresponding PCC bit is clear (input mode).

A read of the upper four bits of the PCD will reflect the last state of the respective bit in the PCD if the corresponding PCC bit is set (output mode).

7. PORT D SUBSYSTEM 60

Port D is a 1-bit special function port associated with the timer.

PDD REGISTER

The port D subsystem communicates with the microprocessor 30 through a single data register (PDD) located in memory address space (FIG. 16).

The port D data register is a special purpose 1 bit register associated with the timer.

PDD[7] is a read-only bit associated with the PD7/TCAP pin. This bit can be read at any time, even if the TCAP function is enabled. Write operations have no effect on this register bit.

All other PDD bits are unimplemented and read as zeros. Bits 0 through 6 of the port D data register are unimplemented. Bit 4 always reads as one, while the others read as zeros.

8. PROGRAMMABLE TIMER

Figure 17:
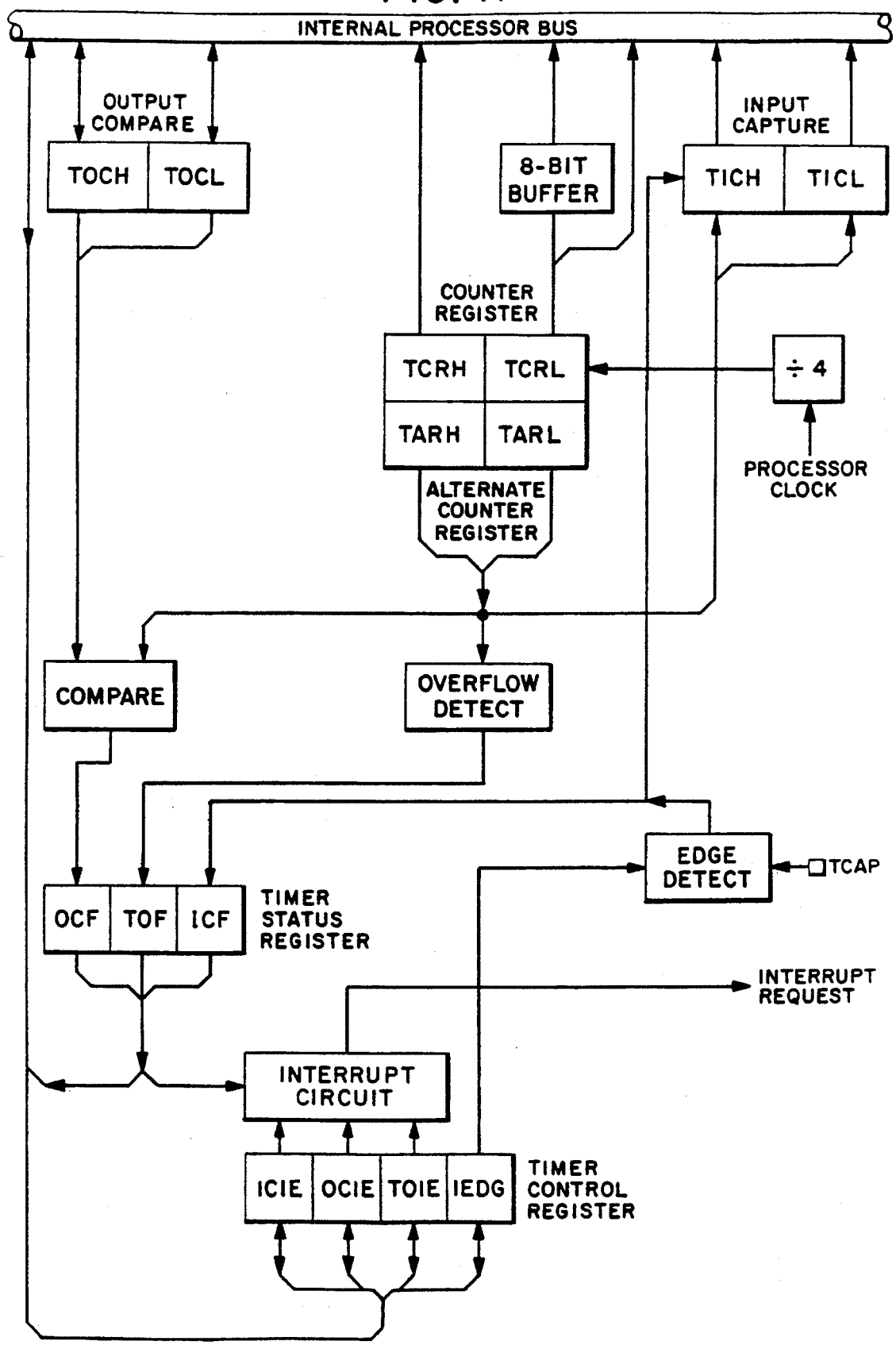
FIG. 17 is a block diagram of a programmable timer which forms a portion of the IC in accordance with the present invention.

The IC 10 contains a single 16-bit programmable timer 60. The timer 60 is driven by the output of a fixed divide-by-four prescaler operating from the microprocessor 30 phase 2 clock. It can be used for many purposes, including input waveform measurements. The timer 60 is also capable of generating periodic interrupts or indicating passage of an arbitrary number of internal clock cycles. A block diagram of the timer is shown in FIG. 17. Timing diagrams are shown in FIGS. 18(a)–18(d).

Because the timer has a 16-bit architecture, each specific functional capability is represented by two registers. These registers contain the high and low byte of that function. Generally, accessing the low byte of a specific timer function allows full control of that function; however, an access of the high byte inhibits that specific timer function until the low byte is also accessed. The 1-bit in the condition code register should be set while manipulating both the high and low byte register of a specific timer function to ensure that an interrupt does not occur. This prevents interrupts from occurring between the time that the high and low bytes are accessed.

The key element in the programmable timer 60 is a 16-bit free running counter preceded by a prescaler which divides the microprocessor internal phase-2 clock by four. The prescaler gives the timer a resolution of 2.00 μs assuming a crystal frequency of 4 MHz. The counter is clocked to increasing values during the low portion of the internal phase 2 clock. Software can read the counter at any time without affecting its value.

The double-byte free running counter can be read from either of two locations: the counter register (TCRH, TCRL), or the alternate counter register (TARH, TARL). A read sequence containing only a read of the least significant byte of the counter register will receive the counter value at the time of the read. If a read of the counter at either location first addresses the most significant byte, it causes the least significant byte to be transferred to a buffer. This buffer value remains fixed after the first most significant byte read, even if the user reads the most significant byte several times. The buffer is accessed when reading the counter register (TCRL) or alternate counter register (TARL) least significant byte, and thus completes a read sequence of the total counter value. In reading either the counter register or alternate counter register, if the most significant byte is read, the least significant byte must also be read in order to complete the sequence.

The free running counter cannot be loaded or stopped by the program. During a power-on-reset or device reset, the counter is set to $FFFC and begins running after the oscillator start-up delay. Because the counter is 16 bits and is preceded by a fixed divide-by-four prescaler, the value in the counter repeats every 262,144 microprocessor 30 phase 2 clock cycles. When the counter rolls over from $FFFF to $0000, the timer overflow flag bit (TOF) is set. An interrupt can also be enabled when counter rollover occurs by setting its interrupt enable bit (TOIE).

Figure 18A:
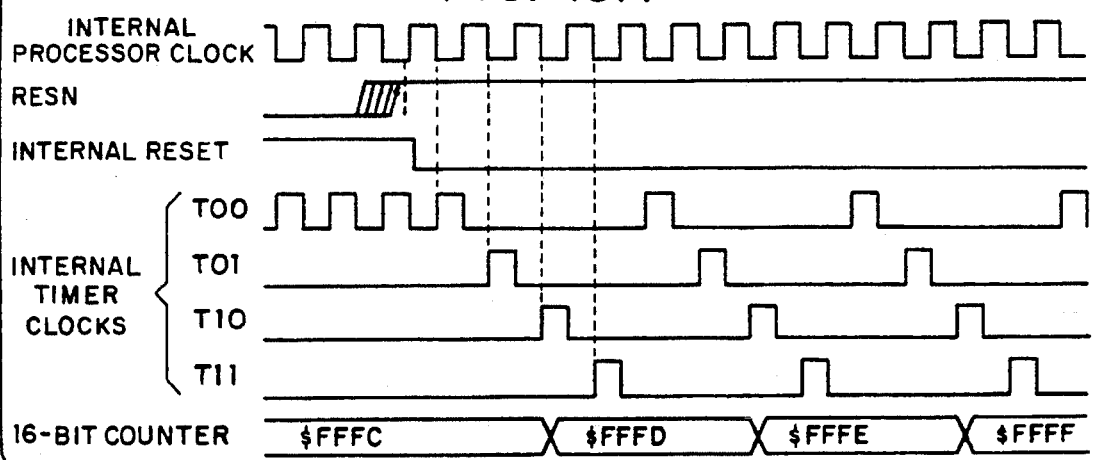
FIG. 18(a)–18(d) are timing diagrams for the timer of FIG. 17.
Figure 18B:
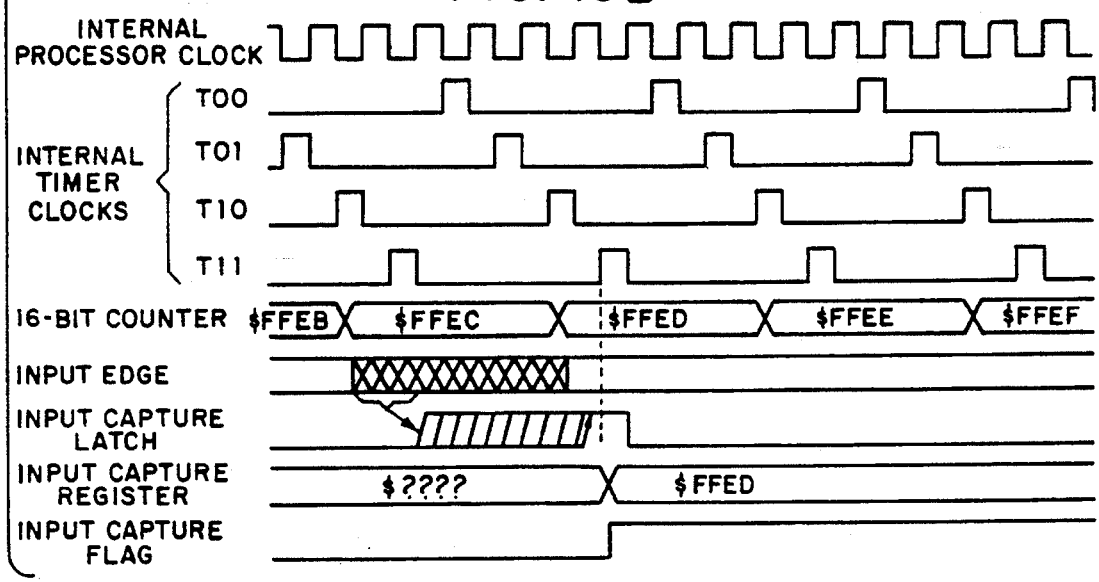
Figure 18C:
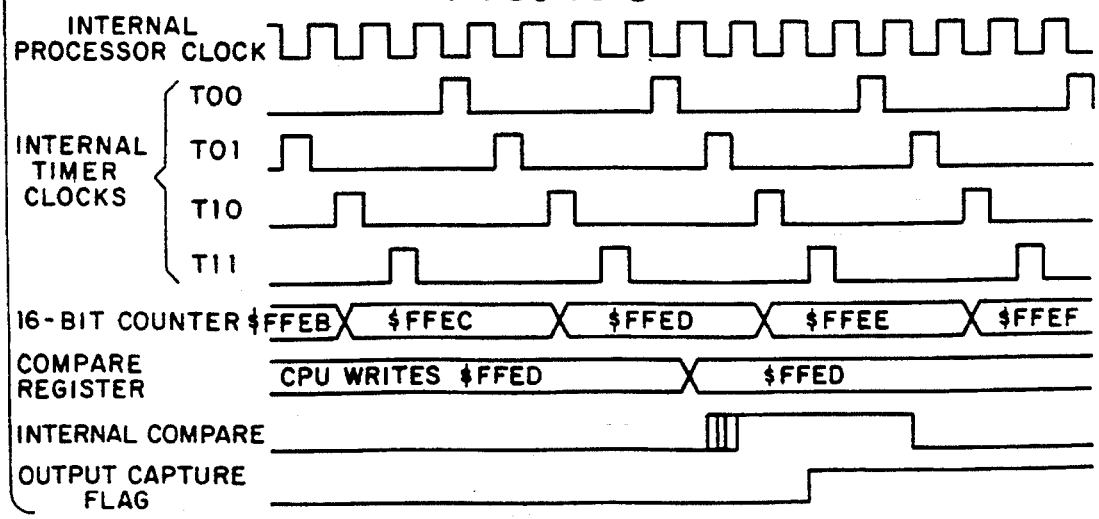
Figures 18D, 19:
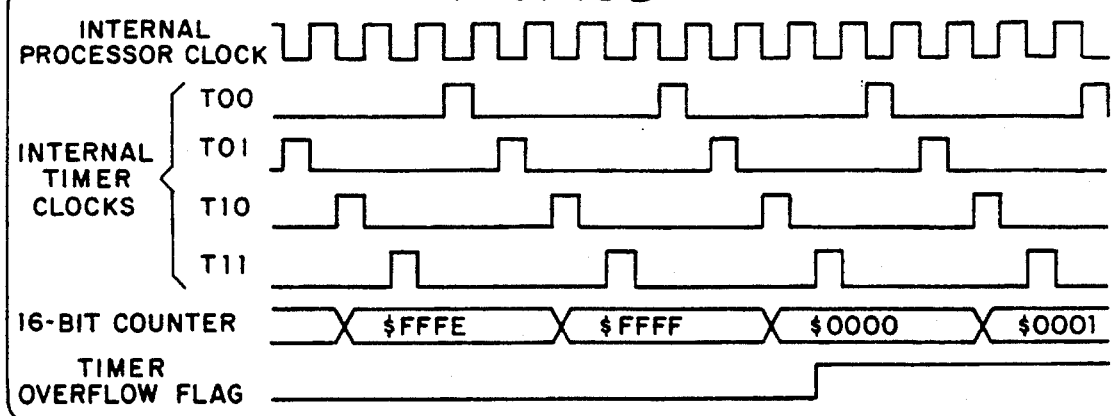
FIG. 19 is a format diagram for programmable timer registers TCRH, TCRL, TARH, TARL, TICH, TICL, TOCH, TOCL, TCR and TSR which form a portion of the IC in accordance with the present invention.
Figure 20:
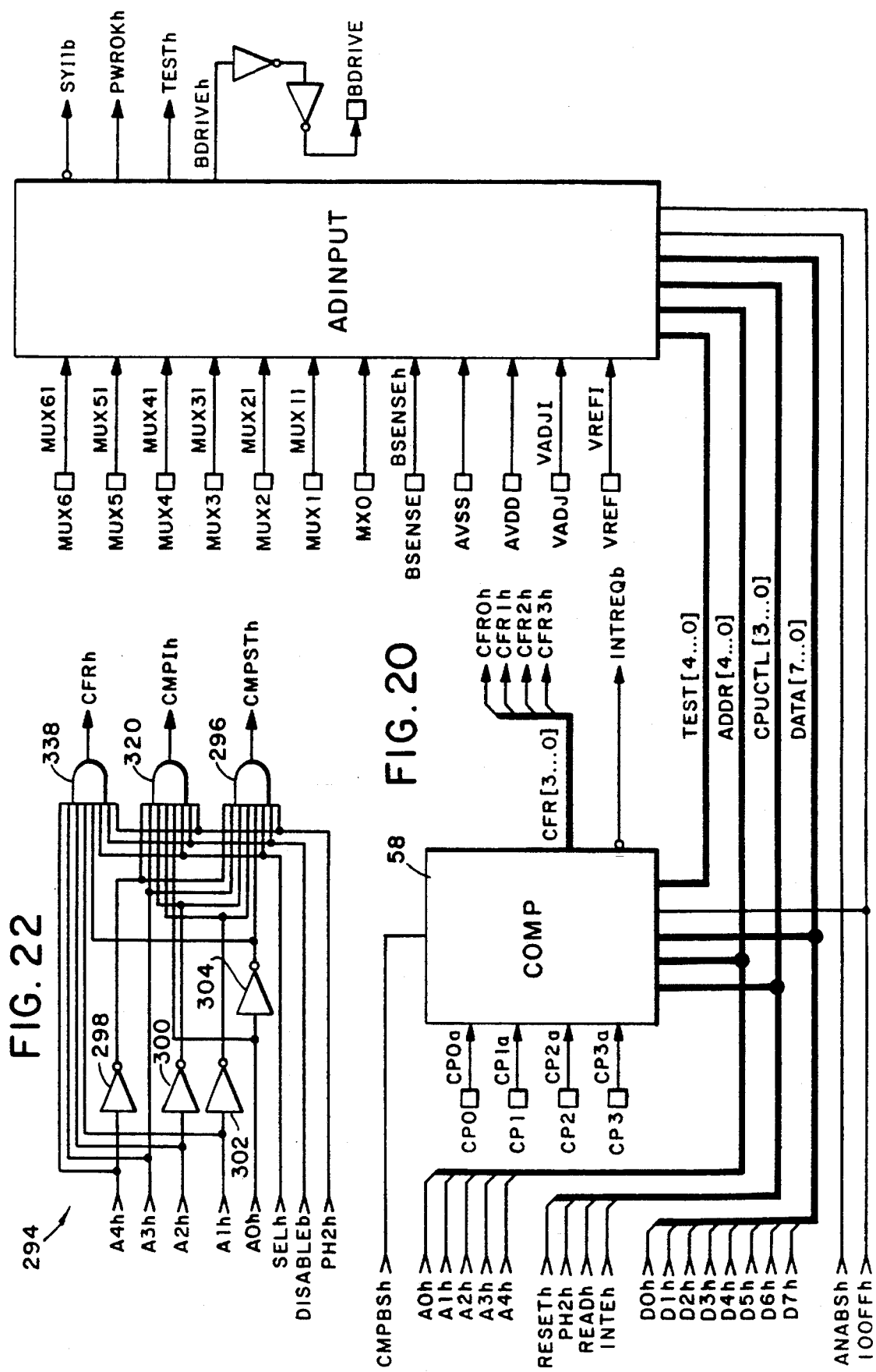
FIG. 20 is an overall block diagram of the comparator subsystem and A/D input subsystems of the IC in accordance with the present invention.

The programmable timer capabilities are provided by using the following twelve addressable 8-bit registers. Note that the names high and low represent the significance of the byte. The format of these registers is shown in FIG. 19.

The timer has one 16-bit output compare register. It consists of two 8-bit registers. The output compare register consists of TOCH and TOCL, with TOCH the most significant byte. This output compare register can be used for indicating when a period of time has elapsed. These registers are unique in that all bits are readable and writable and are not altered by the timer hardware. Reset does not affect the contents of these registers, and if the compare function(s) are not utilized, the two bytes of these registers can be used as storage locations.

The contents of the output compare register is compared with the contents of the free running counter every fourth rising edge of the microprocessor phase 2 clock. If a match is found, the output compare flag (OCF) bit is set. The value in the output compare register should be changed after each successful comparison in order to establish a new elapsed timeout. An interrupt can also accompany a successful output compare, provided the corresponding interrupt enable bit, OCIE, is set.

After a processor write cycle to the output compare register containing the most significant byte (TOCH), the corresponding output compare function is inhibited until the least significant byte is also written. The user must write both bytes if the most significant byte is written. A write made only to the least significant byte will not inhibit the compare function. The free running counter is updated every four internal phase 2 clock cycles due to the internal prescaler. The minimum time required to update the output compare register is a function of the software program rather than the internal hardware.

A processor write may be made to either byte of the output compare register without affecting the other byte.

Because neither the output compare flag (OCF) or output compare register is affected by reset, care must be exercised when initializing the output compare function with software. The following procedure is recommended:

1. Write to the high byte of the output compare register to inhibit further compares until the low byte is written.

2. Read the timer status register to clear the output compare flag if it is already set.

3. Write to the low byte of the output compare register to enable the output compare function with the output compare flag clear.

The objective of this procedure is to prevent the output compare flag from being set between the time it is read and the write to the output compare register. A software example is shown below.

| B7 | 16 STA | OCMPHI | INHIBIT OUTPUT COMPARE |
| B6 | 13 LDA | TSTAT | ARM OCF BIT IF SET |
| BF | 17 STX | OCMPLD | READY FOR NEXT COMPARE |

The two 8-bit registers (TICH, TICL) which make up the 16-bit input capture register, are read-only and are used to latch the value of the free running counter after a defined transition is sensed by the input capture edge detector. The level transition which triggers the counter transfer is defined by the input edge bit (IEDG). Reset does not affect the contents of the input capture registers.

The result obtained by an input capture will be one more than the value of the free running counter on the rising edge of the phase 2 processor clock preceding the external transition (FIG. 18). This delay is required for internal synchronization. Resolution is affected by the prescaler allowing the timer to only increment every four phase 2 clock cycles.

The free running counter contents are transferred to the input capture register on the proper signal transition regardless of whether the input capture flag (ICF) is set or clear. The input capture register always contains the free running counter value which corresponds to the most recent input capture.

After a read of the most significant byte (TICH) of the input capture register, counter transfer is inhibited until the least significant byte of the register is also read. This characteristic forces the minimum pulse period attainable to be determined by the time used in the capture software routine and its interaction with the main program. For example, a polling routine using instructions such as BRSET, BRA, LDA, STA, INCX, CMPX, and BEQ might take 34 internal phase 2 cycles to complete. The free running counter increments every four processor clock cycles due to the prescaler.

A read of the least significant byte (TICL) of the input capture register does not inhibit the free running counter transfer. Minimum pulse periods are ones which allow software to read the least significant byte and perform needed operations. There is no conflict between the read of the input capture register and the free running counter transfer since they occur on opposite edges of the internal processor clock.

TIMER CONTROL REGISTER

The timer control register (TCR) is a read-write register which contains four control bits. Three of these bits control interrupts associated with each of the three flag bits found in the timer status register. The other bit controls which edge is significant to the capture edge detector. The timer control register and the free running counter are the only sections of the time affected by reset. The timer control register bit assignment is defined in FIG. 19.

TCR[0]: Unused.

TCR[1]: Input Edge Polarity (IEDG). The value of the input edge (IEDG) bit determines which level transition on the PD7/TCAP pin will trigger a free running counter transfer to the input capture register. Reset does not affect the IEDG bit. A zero selects the falling edge.

TCR[2]: Unused.

TCR[4]: Unused.

TCR[5]: Timer Overflow Interrupt Enable (TOIE). If the timer overflow interrupt enable (TOIE) bit is set, a timer interrupt is enabled whenever the TOF status flag (in the timer status register) is set. If the TOIE bit is clear, the interrupt is inhibited. The TOIE bit is cleared by reset.

TCR[6]: Output Compare Interrupt Enable (OCIE). If the output compare interrupt enable (OCIE) bit is set, a timer interrupt is enabled whenever the OCF status flag is set. If the OCIE bit is clear, the interrupt is inhibited. This bit is cleared by reset.

TCR[7]: Input Capture Interrupt Enable (ICIE). If the input capture interrupt enable (ICIE) bit is set, a timer interrupt is enabled when the ICF status flag (in the timer status register) is set. If the ICIE bit is clear, the interrupt is inhibited. The ICIE bit is cleared by reset.

TIMER STATUS REGISTER

The timer status register (TSR) is a 3-bit register containing read-only status information. These four bits indicate the following:

A proper transition has taken place at the TCAP pin with an accompanying transfer of the free running counter contents to the input capture register.

A match has been found between the free running counter and one of the output compare registers.

The free running counter contains $FFFF (timer overflow).

The timer status register is illustrated in FIG. 19. The timing diagrams are shown in FIGS. 18(a)–18(d) illustrate the timing relationships to the timer status register bits.

TSR[4]: Unused.

TSR[5]: Timer Overflow Flag (TOF). The timer overflow flag (TOF) bit is set by a transition of the free running counter from $FFFF to $0000. It is cleared by accessing the timer status register (with TOF set) followed by an access of the free running counter least significant byte. Reset does not affect the TOF bit.

TSR[6]: Output Compare Flag (OCF). The output compare flag (OCF) is set when the output compare register matches the contents of the free running counter. The OCF is cleared by accessing the timer status register (with OCF set) and then writing the low byte of the output compare register. Reset does not affect the output compare flag.

TSR[7]: Input Capture Flag (ICF). The input capture flag (ICF) is set when the selected edge has been sensed by the input capture edge detector. It is cleared by a processor access of the timer status register (with ICF set) followed by accessing the low byte of the input capture register. Reset does not affect the input compare flag.

Accessing the timer status register satisfies the first condition required to clear any status bits which happen to be set during the access. The only remaining step is to provide an access of the register which is associated with the status bit. Typically, this presents no problem for the input capture and output compare function.

A problem can occur when using the timer overflow function and reading the free running counter at random times to measure an elapsed time. Without incorporating the proper precautions into software, the timer overflow flag could unintentionally be cleared if: 1) the timer status register is read or written when TOF is set; and 2) the least significant byte of the free running counter is read but not for the purpose of servicing the flag. The counter alternate register contains the same value as the free running counter; therefore, this alternate register can be read at any time without affecting the timer overflow flag in the timer status register.

During the WAIT instruction, the programmable timer continues to operate normally and may generate an interrupt to trigger the CPU out of the wait state. The STOP instruction has been disabled in the IC 10.

ANALOG SUBSYSTEM SCHEMATICS

The analog subsystem for the IC 10 is illustrated in FIGS. 20–48. FIGS. 20–35 illustrate the digital circuitry while FIGS. 36–48 illustrate the analog circuitry.

DIGITAL CONTROL LOGIC

1. QUADCOMPARATOR SUBSYSTEM LOGIC

Figure 21:
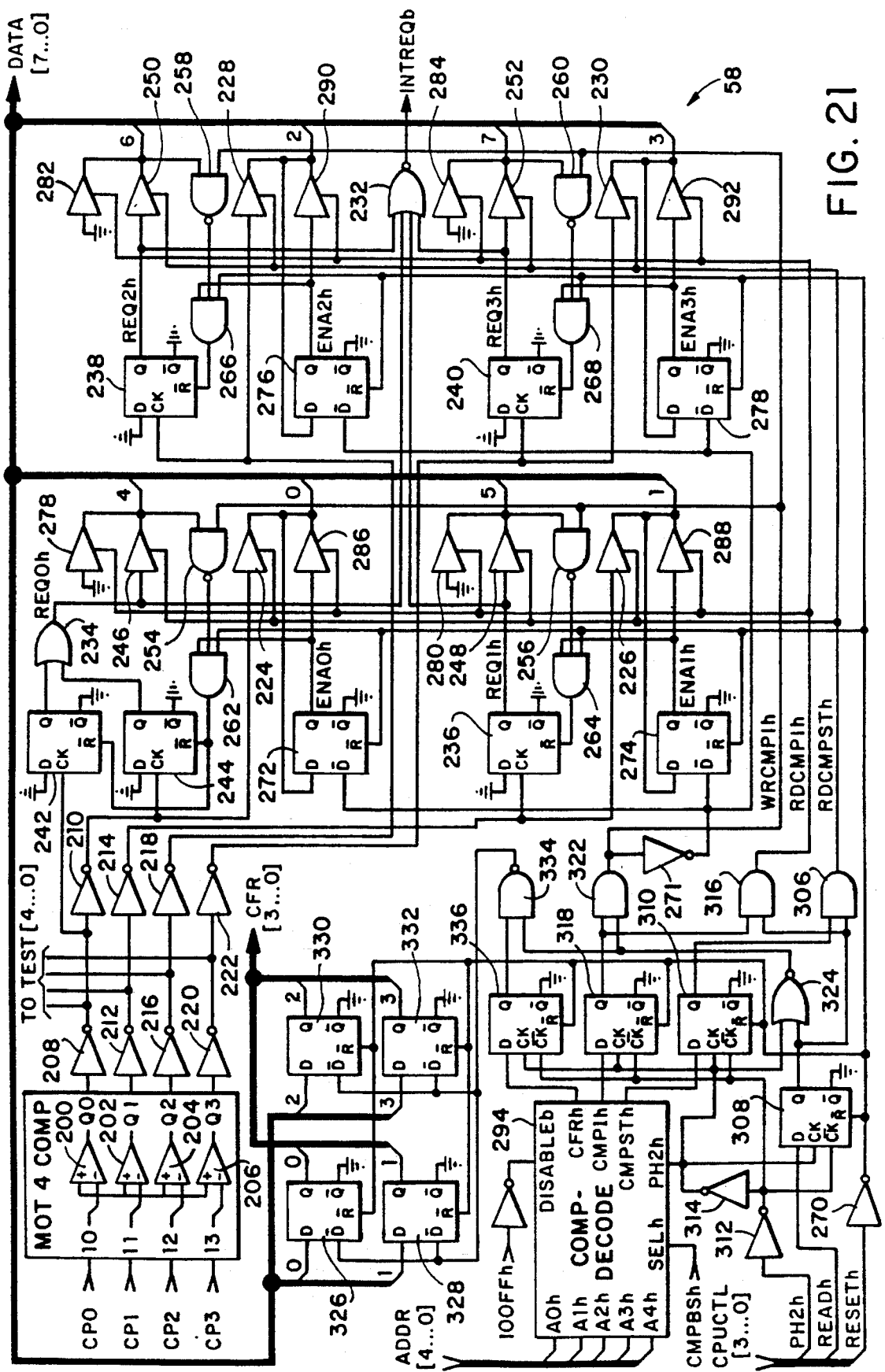
FIG. 21 is a schematic diagram of the quadcomparator subsystem in accordance with the present invention.
Figure 23:
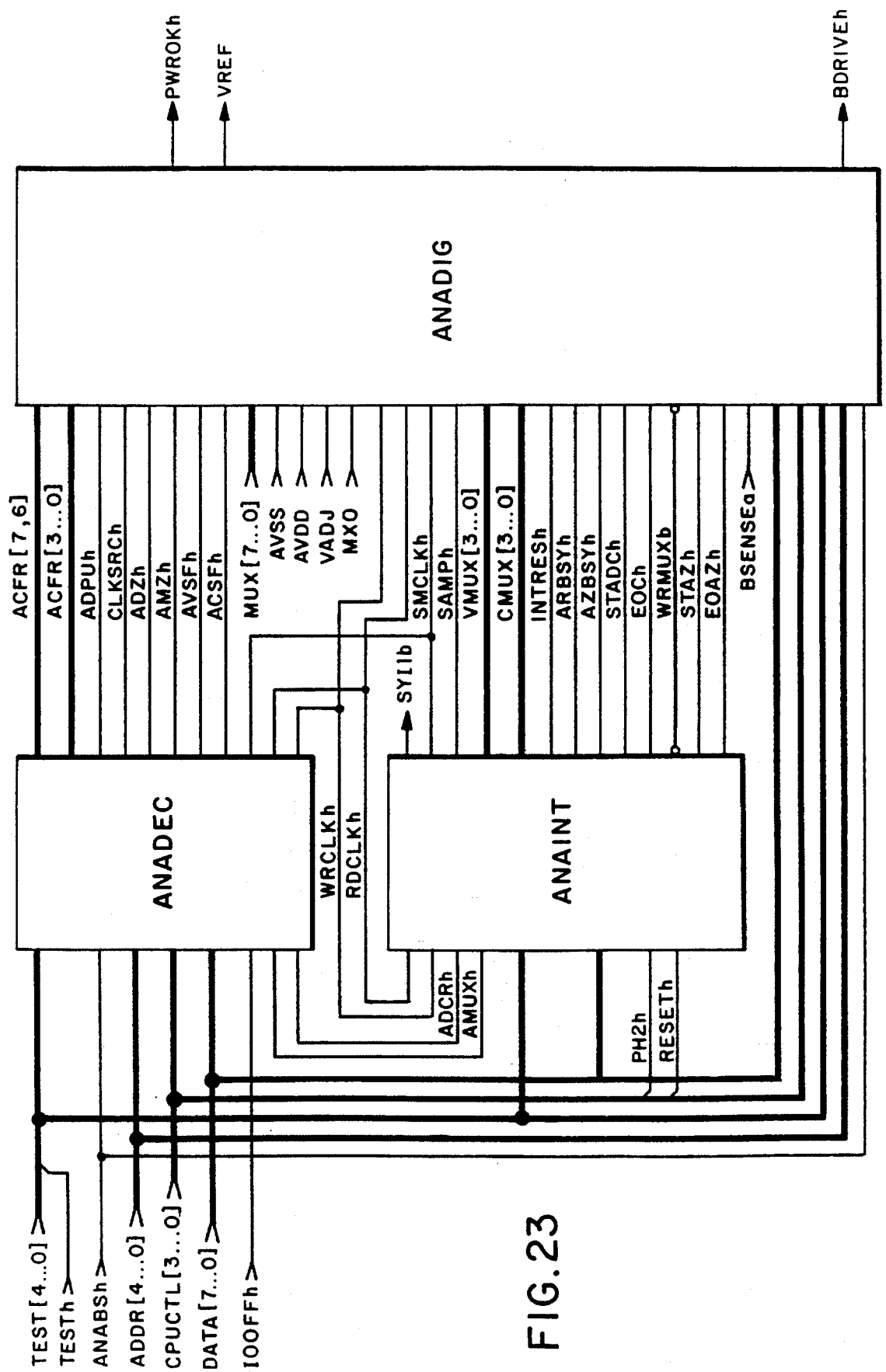
FIG. 23 is a block diagram of the analog subsystem in accordance with the present invention.

The quadcomparator subsystem 58 includes four individual comparators 200, 202, 204 and 206 (FIGS. 21 and 38). Each of these comparators 200, 202, 204 and 206 is referenced to a predetermined voltage, for example, +1.25 Vdc connected to a non-inverting input (FIG. 38). Input signals are applied to external pins CP0, CP1, CP2 and CP3 illustrated in FIG. 21.

The comparator subsystem 58 communicates with the microprocessor 30 through two registers CMPI and CMPST located in memory address space. An internal interrupt facility is provided to generate interrupts on selected edges of the comparator outputs $Q_0$, $Q_1$, $Q_2$ and $Q_3$. The comparator outputs $Q_0$, $Q_1$, $Q_2$ and $Q_3$ are read at the data bus DATA[3 . . . 0]. More specifically, each of the comparator outputs $Q_0$, $Q_1$, $Q_2$ and $Q_3$ is connected to a pair of serially coupled inverters 208 and 210; 212 and 214; 216 and 218; and 220 and 222, respectively, for high gain. The outputs of the inverters 210, 214, 218 and 222 are applied to tristate devices 224, 226, 228 and 230. The outputs of these tristate devices are connected to the data bus DATA[3 . . . 0] as CMPST[3 . . . 0]. These comparator outputs comprise the CMPST[3 . . . 0] status bits. Reading of these status bits is controlled by a read signal RDCMPSTh, which is active any time the microprocessor 30 addresses the CMPST register and initiates a read as discussed below.

The CMPI register is used for interrupt control. More specifically, CMPI [3 . . . 0] is used to enable interrupts while CMPI[7 . . . 4] is used to reset the interrupt request generated by the comparator subsystem 58. The interrupt request must be reset prior to clearing the I bit to prevent reprocessing the interrupt.

An interrupt request signal INTREQ is generated on selected edges of the comparator outputs $Q_0$, $Q_1$, $Q_2$ and $Q_3$. More specifically, the INTREQ signal is generated on rising and falling output states of the comparator 200 and on rising output states of the comparators 202, 204 and 206. This INTREQ signal is available at the output of a quad NOR gate 232. Comparator interrupt request signals REQ0h, REQ1h, REQ2h and REQ3h are applied to the inputs of the NOR gate 232. These interrupt request signals are available as outputs at an OR gate 234 for the comparator 200 and flip-flops 236, 238 and 240 for the comparators 202, 204 and 206, respectively. More specifically, the interrupt request signal REQ0h for the comparator 200 is generated at the output of the dual input OR gate 234. The inputs to the OR gate 234 are from flip-flops 242 and 244. The output $Q_0$ of the comparator 200 is applied to the clock input CK of the flip-flop 244 by way of the high gain inverters 208 and 210. The complement of this signal, available at the output of the inverter 208 is applied to the clock input CK of the flip-flop 242. The Q outputs of the flip-flops 242 and 244 are applied to the OR gate 234 to generate the REQ0h signal on rising and falling output states of the comparator 200. The $Q_1$, $Q_2$ and $Q_3$ outputs of the comparators 202, 204 and 206 are applied to clock inputs CK of the flip-flops 236, 238 and 240 to generate the REQ1h, REQ2h and REQ3h signals. These REQ0h, REQ1h, REQ2h and REQ3h signals may be read as status bits CMPST[7 . . . 4] by the microprocessor 30 on the data bus DATA[7 . . . 4]. More specifically, the REQ0h, REQ1h, REQ2h and REQ3h signals are applied to tristate devices 246, 248, 250 and 252. The outputs of these tristate devices 246, 248, 250 and 252 are connected to the data bus DATA[7 . . . 4]. The tristate devices 246, 248, 250 and 252 are under the control of the RDCMPSTh signal.

Four command bits CMPI[7 . . . 4] are used to reset the interrupt request. These command bits CMPI[7 . . . 4] are used to reset the flip-flops 236, 238, 240, 242 and 244, which generate the REQ0h, REQ1h, REQ2h and REQ3h signals. These command bits CMPI[7 . . . 4] may be written by way of the data bus DATA[7 . . . 4] and are applied to dual input NAND gates 254, 256, 258 and 260 along with a WRCMPIh signal. These NAND gates will only be enabled when the microprocessor 30 addresses the CMPI register and initiates a write. The outputs of the NAND gates 254, 256, 258 and 260 are applied to tri-input AND gates 262, 264, 266 and 268. The outputs of these AND gates are applied to the reset inputs $\overline{R}$ of the flip-flops 236, 238, 240, 242 and 244. The other two inputs to the AND gates 262, 264, 266 and 268 are the reset signal RESETb from the microprocessor 30, available at the output of an inverter 270 and interrupt enable signals ENA0h, ENA1h, ENA2h and ENA3h, available at Q outputs of flip-flops 272, 274, 276 and 278. The ENA0h, ENA1h, ENA2h and ENA3h signals allow the interrupt request to be cleared once acknowledged. The RESETb signal allows the microprocessor 30 to reset these flip-flops. In order to prevent reprocessing of the interrupt, a WRCMPIb signal, available at an output of an inverter 271, is applied to the $\overline{D}$ inputs of the interrupt enable flip-flops 272, 274, 276 and 278. These flip-flops are thus reset after the write signal WRCMPIh becomes inactive.

The command bits CMPI[7 . . . 4] are always read as zero on the data bus DATA[7 . . . 4]. More specifically, these command bits are read at the output of the tristate devices 278, 280, 282 and 284. The input to these tristate devices is connected to digital ground. The tristate devices 278, 280, 282 and 284 are under the control of a RDCMPIh signal which indicates that the microprocessor 30 has addressed the CMPI register and initiated a read.

Four status bits CMPI[3 . . . 0] are used to read comparator interrupt enable signals ENA0h, ENA1h, ENA2h and ENA3h. These signals ENA0h, ENA1h, ENA2h and ENA3h are available at the Q outputs of the flip-flops 272, 274, 276 and 278. These outputs are connected to tristate devices 286, 288, 290 and 292. The outputs of these tristate devices are connected to the data bus DATA[3 . . . 0]. The tristate devices 286, 288, 290 and 292 are under the control of a RDCMPIh signal which indicates that the microprocessor 30 has addressed the CMPI register and has initiated a read.

The RDCMPSTh, RDCMPIh and WRCMPIh signals are generated by a comparator decode system 294. The comparator decode subsystem 294 decodes addresses applied to the internal address bus ADDR[4:0] to allow the registers CMPST and CMPI to be written to and read. More specifically, as illustrated in Table 6 the CMPST register is located at address location $0008. Thus, when the address $0008 is placed on the internal address bus ADDR[4 . . . 0] an AND gate 296 (FIG. 22) is enabled. More specifically, the AND gate 296 is an eight input AND gate. The address inputs ADDR[4,2,1,0], identified as A4h, A2h, A1h and A0h, are applied through inverters 298, 300, 302 and 304. The address bit ADDR[3], identified as A3h, is applied directly to an input of the AND gate 296. Also applied to the AND gate 296 are signals SELh, DISABLEb and PH2h from the microprocessor 30.

The hexadecimal address $0008 corresponds to binary bits 01000. When the address 01000 is applied to the address inputs of A4h, A3h, A2h, A1h and A0h, the output of the AND gate 296 will be a logical one indicating that the CMPST register is being addressed by the microprocessor 30. More specifically, the RDCMPSTh signal is available at an output of a dual input AND gate 306 (FIG. 21). The inputs to the AND gate 306 are Q outputs of flip-flops 308 and 310. The CMPSTh signal, available at the output of the AND gate 296, is applied to a D input of the flip-flop 310. Timing for this flip-flop is provided by the microprocessor's phase 2 clock signal PH2h. More specifically, a PH2h signal is applied to a clock input CK of the flip-flop 310 by way of a pair of serially connected inverters 312 and 314. An inverted phase 2 clock signal, available at the output of the inverter 312 is applied to the CK input of the flip-flop 310. A READh signal, available from the microprocessor internal control bus CPUCTL[3 . . . 0], is applied to a D input of a flip-flop 308. The READh signal indicates that the microprocessor 30 is requesting a read operation. Timing signals are applied to the clock CK and CK inputs of the flip-flop 308 in the same manner as the flip-flop 310. Thus, whenever the microprocessor 30 addresses $0008, the signal RDCMPST is generated at the output of the AND gate 306, which indicates that the microprocessor 30 is reading the CMPST register.

An RDCMPIh signal is available at the output of a dual input AND gate 316. The output of the flip-flop 308 is applied to one input of the AND gate 316 which indicates that the microprocessor 30 has initiated a read. The other input to the AND gate 316 is a Q output of a flip-flop 318. A CMPIh decode signal is applied to a D input of the flip-flop 318. Timing control for the flip-flop 318 is identical to the flip-flops 308 and 310. The CMPIh signal is available at an output of an AND gate 320 (FIG. 22). The circuitry including the AND gate 320 and the inverters 298, 300, 302 and 304 generates the CMPIh signal whenever the microprocessor 30 addresses $0009.

The WRCMPIh signal is available at an output of a dual input AND gate 322 (FIG. 21). One input to the AND gate 322 is the output of the flip-flop 318, which indicates that the CMPI register was addressed. The other input to the AND gate 322 is from a NOR gate 324. The NOR gate 324 is used to develop a microprocessor write signal. Specifically, the output of the flip-flop 308 is applied to one input of the NOR gate 324. The output signal from the NOR gate 324 will be low during write operations. The other input is from the phase 2 clock, available at the output of the inverter 278.

Four configuration bits CFR[3 . . . 0] from the configuration register CFR are used for comparator mode control. These configuration bits CFR[3 . . . 0] allow the outputs of the comparators 200, 202, 204, 206 to be ORed with port C. A zero enables the OR operation while a one disables it. More specifically, the CFR register is a write only register and includes the flip-flops 326, 328, 330 and 332. The D inputs of these flip-flops are connected to the data bus DATA[3 . . . 0]. The Q outputs of these flip-flops are tied to an internal bus CFR[3 . . . 0] which allows the OR operation. These flip-flops 326, 328, 330 and 332 are under the control of a dual input NAND gate 334, connected to the $\overline{D}$ input, which enables the write operation. One input to the NAND gate 334 is from the output of the NOR gate 324 which indicates a write operation. The other input is from a flip-flop 336. A CFRh signal, which indicates that the microprocessor 30 addressed the CFR register is applied to the D input of the flip-flop 336.

The CFRh signal is a decode signal and is available at the output of an AND gate 338 (FIG. 22). The AND gate 338 and the inverter 298 decode the address bus ADDR[4 . . . 0] to enable the AND gate 338 and generate the CFRh signal any time the microprocessor 30 addresses $001E.

The microprocessor 30 is adapted to reset the comparator subsystem 58. More specifically, a reset signal RESETb from the computer control bus CPUCTL[3 . . . 0] by way of the inverter 270 is applied to the AND gates 262, 264, 266 and 268 to reset the flip-flops 236, 238, 240, 242 and 244. The RESETb signal is also applied to the flip-flops 272, 274, 276, 278, 308, 310, 318, 326, 328, 330, 332 and 336 to allow the microprocessor 30 to reset the comparator subsystem 58.

2. PROCESSOR BUS INTERFACE LOGIC

Figure 24:
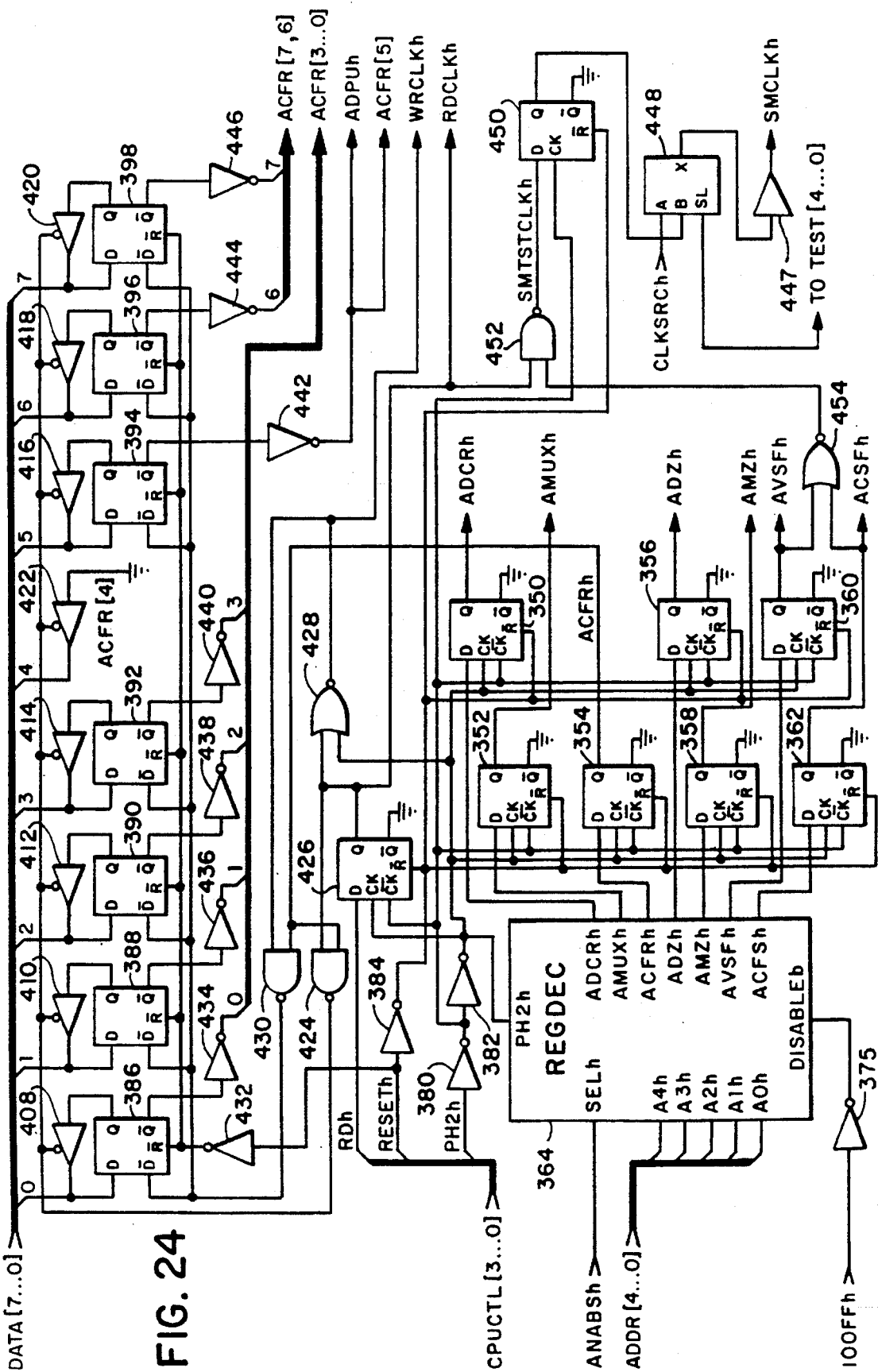
FIG. 24 is a schematic diagram of the microprocessor bus interface logic in accordance with the present invention.
Figure 25:
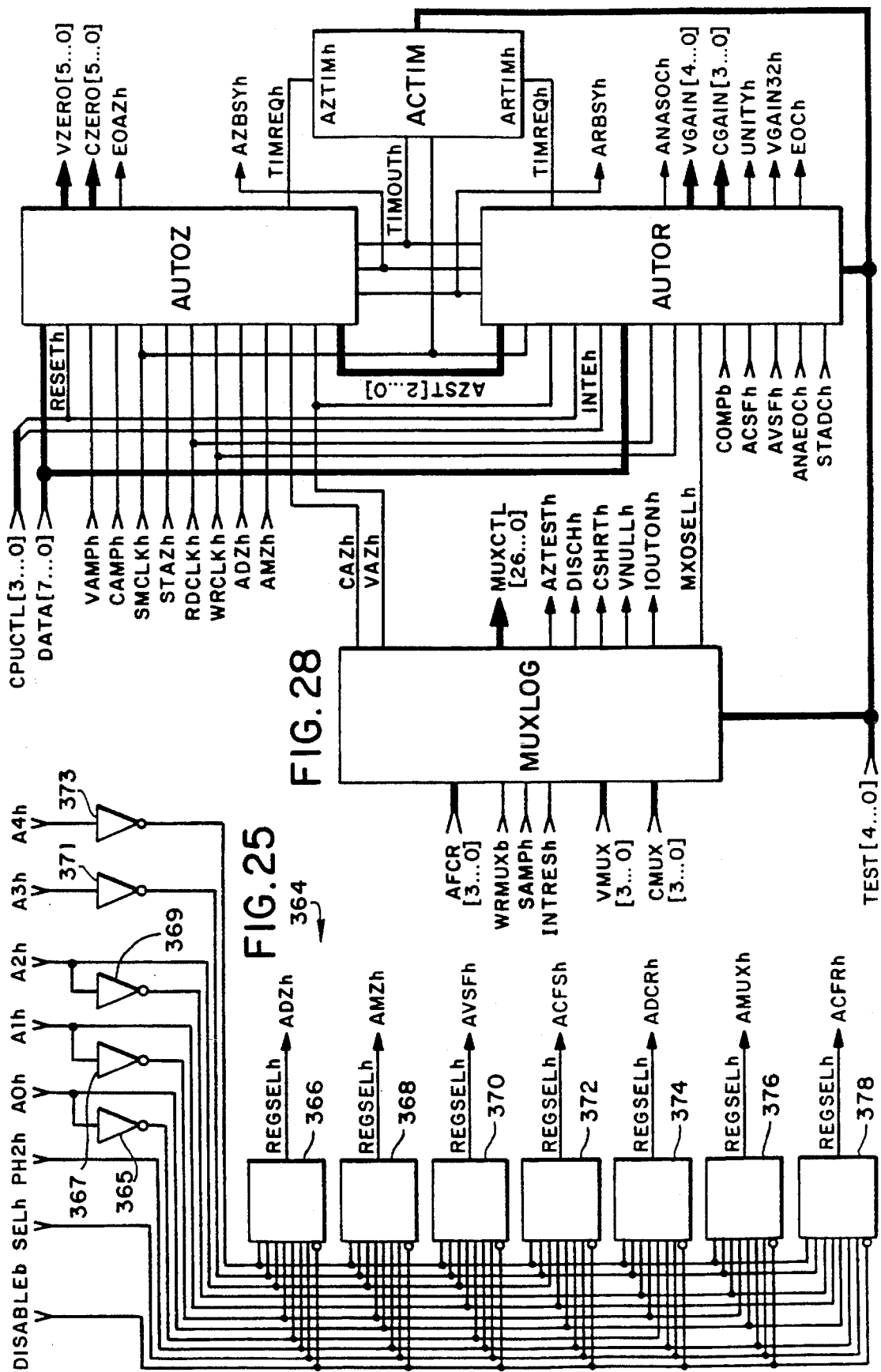
FIG. 25 is a schematic diagram of the address decode logic for the interface registers in accordance with the present invention.
Figure 27:
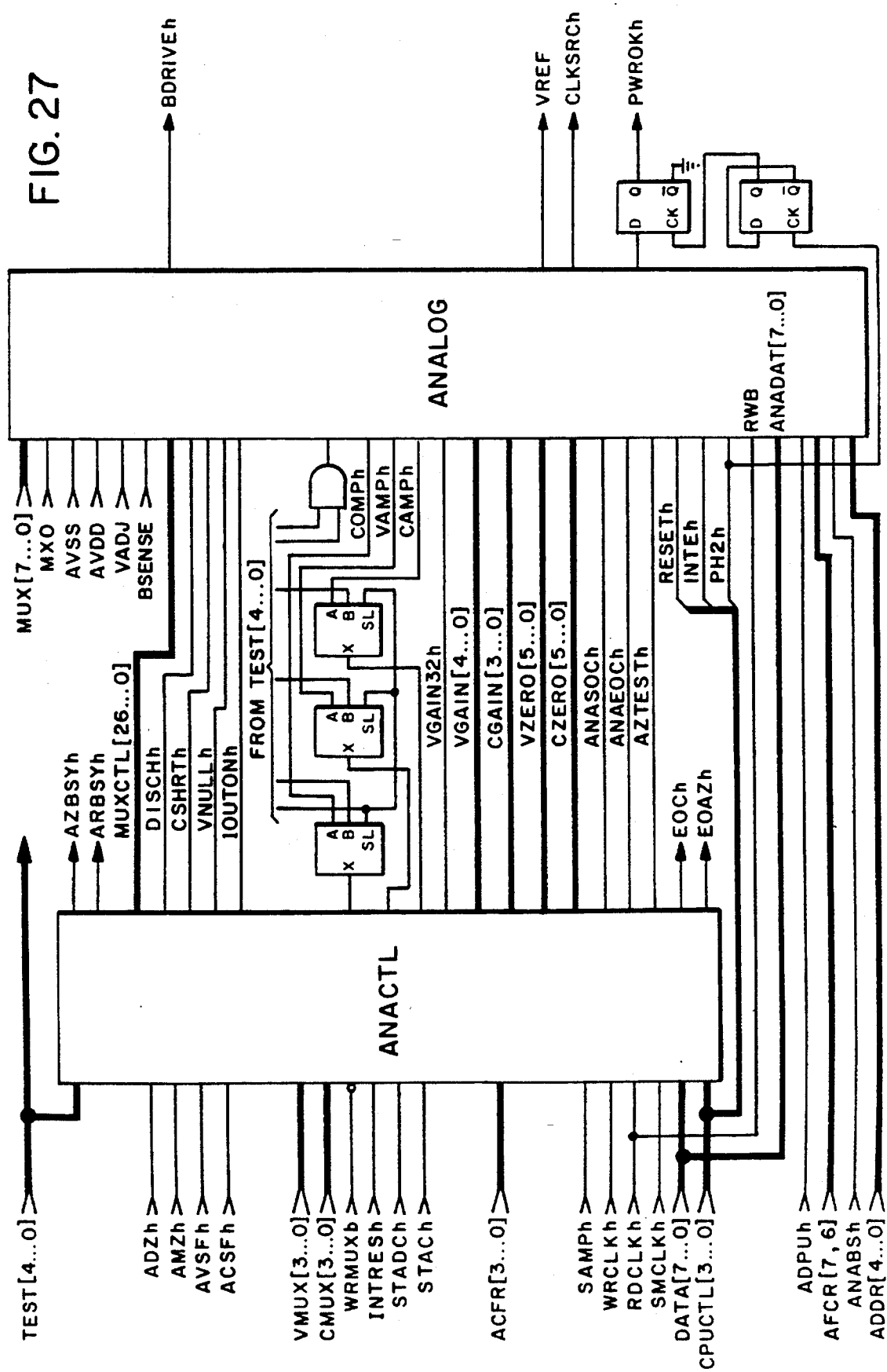
FIG. 27 is a block diagram of the analog digital control logic portions of the IC in accordance with the present invention.

The microprocessor 30 communicates with the analog control system by way of, for example, seven registers ADCR, AMUX, ACFR, ADZ, AMZ, AVSF and ACFR located in memory address space as identified in Table 6. The format of the registers is illustrated in FIG. 9. These registers are selected by register select flip-flops 350, 352, 354, 356, 358, 360 and 362, illustrated in FIG. 24. These registers are all read-write registers and are decoded by a register decode subsystem 364 illustrated in FIG. 25. These registers may be decoded in various manners, for example, seven programmable logic arrays (PLA) 366, 368, 370, 372, 374, 376 and 378 may be provided. Each of these PLA's includes address inputs ADDR[4 . . . 0] applied either directly or by way of inverters 365, 367, 369, 371 and 373 as shown in FIG. 25 and three control signals SELh, DISABLE and PH2h. The SELh signal corresponds to the microprocessor's ANABSh signal. The ANABSh signal is a register select signal from the microprocessor master chip address decoder which enables address decoding on a block basis. The DISABLEb signal corresponds to the microprocessor's IOOFF signal, used to disable all I/O devices during a test mode. The IOOFF signal is available at the output of a buffer 375 (FIG. 24). The PH2 signal is the microprocessor's phase 2 clock.

The outputs of the PLA's 366, 368, 370, 372, 374, 376 and 378 represent register select signals ADZh, AMZh, AVSFh, ACSFh, ADCRh, AMUXh and ACFRh indicating that a particular register has been addressed by the microprocessor 30. For example if the address $0020 is placed on the address bus ADDR[4 . . . 0], the register ADCR will be selected. Similarly, when the addresses of the other registers are placed on the address bus ADDR[4 . . . 0] in accordance with Table 9, those registers will be selected.

The output signals from the PLA's 366, 368, 370, 372, 374, 376 and 378 are applied to D inputs of the register select flip-flops 350, 352, 354, 356, 358, 360 and 362. Timing for these register select flip-flops is provided by the phase 2 clock signal PH2h, applied to the clock inputs CK of these flip-flops 350, 352, 354, 356, 358, 360 and 362 through a pair of inverters 380 and 382 and an inverted phase 2 clock signal, available at the output of the inverter 380, applied to the $\overline{CK}$ inputs of these flip-flops. A reset signal RESETh from the microprocessor control bus CPUCTL[3 . . . 0] is applied to the reset inputs $\overline{R}$ of the flip-flops 350, 352, 354, 356, 358, 360 and 362 by way of an inverter 384 to set these flip-flops to zero on reset. The output of the register select flip-flops 350, 352, 354, 356, 358, 360 and 362 are the register select signals ADCRh, AMUXh, ACFRh, ADZh, AMZh, AVSFh and ACSFh.

ACFR REGISTER

The ACFR register is a read-write register utilized by the A/D subsystem 78. This register includes the flip-flops identified by the reference numerals 386, 388, 390, 392, 394, 396 and 398 (FIG. 24).

The ACFR register can be read or written to by the microprocessor 30. More specifically, the D inputs of the flip-flops 386, 388, 390, 392, 394, 396 and 398 are tied respectively to the data bus DATA[7 . . . O] to allow the microprocessor 30 to write to this register. The output Q of these flip-flops are also tied to the data bus DATA[7 . . . 0] by way of the tristate devices 408, 410, 412, 414, 416, 418, 420 and 422 to allow this register to be read.

During read operations the tristate devices 408, 410, 412, 414, 416, 418, 420 and 422 are under the control of a read control NAND gate 424 and a read-write control flip-flop 426 to allow the Q outputs of these flip-flops to be tied to the data bus DATA[7 . . . 0] and read by the microprocessor 30. The tristate device 422 for the ACFR[4] bit has its input tied to ground. Thus, this bit will always read zero.

A read signal is developed by the NAND gate 424. The NAND gate 424 is a two input NAND gate and is under the control of the read-write control flip-flop 426 and the ACFR select flip-flop 354. A read signal READh from internal control bus CPUCTL[3 . . . 0] is applied to a D input of the read-write control flip-flop 426. Timing for this flip-flop is a phase 2 clock signal PH2h, applied to a clock input CK and an inverted phase 2 clock signal from the output of the inverter 380, applied to the $\overline{CK}$ input of a flip-flop 426. The Q output of the flip-flop 426 is a read clock signal PDCLKh, which is applied to the NAND gate 424. Thus, any time the microprocessor 30 addresses the ACFR register (e.g., $0023) and places a read signal READh on the computer control bus CPUCTL[3 . . . 0], the flip-flops 386, 388, 390, 392, 394, 396 and 398 as well as the ACFR[4] bit will be read.

During write operations the tristate devices 408, 410, 412, 414, 416, 418 and 420 are normally in a high impedance state. A write control signal is applied to the $\overline{D}$ inputs of these flip-flops. The write control signal is under the control of a write control NOR gate 428 and a NAND gate 430. The NOR gate 428 is a two input NOR gate with a one input from the phase 2 clock PH2h and one input from the read-write control flip-flop 426. The output of the NOR gate 428 is a write signal WRCLKh. The write signal WRCLKh is applied to one input of the dual input NAND gate 430. The other input to the NAND gate 430 is the ACFR register select signal ACFRh. The output of the NAND gate 430 is then applied $\overline{D}$ inputs of the ACFR flip-flops 386, 388, 390, 392, 394, 396 and 398. The data bus DATA[7 . . . 5] and DATA[3 . . . 0] are applied to the D inputs of these flip-flops to allow the microprocessor 30 to write to them. The bit ACFR[4] is tied to digital ground.

The ACFR register may be reset by the microprocessor 30. More specifically, a reset signal RESETh from the control bus CPUCTL[3 . . . 0] is applied to the reset inputs R of the flip-flops 386, 388, 390, 392, 394, 396 and 398 through an inverter 432.

As heretofore discussed, the ACFR register is a configuration register used to configure the A/D subsystem 78. Thus the a outputs of the flip-flops 386, 388, 390, 392, 394, 396 and 398 are connected to inverters 434, 436, 438, 440, 442, 444 and 446. The outputs of the inverters 434, 436, 438 and 440 are tied to an internal bus ACFR[3 . . . 0]. The outputs of the inverters 444 and 446 are tied to an internal bus ACFR[7,6]. The output of the inverter 442 is applied to an internal bus ACFR[5] and also is used as a signal ADPUh.

The RDCLKh signal, available at the output of the read write control flip-flop 426, is used to develop a state machine clock signal SMCLKh for use in auto-zero and auto-range state machines to be discussed below. The SMCLKh signal is available at the output of a buffer 447. The input to the buffer is a MUX 448. The MUX 448 allows for inputs from an external clock source signal CLKSRCh under the control of test circuitry applied to its select input SL. During normal operation, the SMCLK signal is developed by a flip-flop 450. Timing for the flip-flop 450 is an inverted phase 2 clock signal, available at the output of the inverter 380. This flip-flop 450 may be reset by the microprocessor 30. An output from a NAND gate 452 is applied to a D input of the flip-flop 450. The NAND gate 452 is a dual input NAND gate. One input to the NAND gate 452 is the RDCLKh signal. The other input to the NAND gate 452 is an output of an OR gate 454. The inputs to the OR gate 454 are the ACSFh and AVSFh signals which indicate that the AVSF or ACSF registers have been addressed by the microprocessor 30 to allow the SMCLK signal to be generated when autozero and autoranging operations are initiated.

ADCR REGISTER

Figure 26:
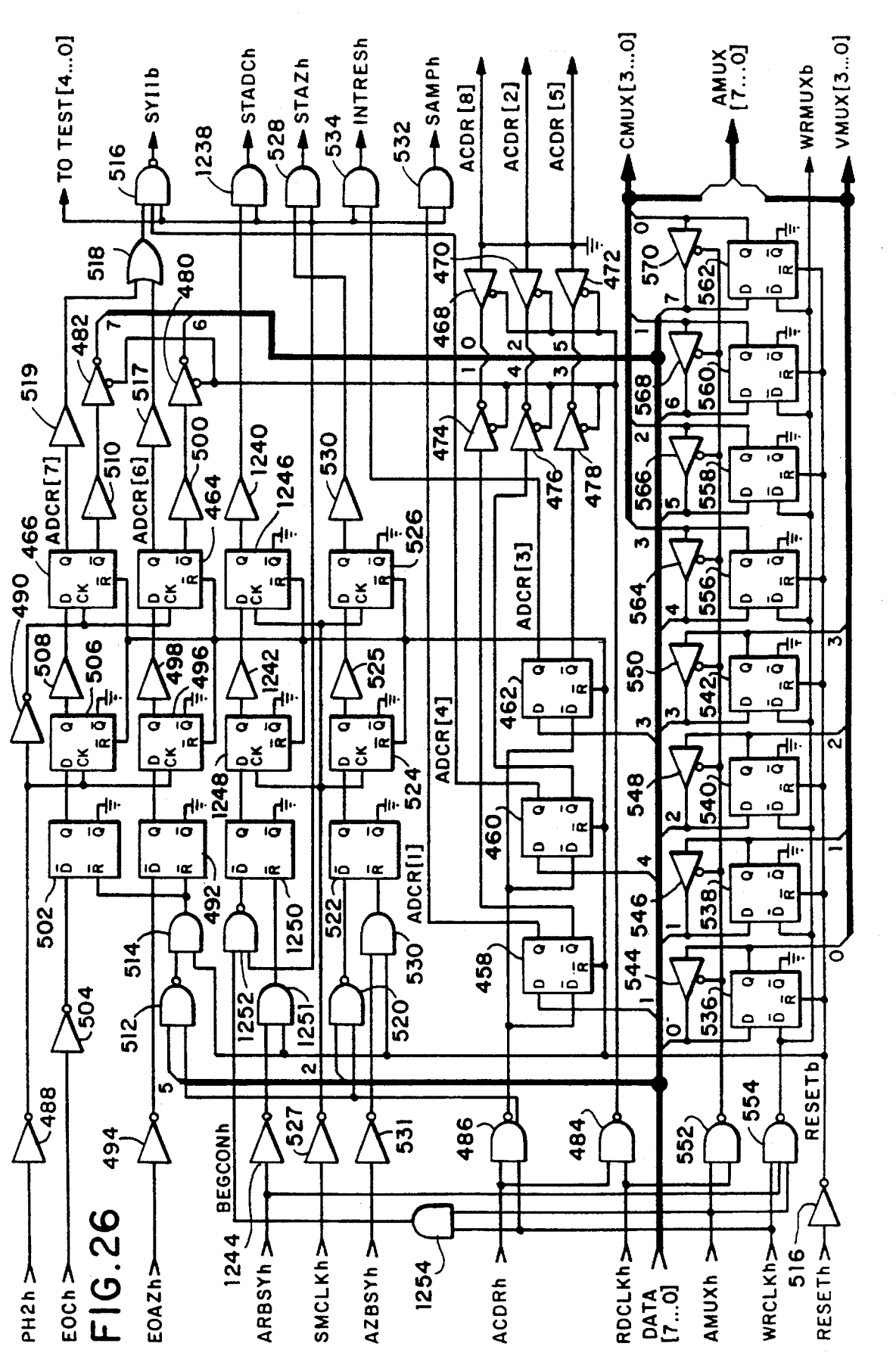

The ADCR register is used to control the operation of the A/D subsystem 78. This register is a byte wide read-write register. This register includes the flip-flops 458, 460, 462, 464 and 466 (FIG. 26). Three bits ADCR[5], ADCR[2] and ADCR[0] are tied to ground and will always read zero. More specifically, the bit ADCR[0] is tied to ground and to the input of a tristate device 468. The output of the tristate device 468 is tied to the data bus DATA[O]. The bit ADCR[2] is also tied to ground and to a tristate device 470. The output of the tristate device 470 is tied to the data bus DATA[2]. Similarly, the bit ADCR[5] is also tied to ground and to a tristate device 472. The output of the tristate device 472 is connected to the data bus DATA[5].

The balance of the bits may also be read by the microprocessor 30. More specifically, the Q outputs of the flip-flops 458, 460, 462, 464 and 466 are coupled to tristate devices 474, 476, 478, 480 and 482. The outputs of these tristate devices are applied to the data bus DATA[1,3,4,6,7].

The tristate devices 468, 470, 472, 474, 476, 478, 480 and 482 for all the bits ADCR[7 . . . 0] are under the control of the read control NAND gate 484. Normally these tristate devices are in a high impedance state. However, during a read operation the NAND gate 484 enables these tristate devices to connect the ADCR[7 . . . 0] bits the data bus DATA[7 . . . 0]. The NAND gate 484 is a two input NAND gate. A ADCRh signal is applied to one input. This signal is a decode signal for the ADCR register. More specifically, the ADCR register is located at memory address $0020. Thus, any time this address is written by the microprocessor 30 the ADCRh signal will be active. The other input to the NAND gate 484 is the RDCLKh signal discussed above. Thus, any time the microprocessor 30 addresses the ADCR register and initiates a read, the NAND gate 484 will be enabled.

The bits ADCR[1], ADCR[3] and ADCR[4] are control bits which may be written by the microprocessor 30. More specifically, the D inputs of the flip-flops 458, 460 and 462 are connected to the data bus DATA[1, 3, 4]. The D inputs of these flip-flops are connected to an output of a dual input NAND gate 486. The ADCRh signal is applied to one input of the NAND gate 486 which indicates that the ADCR registers have been addressed by the microprocessor 30. A WRCLKh signal is applied to the other input. Thus, the NAND gate 486 will be enabled any time the microprocessor 30 addresses the ADCR register and initiates a write operation.

The bits ADCR[7] and ADCR[6] are read only status bits generated by the flip-flops 464 and 466. These bits indicate that the auto-zero sequence is complete and the A/D conversion is complete. These flip-flops 464 and 466 are clocked by the phase 2 clock signal PH2h by way of two inverters 488 and 490. Status signals EOCh and EOAZh, representative of the status of the A/D subsystem 78 and the auto-zero operation, are applied to the D inputs of these flip-flops 464 and 466 by way of control circuitry discussed below. More specifically, an end of auto-zero signal EOAZh, which indicates that the auto-zero process has finished is applied to an S input of a flip-flop 492 by way of an inverter 494. The Q output of the flip-flop 492 is applied to a D input of a flip-flop 496. The Q output of the flip-flop 496 is applied to the D input of the flip-flop 464 by way of a buffer amplifier 498. The Q output of the flip-flop 464 is applied to the data bus DATA[6] by way of the tristate device 480 and a buffer amplifier 500 to generate an end of auto-zero flag.

An EOCh signal is applied to the flip-flop 466, by way of an inverter 504 and control circuitry discussed below. The EOCh signal indicates the end of the A/D conversion process. The output of the inverter 504 is applied to an S input of a flip-flop 502. A Q output of the flip-flop 502 is applied to a D input of a flip-flop 506. The Q output of the delay flip-flop 506 is applied to the D input of the flip-flop 466 by way of a buffer amplifier 508. The output of the buffer 508 is applied to the D input of the flip-flop 466. The Q output of the flip-flop 466 is applied to the data bus DATA[7] by way of the tristate device 482 and a buffer amplifier 510 to generate an A/D conversion complete flag.

Timing for the flip-flops 496 and 506 is an inverted phase 2 clock signal available at the output of the inverter 488. The flip-flops 496 and 506 as well as the flip-flops 464 and 466 may be reset by the microprocessor 30 by way of a RESETb signal available at the output of an inverter 516.

ACFR[5] is a command bit which resets the auto-zero complete and A/D conversion complete flags and resets the bits ACFR[6] and ACFR[7] to remove an A/D interrupt request SYI1b signal from the microprocessor 30. The command bit ACFR[5] is available on the data bus DATA[5] and is applied to one input of a dual input NAND gate 512. The other input to the NAND gate 512 is a non-inverting output of the NAND gate 486 which enables write operations to the ADCR register. The output of the NAND gate 512 is applied to one input of a dual input AND gate 514. The other input to the AND gate 514 is the microprocessor reset signal RESETb available at the output of the inverter 516. The output of the AND gate 514 is applied to the reset inputs R of the flip-flops 492 and 502 to reset the complete flag and remove the A/D interrupt SY1B.

The A/D interrupt signal SYI1b is generated at an output of a three input NAND gate 516 at the completion of the autozero sequence and the A/D conversion when the A/D interrupt ADCR[4] is enabled. One input to the NAND gate 516 is an output of a two input OR gate 518. The inputs to the OR gate 518 are status bits ADCR[6] and ADCR[7], available at outputs of buffers 517 and 519, which are connected to the Q outputs of the flip-flops 464 and 466. These bits ADCR[7,6] indicate that the auto-zero operation is complete and the A/D conversion is complete, respectively. Another input to NAND gate 516 is the ADCR[4] bit, which indicates an interrupt enable. The third input is from the test circuitry, normally used only during testing.

The ADCR[2] is a command bit which may be written by the microprocessor 30 and is used to initiate an A/D sequence. This bit is available on the data bus DATA[2] and is applied to dual input NAND gate 520. The other input to the NAND gate 520 is from the ADCR register write control NAND gate 486. The output of the NAND gate 520 to an S input of a flip-flop 522. A Q output of the flip-flop 522 is applied to a D input of a flip-flop 524. The output of the flip-flop 524 is applied to a D input of another flip-flop 526 by way of a buffer 525. A Q output of the flip-flop 526 is used to generate the start auto-zero signal STAZh. More specifically, the Q output of the flip-flop 526 is applied to one input of a dual input AND gate 528 by way of a buffer 530. The other input to the AND gate 528 is from test circuitry. The output of the AND gate 528 is the STAZh signal.

The STAZh signal is cleared when the auto-zero state machine is busy (AZBSYh). More specifically, a AZBSYh signal is applied to one input of a two input AND gate 530 by way of an inverter 531. A RESETb signal from the microprocessor 30 is applied to the other input. The output of the AND gate 530 is applied to an e input of the flip-flop 522 to reset this flip-flop. Timing for the flip-flops 524 and 526 is provided by the SMCLKh signal available at an output of an inverter 527. The flip-flops 524 and 526 are reset by the microprocessor 30 by way of the RESETb signal applied to their reset inputs R.

The ADCR[1] bit is used to control the three sample and hold switches 108, 110 and 112. Specifically the D output of the flip-flop 458 is applied to one input of a AND gate 532. The other input to the AND gate 532 is from the test circuit. The output of the AND gate 532 is a signal SAMPh which controls the sample and hold switches 108, 110 and 112.

The ADCR[3] bit available at the Q output of the flip-flop 462. This bit ACDR[3] is used to control the integrator reset. More specifically, the output of the flip-flop 462 is applied to a two input AND gate 534. The other input to the AND gate 534 is from the test circuit. The output of the AND gate 534 is an integrator reset signal INTRESh. This signal is applied to a buffer 757 (FIG. 30) to generate a DISCHh signal and applied to the switch 96 (FIG. 45). When the DISCHh signal is high, the switch 96 (FIG. 3) disconnects and MXO pin from the current mirror 92 and shorts the MXO pin to analog ground AVSS. The switch 96 remains shorted as long as this bit remains set. The shorting switch 96 may be open by writing a zero to ADCR[3]. This signal is also representative of the present state of the switch 96.

INPUT MULTIPLEXER CONTROLS

An 8 bit read-write register AMUX[7 . . . 0] is used to control the voltage and current input MUXes 62 and 64. This register is divided into 2 four bit fields, one field controls the voltage inputs and generates a signal VMUX[3 . . . 0] and the other controls the current inputs and generates a signal CMUX[3 . . . 0].

The VMUX[3 . . . 0] signal is developed by the flip-flops 536, 538, 540 and 542 (FIG. 26). The D inputs of these flip-flops are tied to the data bus DATA[3 . . . 0] to allow the microprocessor 30 to write to them. The output of these flip-flops are tied to the data bus DATA[3 . . . 0] by way of tristate devices 544, 546, 548 and 550 to allow the contents of these flip-flops to be read by the microprocessor 30. The tristate devices 544, 546, 548 and 550 are normally in a high impedance state and are under the control of a NAND gate 552. The NAND gate 522 is a two input NAND gate. A read clock signal RDCLKh is applied to one input. The RDCLKh signal indicates a read operation by the microprocessor 30 as previously discussed. An AMUXh signal is applied to the other input. The AMUXh signal represents that this register has been addressed by the microprocessor 30. More specifically the AMUX register is located in memory at $0021. Thus any time the microprocessor 30 addresses this location, the AMUXh signal will be active high. This allows the microprocessor 30 to read the contents of the flip-flops 536, 538, 540 and 542 by connecting the Q outputs of these flip-flops to the data bus DATA[3 . . . 0].

Write operations to the flip-flops 536, 538, 540 and 542 are controlled by a NAND gate 554. This NAND gate 54 generates a write WRMUXb that is applied to the D inputs of these flip-flops. The NAND gate 554 is a three input NAND gate. The write clock WRCLKh signal is applied to one input. An AMUXh signal is applied to another input. Lastly, a signal ARBSYh is applied to the NAND gate 554. The ARBSYh signal represents that the auto-ranging system is busy and will be discussed in detail below.

The flip-flops 536, 538, 540 and 542 are reset by a RESETb signal, applied to the reset inputs R of these flip-flops. The RESETb signal allows the microprocessor 30 to reset these flip-flops.

The CMUX[3 . . . 0] signal is developed by the flip-flops 556, 558, 560 and 562. The D inputs of these flip-flops are tied to the data bus DATA[7 . . . 4] to allow the microprocessor 30 to write to them. The Q outputs of these flip-flops are connected to the data bus DATA[7 . . . 4] by way of tristate devices 564, 566, 568 and 570 for read operations. The tristate devices 564, 566, 568 and 570 are normally in a high impedance state and are under the control of the NAND gate 552 which allows these flip-flops to be read when the microprocessor 30 initiates a read operation and places the address $0021 on the address bus ADDR[4 . . . 0]. Write operations to the flip-flops 556, 558, 560 and 562 are controlled by the NAND gate 554 in a similar manner as the flip-flops 536, 538, 540 and 542.

Figure 37:
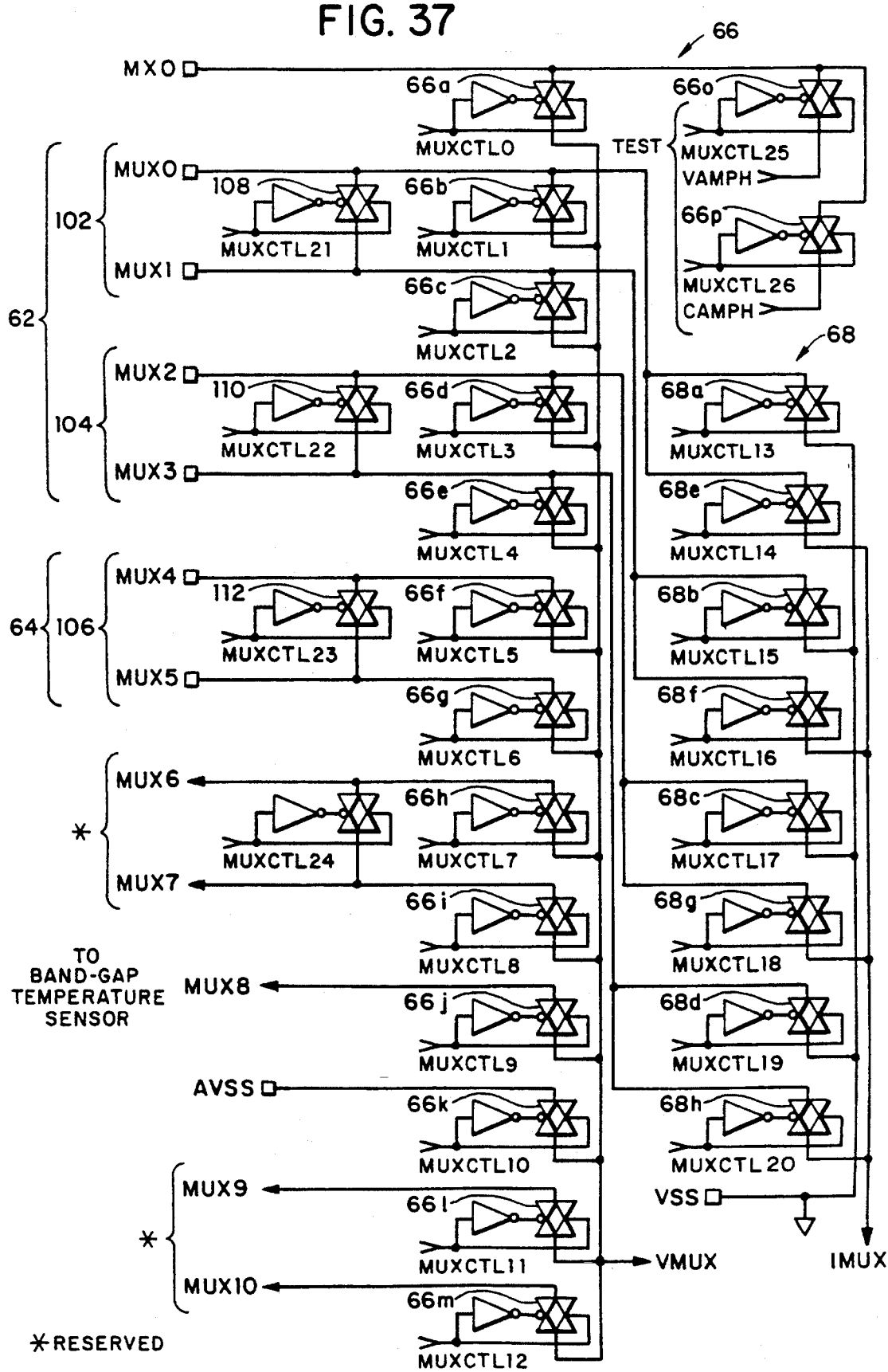
FIG. 37 is a schematic diagram of the input analog MUX system in accordance with the present invention.

The outputs of the flip-flops 536, 538, 540, 542, 556, 558, 560 and 562 are used to generate a MUX control signal MUXCTL[26 . . . 0] to control the current and voltage MUXes 66 and 68 as shown in FIGS. 3 and 37. More specifically, the voltage channel MUXes 66 and 68 are controlled by the control signal VMUX[3 . . . 0] while current channel MUXes 66 are controlled by the CMUX[3 . . . 0] signal. These signals are decoded by a series of inverters, OR gates and AND gates (FIG. 29) to generate the MUX control signals MUXCTL to allow individual control of each of the voltage and current channel MUXes. More specifically, the CMUX[3 . . . 0] signal is applied to one input of dual input AND gates 572, 574, 576 and 578. The other inputs to these AND gates is a signal CAZh, which is applied to the AND gates 572,574,576 and 578 by way of an inverter 580. The signal CAZh is also used to develop a signal CSHRTh, used in the A/D subsystem 78. The signal CSHRTh is available at the output of an inverter 581, serially coupled to the inverter 580. The signal CAZh indicates that the current amplifier 90 is being auto-zeroed.

The output of the NAND gate 572 is coupled to a chain of serially connected inverters 582, 584, 586, 588, 590, 592 and 594. The output of the NAND gate 574 is coupled to a chain of serially connected inverters 596, 598, 600, 602, 604, 606 and 608. Similarly, the output of the NAND gate 576 is coupled to a chain of serially connected inverters 610, 612, 614, 616, 618, 620 and 622. Lastly, the NAND gate 578 is applied to a chain of serially connected inverters 624, 626, 628, 630, 632, 634 and 636. The outputs of the inverters 594, 608, 622 and 636 are coupled to inputs of dual input OR gates 638, 640, 642 and 644. The other inputs to these OR gates are the outputs from the inverters 582, 596, 610 and 624. The outputs of the NAND gates 572, 574, 576 and 578 are applied to inputs of dual input OR gates 646, 648, 650 and 652, respectively. The other inputs to these OR gates are from the outputs of the inverters 592, 606, 620 and 632, respectively. The outputs of the OR gates 638, 640, 642, 644, 646, 648, 650 and 652 are applied to inputs of dual input AND gates 654, 656, 658, 660, 662, 664, 666 and 668, respectively. The ACFR[3 . . . 0] bits from the internal bus ACFR[3 . . . 0] are applied to the other inputs of these AND gates to control whether the input MUXes 66 (FIG. 3) are in a current mode or a voltage mode. A one in these bits selects the current mode. More specifically, the ACFR[3] bit is applied to the inputs of the AND gates 654 and 656. The ACFR[2] bit is applied to the inputs of the AND gates 658 and 660. The ACFR[1] bit is applied to the inputs of the AND gates 608 and 610. Lastly, the ACFR[0] bit is applied to the inputs of the AND gates 666 and 668. The outputs of the AND gates 654, 656, 658, 660, 662, 664, 666 and 668 are decode signals MUXCTL[20 . . . 13] which allow for individual control of the current channel MUXes 66.

The sample and hold switches 108, 110 and 112 may also be individually controlled by decode circuitry (FIG. 29) which includes inverters 670, 672, 674, 676, 678 and 680 and three input AND gates 682 and 684. More specifically, the inverters 670, 672, 674 and 676 are tied to the internal ACFR bus ACFR[3 . . . 0]. The outputs of the inverters 670 and 672 are applied to the AND gate 682 along with a SAMPh signal, available at its output of the NAND gate 532 (FIG. 26), which indicates that the command bit ACFR[1] has been set. The outputs of the inverters 674 and 676 are applied to the AND gate 684 along with the SAMPh signal. The SAMPh signal is also tied to the inverters 678 and 680 and the AND gate 684 represent the signal MUXCTL[24 . . . 21] which allows individual control of the sample and hold switches 108, 110 and 112.

Figure 30:
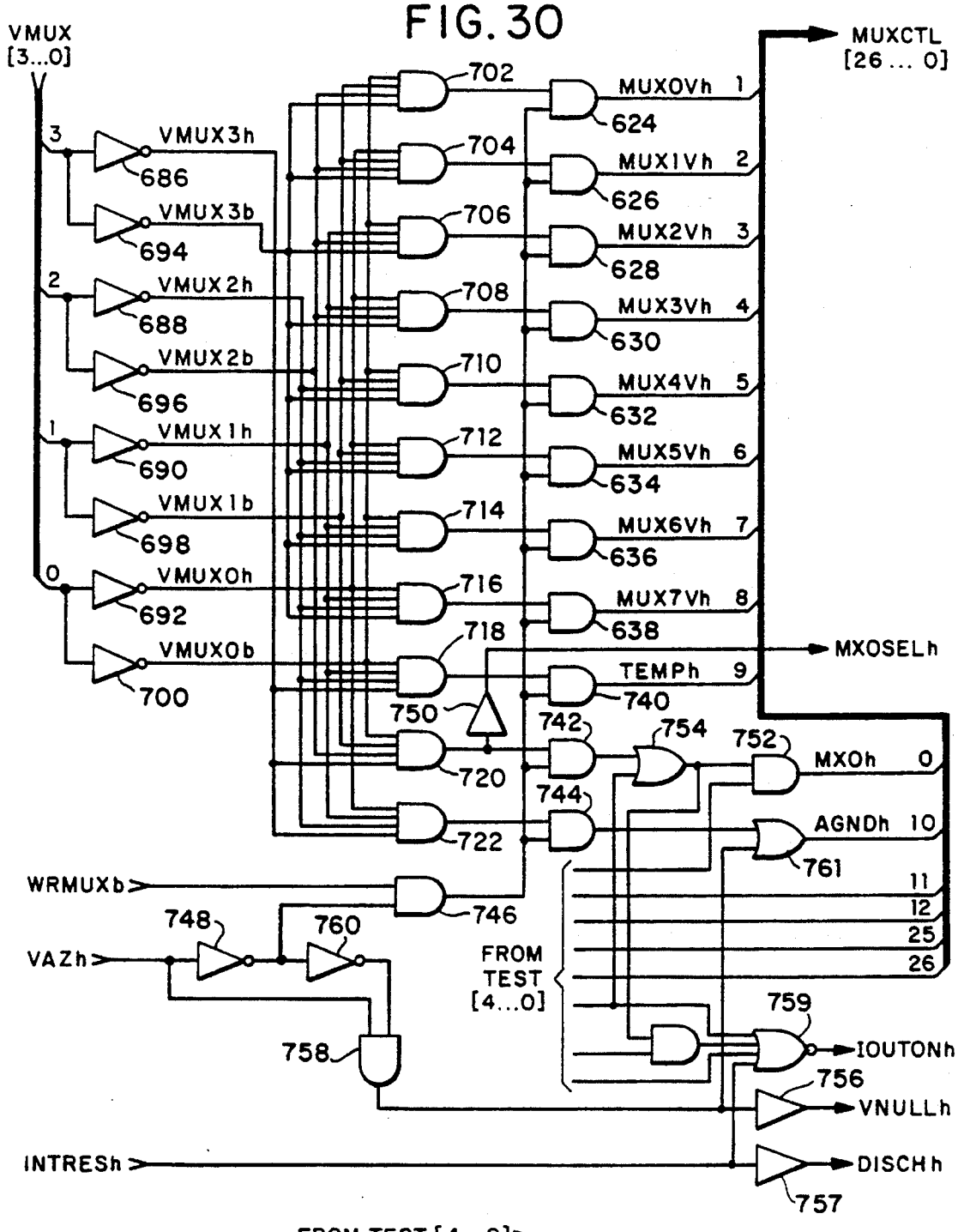
FIG. 30 is a schematic diagram of the voltage MUX control logic in accordance with the present invention.

The VMUX[3 . . . 0] bits of the AMUX register control the voltage channel MUXes 66 and 68 to generate the MUX-CTL[10 . . . 0] signals and to generate the MUXCTL[10 . . . 0] signals (FIG. 30). The MUXCTL[26, 25, 12, 11] signals (also shown on FIG. 30) are used during a testing mode. More specifically, the voltage channel MUXes 66 and 68 are selected by the VMUX[3 . . . 0] bits. These four bits are decoded by circuitry (FIG. 30) consisting of buffer amplifiers 686, 688, 690 and 692; inverters 694, 696, 698 and 700; quad input AND gates 702; 704, 706, 708, 710, 712, 714, 716, 718, 720 and 722; and dual input AND gates 724, 726, 728, 730, 732, 734, 736, 738, 740, 742 and 744. More specifically, the VMUX[3 . . . 0] bits are applied to the inputs of the buffer amplifiers 686, 688, 690 and 692 and the inverters 694, 696, 698 and 700. The output of the buffer amplifier 686 is applied to the inputs of the AND gates 718, 720 and 722. The output of the inverter 694 is applied to the inputs of the AND gates 702, 704, 706, 708, 710, 712, 714 and 716. The output of the buffer amplifier 688 is applied to the inputs of the AND gates 710, 712, 714, 716, 718 and 722. The output of the inverter 696 is applied to the inputs of the AND gates 702, 704, 706, 708 and 720. The output of the buffer amplifier 690 is applied to the inputs of the AND gates 706, 708, 714, 716, 718 and 722. The output of the inverter 698 is applied to the inputs of the AND gates 702, 704, 710, 712 and 720. The output of the buffer amplifier 692 is applied to the inputs of the AND gates 704, 708, 712, 716 and 722. Lastly, the output of the inverter 700 is applied to the inputs of the AND gates 702, 706, 710, 714, 718 and 720. The output of the AND gates 702, 704, 706, 708, 710, 712, 714, 716, 718, 720 and 722 are a decode of the AMUX[3 . . . 0] bits. The outputs of these AND gates are applied to the inputs of dual input AND gates 724, 726, 728, 730, 732, 734, 736, 738, 740, 742 and 744. The other input to these AND gates is an AND gate 746 which controls write operation to the voltage channel MUXes. More specifically, the AND gate 746 is a two input AND gate. A WRMUXb signal is applied to one input. The other input to the AND gate 746 is a signal VAZh by way of an inverter 748. As will be discussed below, the signal VAZh is active high and indicates when the voltage amplifier 80 is being zeroed. This signal will be discussed in detail below. The outputs of the AND gates 724, 726, 728, 730, 732, 734, 736, 738 and 740 represent the signal MUXCTL[9 . . . 0].

As will be discussed in more detail below, auto-ranging is inhibited when the current channels are selected. Thus the output of the AND gate 720 is used to generate a signal MXOSELh by way of an inverter 750. More specifically, a signal MXOh, which indicates that a current channel has been selected, is generated at the output of an AND gate 752 and corresponds to an MUXCTL[9] signal. The AND gate 752 is a two input AND gate. One input is from the test circuit. The other input is from an OR gate 754. The OR gate 754 is a two input OR gate. One input is from a test circuit. The other input is from the AND gate 742 which indicates that the current channels have been selected.

A VNULLh signal is developed at the output of a buffer amplifier 756. This VNULLh signal controls the zero switch 86 (FIGS. 30 and 44) for auto-zeroing the voltage amplifier 80. The input to the buffer amplifier 756 is an output of a two input AND gate 758. One input to the AND gate 758 is the VAZh signal indicating that the amplifier 80 is being autozeroed. The other input to the AND gate 758 is the same signal VAZh applied by way of inverters 748 and 760.

An AGNDh signal is developed at the output of a two-input OR gate 761. One input to the OR gate 761 is the output from the AND gate 744. The VNULLh signal is applied to the other input. The AGNDh signal is used to connect the voltage channels to ground (FIG. 3). The AGNDh signal is available as MUXCTL[10].

Lastly, MUXCTL[26,25,12,11] are used in conjunction with the test circuit.

AUTO-ZERO REGISTERS ADZ AND AMZ

The ADZ and AMZ registers are used in connection with the auto-zero logic 98 for the current and voltage amplifiers 80 and 90. The auto-zero logic corrects for the offsets in the amplifiers 80 and 90 created by using a CMOS process to fabricate these amplifiers.

ADZ REGISTER

The ADZ register (FIG. 31) is a 6 bit read-write register which contains the offset correction value for the voltage amplifier 80. As previously discussed, write operations to this register are intended for diagnostic and verification purposes only. This register is loaded with the correction value for the amplifier 80 at the completion at the auto-zero sequence.

More specifically, the data bus DATA[7 . . . 0] is applied to this register, which includes the flip-flops 762, 764, 766, 768, 770 and 772. MUXes 774, 776, 778, 780, 782 and 784 allow the inputs of these flip-flops to be connected to either the data bus DATA[7 . . . 0] or to a zero bus ZERO[5 . . . 0]. The ZERO[5 . . . 0] bus contains the offset correction value for the amplifier being zeroed and allows the offset correction value to be written to the ADZ register. The data bus DATA[5 . . . O] bits are applied to the A inputs of the MUXes 774, 776, 778, 780, 782 and 784. The ZERO[5 . . . 0] bus signal is applied to the B inputs of these MUXes. A ZERSEL signal is applied to the select inputs SEL of these MUXes. The ZERSEL signal controls whether the ADZ register is loaded from the data bus or the zero bus. The outputs of the MUXes 774, 776, 778, 780 and 782 are applied to the D inputs of the flip-flops 762, 764, 766, 768, 770 and 772. The ZERSELh signal (FIG. 33), generated by the autozero state machine, indicates that the state machine is in state S3. In state S3, the offset correction value is latched into the ADZ register by the VZCLKh signal discussed below. The VZCLKh signal is developed by the auto-zero state machine and is available at the output of a buffer 803. This signal VZCLKh is applied to the G inputs of the flip-flops 762, 764, 766, 768, 770 and 772.

The Q outputs of the flip-flops 762, 764, 766, 768, 770 and 772 are applied to an internal bus VZERO[5 . . . 0] for the voltage amplifier 80. The Q outputs of these flip-flops are also connected to the data bus DATA[5 . . . 0] by way of tristate devices 786, 788, 790, 792, 794 and 796 to allow these flip-flops to be read by the microprocessor 30. The bits ADZ[7,6] will always read zero since these bits are tied to the data bus DATA[7,6] by way of tristate devices 798 and 800 which have grounded inputs.

The tristate devices 786, 788, 790, 792, 794, 96, 798 and 800 are normally in a high impedance state except during a read operation when these tristate devices allow the outputs of the flip-flops 762, 764, 766, 768, 70 and 772 to be tied to the data bus DATA[7 . . . 0]. These tristate devices are under the control of a NAND gate 802. The output of the NAND gate 802 is a signal VZRDb signal, which represents a ADZ register read. The inputs to the NAND gate 802 are the signals RDCLKh and ADZh. The read signal RDCLKh is the read clock signal. The ADZh signal represents a microprocessor 30 has placed the address $0024 on the address bus ADDR[4 . . . 0]. The ADZ register is loaded by a VZCLKh signal.

The ADZ register can also be reset by the microprocessor 30. More specifically, a RESb signal is applied to the reset inputs of the flip-flops 762, 764, 766, 768, 770 and 772.

AMZ REGISTER

The AMZ register is a 6 bit read-write register that contains the offset correction value for the current mirror amplifier 92. This register is loaded with the correction value at the completion of the auto-zero sequence. Write operations to this register are diagnostic and verification purposes only.

The AMZ register includes the flip-flops 804, 806, 808, 810, 812 and 814. The Q outputs of the flip-flops 804, 806, 808, 810, 812 and 814 are tied to an internal bus CZERO[5 . . . 0]. The data bus DATA[7 . . . 0] is applied to the inputs of these flip-flops by way of the MUXes 774, 776, 778, 780, 782 and 784. These flip-flops are clocked by a CZCLKb signal, developed by the auto-zero state machine to latch the offset correction value for the current amplifier 90 (FIG. 45) into the AMZ register in state S7 (Appendix C) as discussed below. The CZCLKb signal is applied to D inputs of these flip-flops by way of a buffer 816. A RESb signal is applied to the reset inputs R of these flip-flops for reset. The Q outputs of the flip-flops 804, 806, 808, 810, 812 and 814 are applied to the data bus DATA[5 . . . 0] by way of tristate devices 818, 820, 822, 824, 826 and 828 The bits AMZ[7,6] are not used and will always read zero. More specifically, the data bus DATA[7, 6] are connected to the outputs of tristate devices 830 and 832, respectively. The input to the tristate devices 830 and 832 are connected to ground. Thus the AMZ[7, 6] bits will always read zero.

All of the tristate devices 818, 820, 822, 824, 826, 828, 830 and 832 are under the control of a NAND gate 834. The output of the NAND gate 834 is a signal CZRDb, which indicates an AMZ register read. The RDCLKh is applied to one input of the NAND gate 834. An AMZh signal is applied to the other input. The AMZh represents that the microprocessor 30 has written to the address $0025.

The flip-flops 804, 806, 808, 810, 812 and 814 are reset by the microprocessor 30. More specifically, a RESb signal is applied to the reset inputs of these flip-flops.

AUTO-ZERO STATE MACHINE

Figure 47:
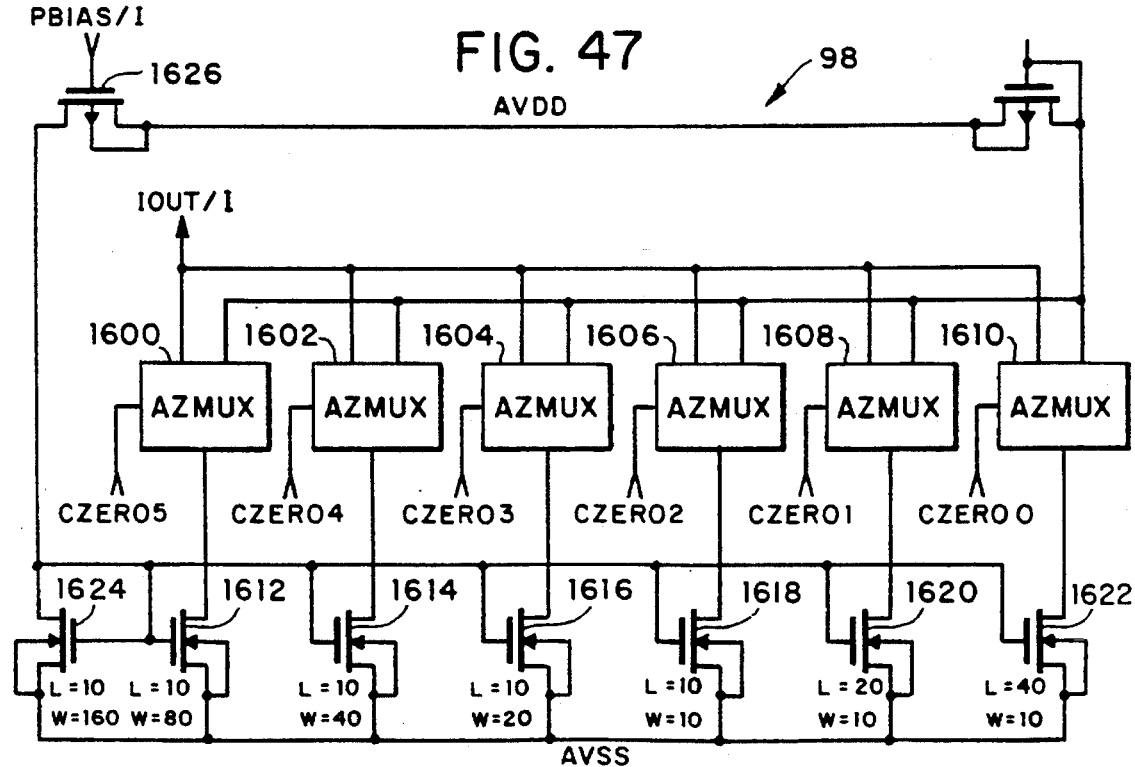
FIG. 47 is a schematic diagram of the offset correction circuitry in accordance with the present invention.
Figure 48:
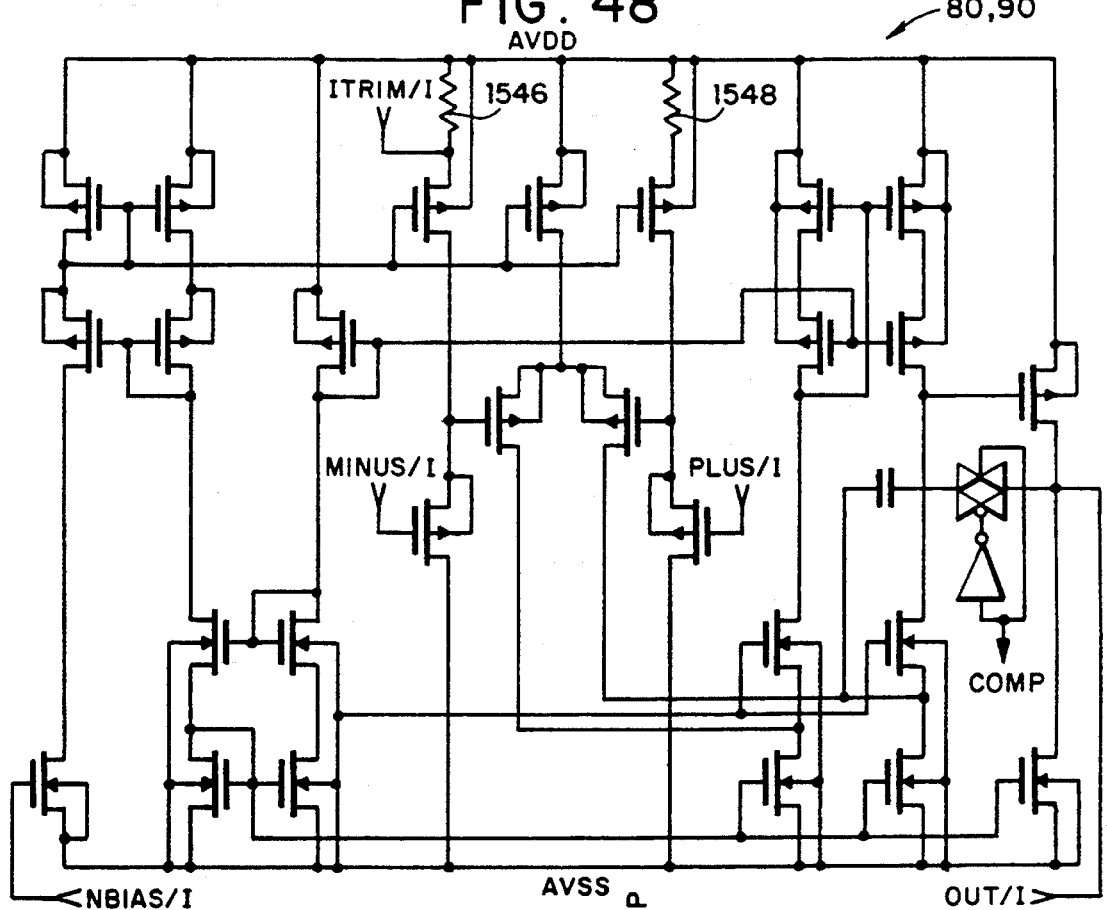
FIG. 48 is a schematic diagram of the auto-zeroable voltage and current amplifiers in accordance with the present invention.

An auto-zero state machine generates the sequencing required to zero the voltage and current amplifiers 80 and 90 by adjusting the internal bias currents. During an autozero sequence, the amplifier's inputs and outputs are isolated from associated circuitry and the inputs are grounded. The autozero state machine differentially varies the bias currents in discrete steps by way of current divider (FIG. 47) until the amplifier's output changes states. The autozeroable amplifier is illustrated in FIG. 48. The number of steps corresponding to the change in state represents the offset correction value. This correction value stored in the ADZ and AMZ registers as discussed above.

Figure 50:
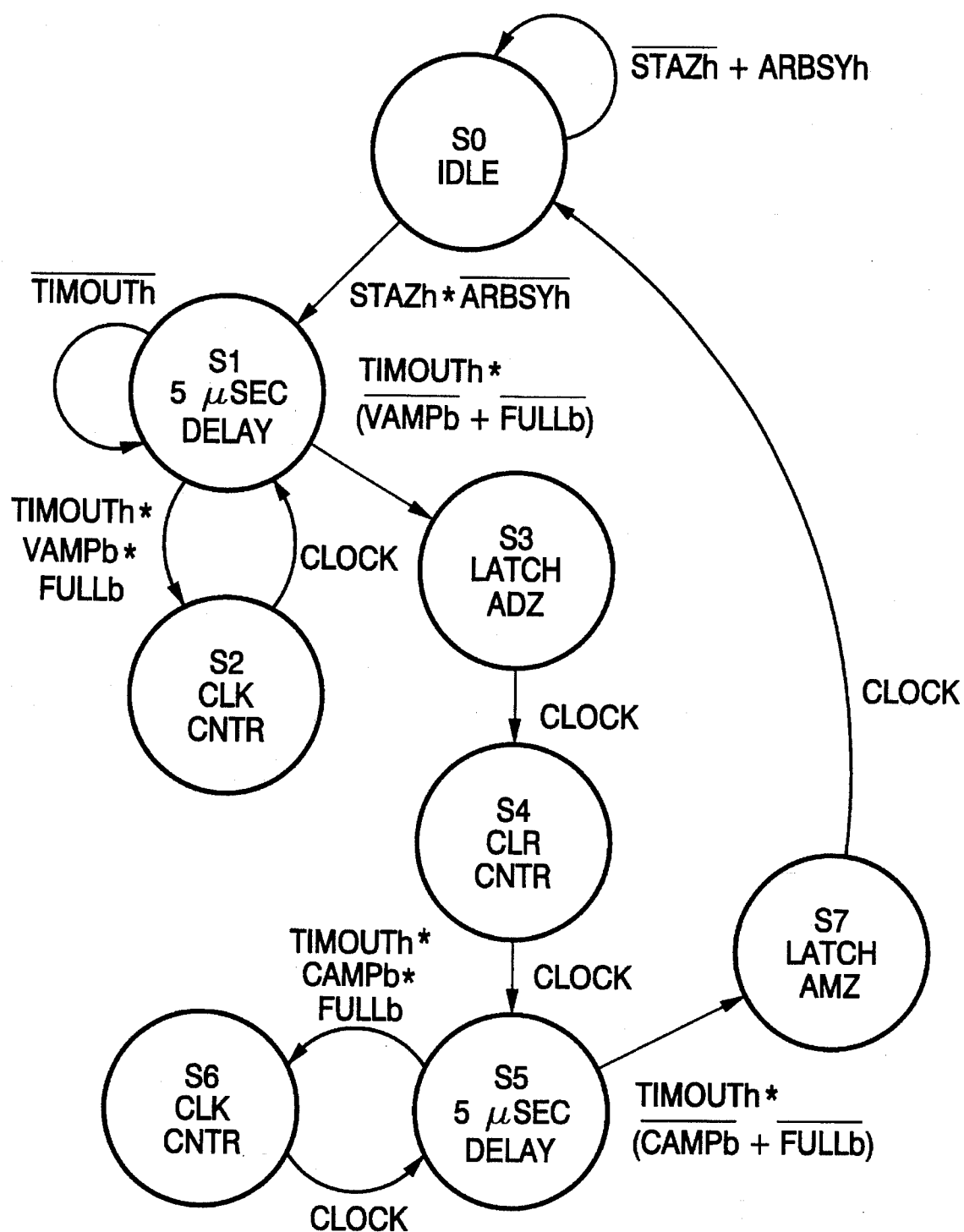
FIG. 50 depicts a state diagram for the auto-zero function.

The auto-zero state machine is illustrated in FIG. 50. An auto-zero state transition table, state diagram and transition table state equations are provided in Appendix C.

Figure 33:
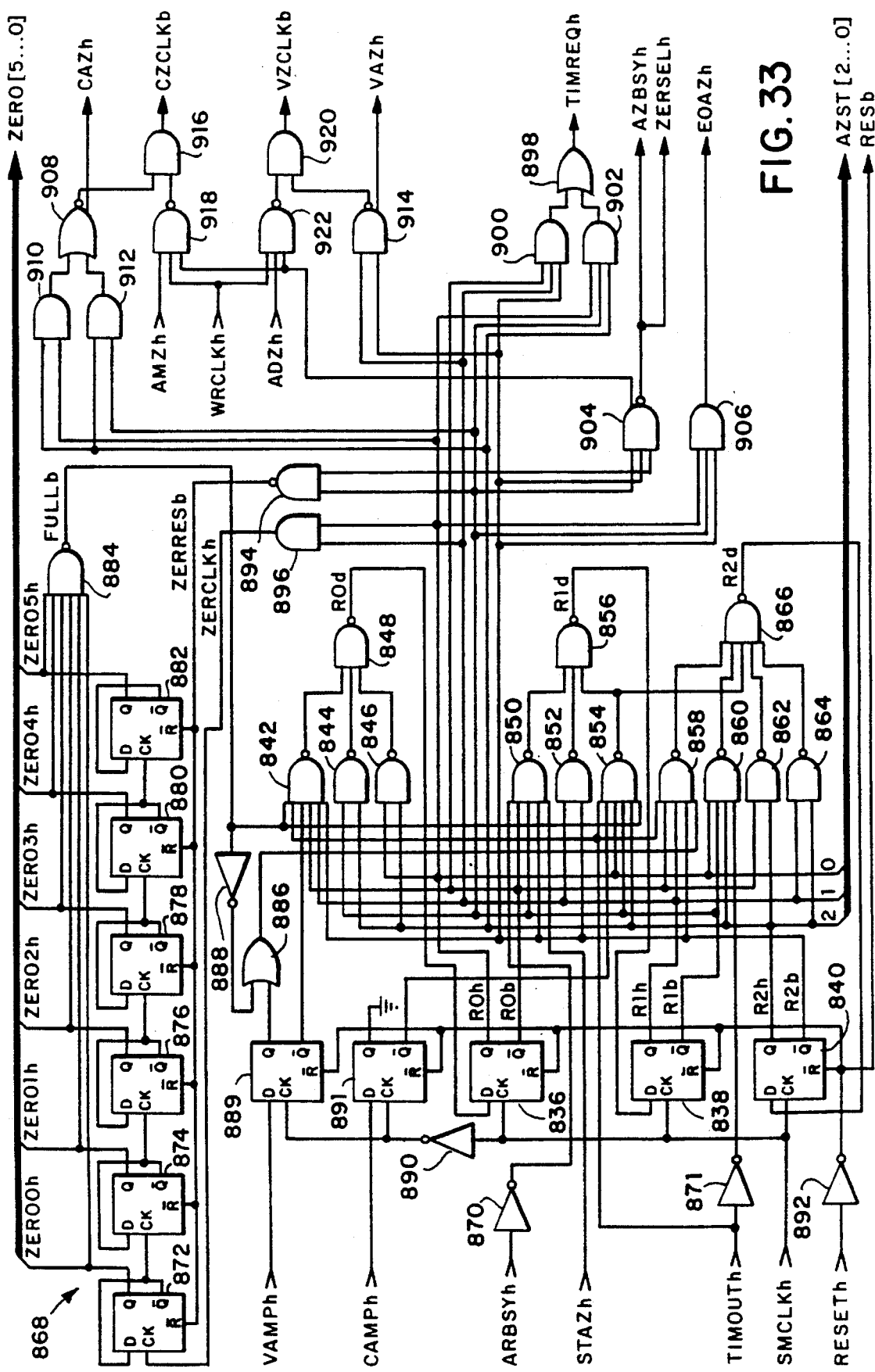
FIG. 33 is a schematic diagram of the auto-zero control logic in accordance with the present invention.

The state machine includes three state register flip-flops 836, 838 and 840 as well as NAND gates 842, 844, 846, 848, 850, 852, 854, 856, 858, 860, 862, 864 and 866 and as shown in FIG. 33. There are also various inputs and outputs from the state machine as discussed below. The state register flip-flops produce state variables R0h, R0b, R1h, R1b, R2h and R2b. These variables, along with the variables R0d, R1d and R2d, available at the outputs of the NAND gates 848, 856 and 866 are used in the development of the state equations in Appendix C.

Each of the state register flip-flops is clocked by the SMCLKh signal discussed above. The reset signal RESETb, available at the output of an inverter 892 is applied to the reset inputs R of these flip-flops.

The outputs of the state register flip-flops 836, 838 and 840 define the auto-zero state assignments for the auto-zero state machine in accordance with Table C1, Appendix C. Eight permissible states S0–S7 are defined as follows:

S0—Idle. The state machine is in the idle state waiting for a start auto-zero signal STAZh to become active. The state machine also stays idle as long as the auto-range state machine is busy. This interlock between the two state machines is implemented by an auto-range busy signal ARBSYh. When the STAZh signal is active, the ARBSYh signal is inactive to allow the state machine to transfer to state S1.

Figure 32:
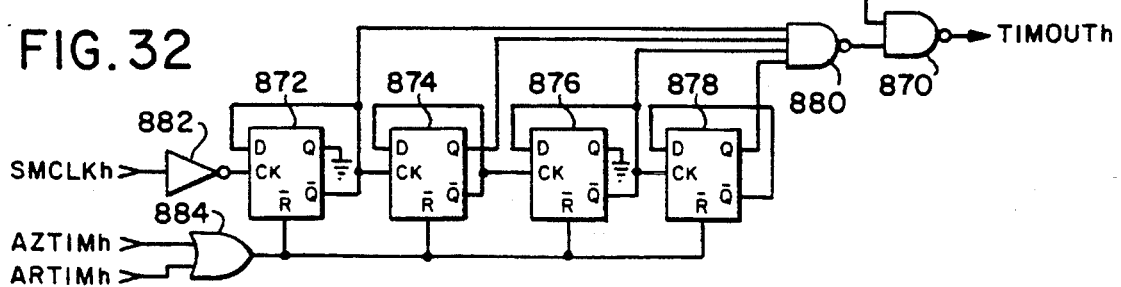
FIG. 32 is a schematic diagram of the five microsecond timer in accordance with the present invention.

S1—Five microsecond delay. States S1 and S2 form a loop which is repeated until either the voltage amplifier output changes state or a counter 868 reaches a final count. During state S1, a time request signal TIMREQh is active and a time out signal TIMOUTh is monitored. The act of the time request signal going active, which happens in state S1, triggers a five microsecond timer (FIG. 32). When the timer has timed five microseconds, the time out signal TIMOUTh becomes active. This causes the state machine to transfer to either state S2 or state S3. The state machine proceeds to state S2 if the amplifier output VAMPh signal is still high indicating that the bias current is not yet high enough and the counter 868 has not yet reached the final count as indicated by a FULLb flag. The state machine transfers to state S3 if either the amplifier output signal goes low or the counter 868 reaches the final count. The five microsecond delay permits the amplifier 80 to settle and reach a stable output.

S2—clock counter. State S2 is entered when the counter 868 does not yet contain a full count and the count is not enough to generate a suitable bias current for zeroing the amplifier 80. The clock counter signal is active in state S2 incrementing the count value by one. The state machine always transfers to state S1 on the next clock pulse.

S3—Latch ADZ value. State S3 is reached when either the voltage amplifier output has switched states or the counter 868 has reached the final count. The present count in the counter is latched into the ADZ register by activating the VZCLKh signal for one state time. The state machine always transfers to state S4.

S4—Clear Counter. State S4 sets up the state machine for auto-zeroing the current amplifier 90. The counter is cleared via a ZERRESb signal and the MUXes 774, 776, 778, 780, 782 and 784 on the output of the counter switch to direct the count value to the AMZ register and the current amplifier 90. The state machine always transfers to state S5.

S5—Five microsecond delay. State S5 and S6 are analogous to state S1 and S2 except the counter is applied to the current amplifier 90 and the output of the current amplifier CAMPh is examined to transfer from S5 to S7.

S6—Clock Counter. This state is identical to state S2. The state machine always transfers to state S5.

S7—Latch AMZ value. This state is analogous to state S3. Current contents of the counter 868 are latched in the AMZ register. Additionally the end of auto-zero signal EOAZh is active to indicate that the auto-zero operation has been complete.

AUTO-ZERO INPUTS

There are various input and on signals to the auto-zero machine identified as follows:

ARBSYh—Auto-Range Busy. This signal is active high when the auto-range state machine is not idle. This signal is applied to the state machine by way of an inverter 870. This signal is discussed in connection with the auto-range state machine.

STAZh—Start Auto-Zero. This signal is active high when the initiate auto-zero bit of a command register has been written. This signal is available at the output of the AND gate 528 (FIG. 26).

VAMPb—Voltage Amp Output. This signal is active low when the voltage amplifier 80 has been auto-zeroed. The VAMPh signal is the output signal of the voltage amplifier 80 and is applied to a flip-flop 889.

CAMPb—Current Amp Output. This signal is low when the current amplifier 90 has been auto-zeroed. The CAMPh signal is available at the output of the current amplifier 90. This signal is applied to a flip-flop 891.

TIMOUTh—Time Out. This signal is active high when a five microsecond time delay has expired. The TIMOUTh signal is available at the output of a NAND gate 870 (FIG. 32). The NAND gate 870 is a two input NAND gate. One input is active during the test mode. The other input is from a five microsecond timer comprised of flip-flops 872, 874, 876 and 878 and a NAND gate 880. The Q outputs of these flip-flops are tied to the inputs of the NAND gate 880. The flip-flops 842 and 846 are configured such that their Q outputs are connected to their D inputs. The a outputs of the flip-flops 872, 874 and 876 are applied to clock inputs CK of the flip-flops 874, 876 and 878, respectively. A TIMOUTb signal, available at the output of an inverter 871 (FIG. 33), is also applied to the autozero state machine. The TIMOUTb signal is applied to the NAND gate 860. The SMCLKh signal is applied to an inverter 882, whose output is connected to the clock input CK of the flip-flop 872. The reset inputs R of the flip-flops 872, 874, 876 and 878 are controlled by an OR gate 884. The OR gate 884 is a two input OR gate. Signals AZTIMh and ARTIMh are applied to the inputs.

FULLb—Counter Full. This signal is active low when the counter 868, used to set a bias current, is at 111111 count. This is a maximum bias count value. The counter 868 includes the flip-flops 872, 874, 876, 878, 880 and 882 and a NAND gate 884 connected as shown in FIG. 33. The Q outputs of the flip-flops 872, 874, 876, 878, 880 and 882 are connected to the NAND gate 884, which is the FULLb flag and the internal ZERO[5 . . . 0] bus. The FULLb flag is applied to the inputs of the NAND gates 842 and 854. It is also applied to an OR gate 886 by way of an inverter 888. The other input to the OR gate 886 is from a flip-flop 889.

The input to the flip-flop 889 is a signal VAMPh, which is the output of the voltage amplifier 80. This flip-flop is clocked by the complement of the SMCLKh signal, available at an inverter 890. The flip-flop 889 is reset by a RESETb signal available at the output of an inverter 892. The output of the OR gate 886 is applied to the NAND gate 858.

RESETh—Reset. This signal is active high to reset the state register flip-flops 836, 838 and 840 during system reset. This signal is available at the output of the inverter 892.

AUTO-ZERO OUTPUTS

ZERRESb—Zero Counter Reset. This signal is active low to reset the counter 868 used to generate the bias counter and is active in states S0 and S4. This signal is available at an output of a NAND gate 894.

ZERCLKh—Zero Counter Clock. This signal is active high to increment the bias current counter 868. This signal is active in states S2 and S6 and is available at an output of a NAND gate 896.

TIMREQh—Time Request. This signal is active high to request a five microsecond delay period and is active in states S1 and S5. This signal is available at an output of a two input OR gate 898. Outputs from AND gates 900 and 902 are applied to inputs of the OR gate 898. Inputs to these AND gates are from the state machine.

AZBSYh—Auto-Zero Busy. This signal is active high to indicate when an auto-zero operation is active. This signal is used to interlock the auto-zero and auto-range state machines. The AZBSYh signal also inhibits the microprocessor 30 from writing to the auto-zero registers by disabling NAND gates which decode the register select signals AMZh and ADZh and the write clock signal WRCLKh. This signal is active in states S1, S2, S3, S4, S5, S6 and S7. This signal is available at an inverting output of a NAND gate 904. The output of the NAND gate 904 is also the ZERSELh signal.

EOAZh—End of Auto-Zero. This signal is in active high signal which sets the flip-flop 492 (FIG. 26) in the ADCR status register to indicate an auto-zero process has finished. It also clears a flip-flop which generates the STAZh signal and is active in S7. This signal is available at an output of an AND gate 906.

CAZh—Current Auto-Zero. This signal is active high to indicate when the current amplifier 90 is being auto-zeroed. This signal is active in states S4, S5 and S6. This signal is available at an inverting output of a two input NOR gate 908. Inputs to the NOR gate 908 are from AND gates 910 and 912 which is connected to the state machine.

VAZh—Voltage Auto-Zero. This signal is active high to indicate when the voltage amplifier 80 is being auto-zeroed and is active in state S1 and S2. This signal is available at a non-inverting output of a NAND gate 914.

CZCLKh—Current Zero Register Clock. This signal is active low to clock the AMZ register for the current amplifier bias count. When the state machine is idle, this signal is generated by decoding the register select signal AMZh and the write clock signal WRCLKh. When the state machine is active, S7 is decoded to generate a clock pulse to the register. This signal is active in S7. This signal is available at an output of a two input AND gate 916. One input to the AND gate 916 is an inverting output from the NOR gate 908. The other input is from a three input NAND gate 918. One input to the NAND gate 918 is a non-inverting output of the NAND gate 904. The other inputs are the AMZh and WRCLKh signals.

VZCLKh—Voltage Zero Register Clock. This signal is active low to clock the ADZ register for the voltage amplifier bias count. When the state machine is idle, this signal is generated by decoding the register select signal ADZh and the write clock signal WRCLKh. When the state machine is active, S3 is decoded to generate a clock pulse to the register. This signal is active in S3. This signal is available at an output of two input AND gate 920. An inverting output of the NAND gate 914 is applied to one input. The other input is from a three input NAND gate 922. The ADZh and WRCLKh signals are applied to two inputs. A non-inverting output from the NAND gate 904 is applied to the other input.

AZST bus—Auto-Zero States. This three bit wide bus contains the auto-zero state machine flip-flops 836, 838 and 840. This bus is used to permit reading of these flip-flops during a test condition.

AUTO-ZERO STATE MACHINE OPERATION

The auto-zero state machine auto-zeros the voltage 80 and current amplifier 90. The auto-zero function is initiated by the software setting a bit in the command register which includes the flip-flops 522, 524 and 526. More specifically, referring to FIG. 26 when the command bit ADCR[2] is written to the NAND gate 520 this, in turn, controls the flip-flops 522, 524 and 526 to generate the start auto-zero signal STAZh at the output of the AND gate 528.

The voltage 80 and current 90 amplifiers are auto-zeroed in the following manner. After the generation of the start auto-zero signal STAZh. First, the six bit counter 868 is cleared. This counter 868 is cleared by the ZERRESb signal in states S0 and S4. After the six bit counter 868 is cleared the voltage amplifier 80 is placed in the auto-zero state by shorting its noninverting input to ground by way of the MUXes 66 and 86. This is accomplished by the VAZh signal which is active in states S1 and S2. This signal generates an AGNDh signal at the output of an OR gate 924, which shorts the noninverting input of the voltage amplifier 80 to ground by way of the MUX 80. MUX 88 removes the internal compensation from the voltage amplifier 80. Next the output of the counter 868 is gated onto a ZERO[5 . . . 0] bus for the amplifier being auto-zeroed. Subsequently, a five microsecond delay is timed. This is accomplished by the circuitry in FIG. 32 previously discussed. At the end of the five microsecond delay, a TIMOUTh signal is generated at the output of the NAND gate 870. At the end of the delay, the output signal VAMPh, which is the output signal of the voltage amplifier 80, is examined. Also, the counter 868 full counter count signal FULLb is examined. If either of these signals is active, the count is latched into the ADZ register by the state machine. Otherwise, the counter 868 is incremented and the five microsecond delay is timed again. After the count is latched the sequence is repeated with the current amplifier 90.

AVSF AND ACSF AUTO-RANGE REGISTERS

The voltage scale register AVSF (FIG. 34) is a read-write register that is used to control operation of the voltage input ranging circuitry (FIGS. 3 and 44). The value written into this register determines the voltage amplifier 80 auto-ranging mode. If a zero is written to this register, the voltage amplifier 80 is placed in an auto-ranging mode. A nonzero value inhibits the auto-ranging and sets the voltage amplifier 80 in a fixed gain mode. The register is not a true read-write register. The value read from it will not necessarily be the value that was written into it. Writing a zero into the AVSF register enables auto-ranging. However, a zero cannot be read from this register. The possible values are provided in Table 8. The value read from this register is one of the scale factors to properly scale the 8 bit A–D output. Five values are possible: x1, x2, x4, x8 and x16.

The AVSF register includes six flip-flops 944, 946, 948, 950, 952 and 954. The D inputs of these flip-flops are connected to the data bus DATA[5 . . . 0] for write operations during ranging. Any non-zero value written to the AVSF register is detected by a NAND gate 998 which disables autoranging. The D inputs of the flip-flops 944, 946, 948, 950, 952 and 954 are tied to the output of a buffer amplifier 955. The input to the buffer amplifier 955 is the signal VRCLKb. This signal will be defined in connection with the auto-range state machine and is used to control read and write operations of the AVSF register. The Q outputs of the flip-flops 944, 946, 948, 950 and 952 are tied to the B inputs of MUXes 956, 958, 960, 962 and 964, respectively. The D output of the flip-flop 954 is the signal VGAIN32h. This signal VGAIN32h along with GAIN[4] from autoranging circuitry which includes counter 1170 (FIG. 35) are applied to ranging circuitry 84 and MUXes 86 of the voltage amplifier 80 (FIGS. 3 and 44) to control the voltage gain. The counter 1170 as will be discussed below includes the ranged value as a result of autoranging of the voltage amplifier 80 and the current amplifier 90. More specifically, the MUXes 956, 958, 960, 962 and 964 allow the Q outputs of the flip-flops 944, 946, 948, 950, 952 and 954 to be connected to either to a gain bus GAIN[4 . . . 0] or to A inputs of MUXes 966, 968, 970, 972 and 974. The B inputs of the MUXes 966, 968, 970, 972 and 974 are connected to ground which allows the output signals of the flip-flops 944, 946, 948, 950, 952 and 954 to either be grounded or connected to the data bus DATA[5 . . . 0] by way of tristate devices 976, 978, 980, 982 and 984 for read operations. The tristate devices 976, 978, 980, 982 and 984 are under the control of a signal VRRDb (FIG. 35) which read operations of the AVSF register.

The output of the MUXes 966, 968, 970, 972 and 974 are also tied to one input of a plurality of AND gates 986, 988, 990, 992 and 994. The other input to the AND gates 986, 988, 990, 992 and 994 is from an inverter 996. The input to the inverter 996 is the VAZh signal (FIG. 33), the voltage auto-zero signal which indicates the voltage amplifier 80 autoranging is active. The output of the AND gates 986, 988, 990, 992 and 994 are connected to the VGAIN[4 . . . 0] bus which controls the autoranging MUXes 86 (FIG. 44).

The MUXes 956, 958, 960, 962 and 964 are under the control of a NAND gate 998 which generates a signal VRZEROh. This signal indicates that the microprocessor 30 wrote a zero to the AVSF register to initiate voltage auto-ranging. The signal VRZEROh is active high and determines whether the voltage amplifier 80 is placed in an auto-ranging mode or a fixed gain mode. The input to the NAND gate 998 are the Q outputs of the flip-flops 944, 946, 948, 950 and 952. A zero written to the AVSF register will cause the Q outputs of the flip-flops 944, 946, 948, 950 and 952 to be high or true. This will, in turn, cause the signal VRZEROh to be active which, in turn, will cause the MUXes 956, 958, 960, 962 and 964 to connect the Q output signals from the flip-flops 944, 946, 948, 950, 952 and 954 to the VGAIN[4 . . . 0] bus for auto-ranging. Non-zero values written to the register AVSF, detected by the NAND gate 998, will place the circuitry in a fixed gain mode. This will cause the MUXes 956, 958, 960, 962 and 964 to connect the Q output signals from the flip-flops 944, 946, 948, 950, 952 and 954 to the MUXes 966, 968, 970, 972 and 974. The MUXes 966, 968, 970, 972 and 974 either ground the Q outputs of the flip-flops 944, 946, 948, 950, 952 and 954 or allow them to be tied to the AND gates 986, 988, 990, 992 and 994 which, in turn, are connected to the VGAIN[4 . . . 0] bus. The MUXes 966, 968, 970, 972 and 974 are under the control of an AND gate 1000 which inhibits autoranging of the voltage amplifier 80 when the current mode has selected and is being auto-ranged. The AND gate 1000 is a three input AND gate 1000. The VRZEROh, indicating voltage amplifier autoranging signal, is applied to one input. The AZBSYb signal, which represents that the auto-zero signal is busy, is applied to another input. The output of an AND gate 1002 is a signal CURRENTh, which represents that the current mode has been selected. The CURRENTh signal is applied to the third input of the AND gate 1000. The AZBSYb signal, used to inhibit the auto-range state machine when the auto-zero machine is active. The AND gate 1002 inhibits auto-ranging when the current subsystem is selected.

Figure 35:
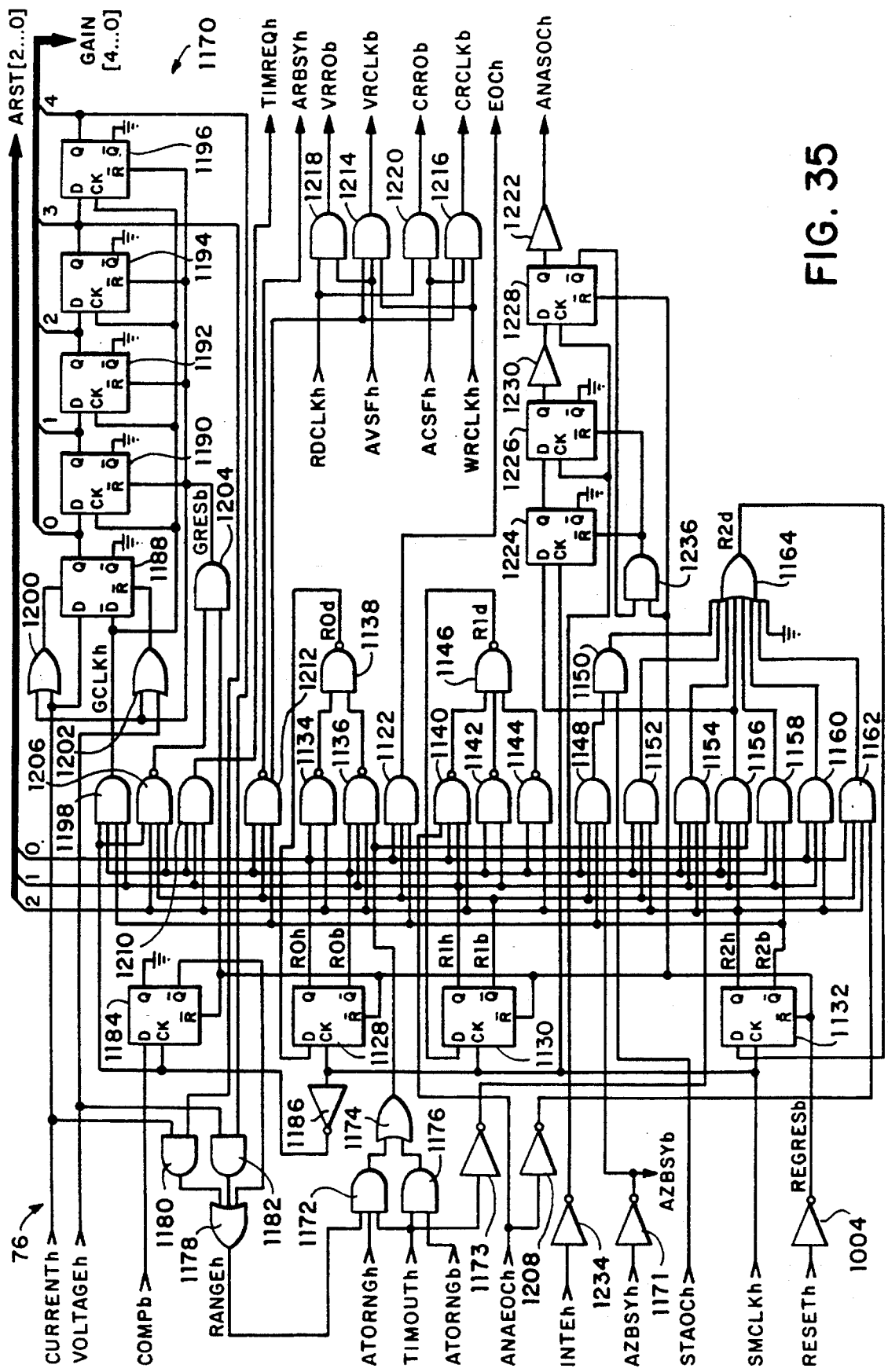
FIG. 35 is a schematic diagram of the auto-range state machine in accordance with the present invention.
Figure 36:
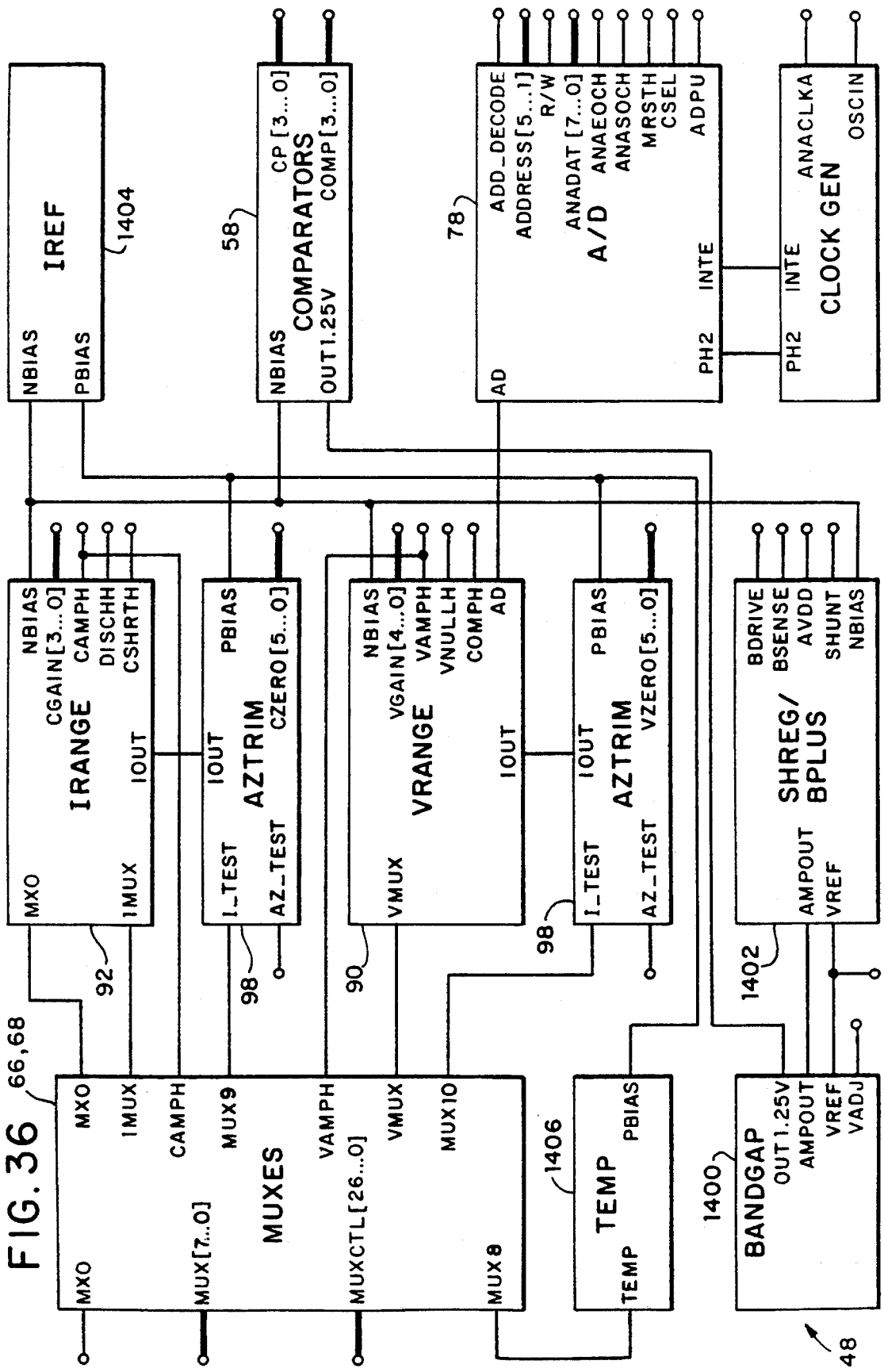
FIG. 36 is an overall block diagram of the analog circuitry in accordance with the present invention.

A REGRESb signal is applied to the reset inputs R of the flip-flops 944, 946, 948, 950, 952 and 954. The REGRESb signal is available at the output of an inverter 1004 (FIG. 35). The input to the inverter 1004 is the signal RESETh from the CPCTL[3 . . . 0] bus.

The current scale factor register ACSF is a read-write register used to control the operation of the current input auto-ranging circuitry. The value written to this register determines the current subsystem auto-ranging operating mode. When zero is written the current subsystem is placed in an auto-ranging mode. A non-zero value inhibits the auto-ranging mode and sets the current mirror into a fixed scale value. The register is not a true read-write register. In other words, the value read from it is not necessarily the value that was written into it. Although writing a zero into the ACSF register enables the auto-ranging mode, a zero will never be read from it.

The ACFR register (FIG. 34) includes the flip-flops 1006, 1008, 1010, 1012, 1014. The data bus DATA[4 . . . 0] is applied to the D inputs of these flip-flops for write operations in a fixed gain mode. A NAND gate 1048 detects nonzero values written to this register to enable a fixed gain mode. The D inputs of the flip-flops 1006, 1008, 1010, 1012 and 1014 are tied to a buffer amplifier 1016. The input to the buffer amplifier 1016 is a signal CRCLKb, which will be discussed in connection with the auto-range state machine. The CRCLKb signal latches the gain value in this register at the completion of the autoranging sequence. The signal REGESSb is applied to the reset inputs R. The MUXes 1018, 1020, 1022 and 1024 allow the Q outputs of the flip-flops 1006, 1008, 1010 and 1012 to be connected to the GAIN[4 . . . 0] bus, indicating that the auto-range function has been selected, or to MUXes 1026, 1028, 1030 and 1032. The CGAIN[3 . . . O] bus is applied to the current mirror 92 (FIG. 46) to control the divider ratio of the current mirror 92. The MUXes 1026, 1028, 1030 and 1032 either allow the output signals Q from the flip-flops 1006, 1008, 1010 and 1012 to either be grounded or applied to the gain bus CGAIN[3 . . . O] or tied to tristate devices 1034, 1036, 1038 and 1040 to allow the them to be read at the data bus DATA[3 . . . 0]. More specifically, the Q output of the flip-flop 1006 is applied to a B input of the MUX 1018. An A input of the MUX 1018 is applied to the gain bus bit GAIN[3]. The Q output of the flip-flop 1006 is also applied to inputs of OR gates 1042, 1044 and 1046. The Q output of the flip-flop 1008 is also applied to other inputs of the OR gates 1042, 1044 and 1046. Also, the Q output of the flip-flop 1010 is applied to the OR gates 1044 and 1046. Lastly, the Q output of the flip-flop 1012 is also applied to an input of the OR gate 1046.

The outputs of the OR gates 1042, 1044 and 1046 are applied to the B inputs of the MUXes 1020, 1022 and 1024. The fixed gain bus bits GAIN[3 . . . 0] are applied to the A inputs of the MUXes 1018, 1020, 1022 and 1024. The MUXes 1018, 1020, 1022 and 1024 are under the control of a NAND gate 1048. The NAND gate 1048 generates a CRZEROh signal which indicates that the microprocessor 30 has written a zero to the ACSF register to initiate current auto-ranging. A non-zero value written to this register which places the current mirror 92 into a fixed scale value. The Q outputs of the flip-flops 1006, 1008, 1010, 1012 and 1014 are applied as inputs to the NAND gate 1048. If a zero is written into the ACSF register the MUXes 1018, 1020, 1022 and 1024 connect the Q output of the flip-flop 1006 and the Q outputs of the flip-flops 1008, 1010 and 1012 to the gain bus GAIN[4 . . . 0]. Non-zero values written into the ACSF register causes the MUXes 1018, 1020, 1022 and 1024 to be connected to the A inputs of the MUXes 1026, 1028, 1030 and 1032. The B inputs of the MUXes 1026, 1028, 1030 and 1032 are grounded. The MUXes 1026, 1028, 1030 and 1032 are under the control of an AND gate 1049 which disables the auto-ranging of the current amplifier 70 when the system is in a voltage mode. In this condition, the output signals from the flip-flops 1006, 1008, 1010 and 1012 are grounded. There are two inputs to the AND gate 1049. One input to the AND gate 1049 is from the NAND gate 1048. The output of a NAND gate 1048 indicates that auto-ranging has not been selected. The Q outputs of the flip-flops 1006, 1008, 1010, 1012 and 1014 are applied as inputs to the NAND gate 1048. The other input to the AND gate 1049 is an inverter 1050. The output of the inverter is a VOLTAGEh signal which indicates that the MUX 66 is in a voltage mode. The input to the inverter 1050 is the output of the AND gate 1002 which indicates that the MUX 66 is in a current mode. The inputs to the AND gate 1002 is a MXOSELh signal (FIG. 30) which indicates that a current mode has been selected. The outputs of the MUXes 1026, 1028, 1030 and 1032 are connected to a pair of serially coupled inverter amplifiers 1052, 1054, 1056, 1058, 1060, 1062, 1064 and 1066. The outputs of the inverters 1054, 1058, 1062 and 1066 are applied to the gain bus CGAIN[3 . . . 0] as well as to the tristate devices 1034, 1036, 1038, 1040 either directly or by way of AND gates, 1068, 1070 and 1072. More specifically, the output of the inverter amplifier 1054 is applied to the tristate device 1034. The output of the inverter amplifier 1058 is applied to an AND gate 1068 along with the output of the inverter amplifier 1052. The output of the inverter amplifier 1062 is applied to the AND gate 1070 along with the output of the inverter amplifier 1056. The output of the inverter amplifier 1066 is applied to the input of the AND gate 1072 along with the inverter amplifier 1060.

These tristate devices 1034, 1036, 1038 and 1040 are also applied to the data bus DATA[3 . . . 0] to allow the ACSF register to be read. The output of the inverter amplifier 1064 is applied to a tristate device 1068. This tristate device 1068 is applied to the DATA[4] bit. The tristate devices 1034, 1036, 1038, 1040 and 1068 are controlled by a signal CRRDb. This signal will be identified in connection with the auto-range state machine.

A signal AZST[2 . . . 0], representative of the states of the auto-zero state machine, is applied to AND gates 1070, 1072 and 1074. This signal represents the Q output signals Of the auto-zero state register flip-flops 836, 838 and 840 (FIG. 33). Also applied to the AND gates 1070, 1072 and 1074 are test signals. The TEST signals are also applied to the reset input R of the flip-flop 954. The outputs of the AND gates 1070, 1072 and 1074 are applied to tristate devices 1076, 1078 and 1080. The outputs of the tristate devices 1076, 1078 and 1080 are applied to the data bus DATA[7 . . . 5] to allow these signals to be read by the microprocessor 30. The tristate devices 1076, 1078 and 1080 are under the control of a signal CRRDb.

The states of the auto-range state machine ARST[2 . . . 0] are applied to the inputs of AND gates 1082, 1084 and 1086. Test signals are also applied to the inputs of the AND gates 1082, 1084 and 1086. The ARST[2 . . . 0] signal represents the states of the auto-ranging state register flip-flops and will be discussed in connection with the auto-ranging state machine. The outputs of the AND gates 1082, 1084 and 1086 are applied to tristate devices 1088, 1090 and 1092. The outputs of these tristate devices are applied to the data bus DATA[7 . . . 5]. The tristate devices 1088, 1090 and 1092 are under the control of a VRRDb signal. This signal controls the reading of the auto-range state register flip-flops states by the microprocessor 30 and will be discussed in connection with the auto-range state machine.

AUTO-RANGE STATE MACHINE

The auto-range state machine is illustrated in FIG. 35. A state transition table, state diagram and transition state equations are provided in Appendix D.

This state machine auto-ranges the voltage 80 and current 90 amplifier gains before initiating an analog to digital conversion. During voltage autoranging, the output signals of the voltage amplifier 80 is compared with a predetermined value by the comparator 74 (FIG. 44) to determine if the amplifier output is either too large or out of range of the A/D. At the start of the autoranging a gain shift register 1170 (FIG. 35) is initialized and incremented during a predetermined time period (TIMOUTh). When either the comparator 74 switches state or the time period expires, the value of the gain shift register will represent the gain. This gain value is stored in the AVSF register and is used to control the ranging circuitry 84.

During current autoranging, ranged currents are directed out of the MXO pin and applied to an external resister. The voltage across the external resister is then applied to a voltage input. Ranging is then accomplished in a similar manner as the voltage autoranging. Gain values in this mode are stored in the ACSF register.

The auto-range state machine includes three state register flip-flops 1128, 1130 and 1132; NAND gates 1134, 1136, 1138, 1140, 1142, 1144, 1146; AND gates 1148, 1150, 1152, 1154, 1156, 1158, 1160 and 1162; OR gate 1164 and various output gates connected as shown in FIG. 35. The Q outputs of the state flip-flops 1128, 1130 and 1132 indicate the state variables R0h, R1h and R2h. The Q output of the state register flip-flops 1128, 1130 and 1132 generate the state variables R0b, R1b and R2b. The state variable R0d is generated at the output of the NAND gate 1138. The state variable R1d is generated at the output of the NAND gate 1146. The state variable R2d is generated at the output of the OR gate 1164.

Each of the state register flip-flops 1128, 1130 and 1132 is clocked by the SMCLKh signal. The reset signal REGRESb, available at the output of the inverter 1004, is applied to the reset inputs R of these state register flip-flops.

The outputs of the state register flip-flops 1128, 1130 and 1132 define permissible output states for the auto-range state machine in accordance with Table D-1, Appendix D. The state register flip-flops 1128, 1130 and 1132 allow for eight states. However, only seven are necessary and are defined as follows:

S0—Idle. The state machine is in the idle state waiting for a start auto-range signal (STADCh) to be active. The state machine also stays in the idle state as long as the auto-zero state machine is busy. This interlock between the two independent state machines is implemented by the auto-range busy signal (ARBSYh). When the state start auto-range signal is active and the auto-range busy signal is inactive the auto-zero state machine moves to state S1.

S1—Reset shift register. State S1 initializes a shift register 1170 for the type of conversion. For a voltage conversion the shift register 1170 is initialized to the binary value 0001 where the least significant set bit is set. This corresponds to a voltage gain of 1. For a current conversion the shift register 1170 is set to the binary value 00000. This corresponds to a current gain of 1. Only the four least significant bits are used for setting the current gain. The least significant bit is set or cleared by the GRESh signal by additional decoding of the VOLTAGEh and CURRENTh signals.

S2—Five microsecond delay. State S2 and S3 form a loop that is repeated until either the comparator 74 (FIG. 3) output switches or the shift register 1170 reaches the final gain. During S2, the time request signal (TIMREQh) is active in the time-out (TIMOUTh) signal is monitored. When the time request signal goes active the state machine enters the state S1, this triggers the five microsecond time delay. When the time delay has timed out, the time-out signal becomes active. This causes the state machine to transfer either to state S3 or S4. State S3 is entered if the RANGEh signal is inactive indicating that either the gain setting is not high enough yet or the shift register 1170 has not yet reached the final gain setting. The final gain setting is detected by decoding the VOLTh and CURRh signals with the fourth and fifth bits of the shift register 1170. For a current channel, indicated by an active CURRh signal, a fourth bit indicates that a maximum gain has been reached. Maximum gain for a voltage channel is decoded by a fifth bit of the shift register 1170 and an active VOLTh signal.

The state machine transfers to state S4 when the RANGEh signal is active, if the auto-range function is active. If the auto-range function is disabled indicated by an inactive ATORNGh signal, the state machine transfers to state S4 after the five microsecond time delay. This five microsecond time delay permits the amplifier 80, 90 to settle and reach a stable output value.

S3—Clock shift register. State S3 is entered when the shift register 1170 does not yet contain a maximum gain and the gain is not enough to generate a sufficiently high input signal. The clock signal is active in state S3 causing the shift register 1170 to shift one bit. For voltage channel signals a zero is shifted into the least significant bit of the shift register 1170. This causes the shift register to shift a one across the register generating the following sequence of values: 00001, 00010, 00100, 01000, 10000.

For current channels a 1 is shifted into the least significant bit which results in the following sequence of values: 00000, 00001, 00011, 00111, 01111. Only the four bits of the gain are used in setting the current amplifier 90. The state machine always transfers to the state S2 on the next clock pulse.

S4—General SOC pulse. State S4 is used to generate a start of conversion pulse to the analog digital converter. The state machine stays in state S4 until the SOC3b signal becomes active at which time the state machine moves to state S5. The SOC3b signal is active when the start of conversion pulse has been active for three state machine clock periods.

S5—Wait for conversion. The state machine is waiting for the analog end of conversion signal while in state S5. When the analog end of conversion goes high indicating that the conversion has finished, the state machine transfers to state S6.

S6—EOC pulse. End of Conversion EOAZh is active in state S6. This indicates to the commands/status register section that the conversion process has been completed.

AUTO-RANGE INPUTS

The inputs to the auto-range state machine are as follows:

AZBSYh—Auto-Zero Busy. This signal is active high when the auto-zero state machine is not idle. This signal is applied to the state machine by way of an inverter 1171.

Figure 34:
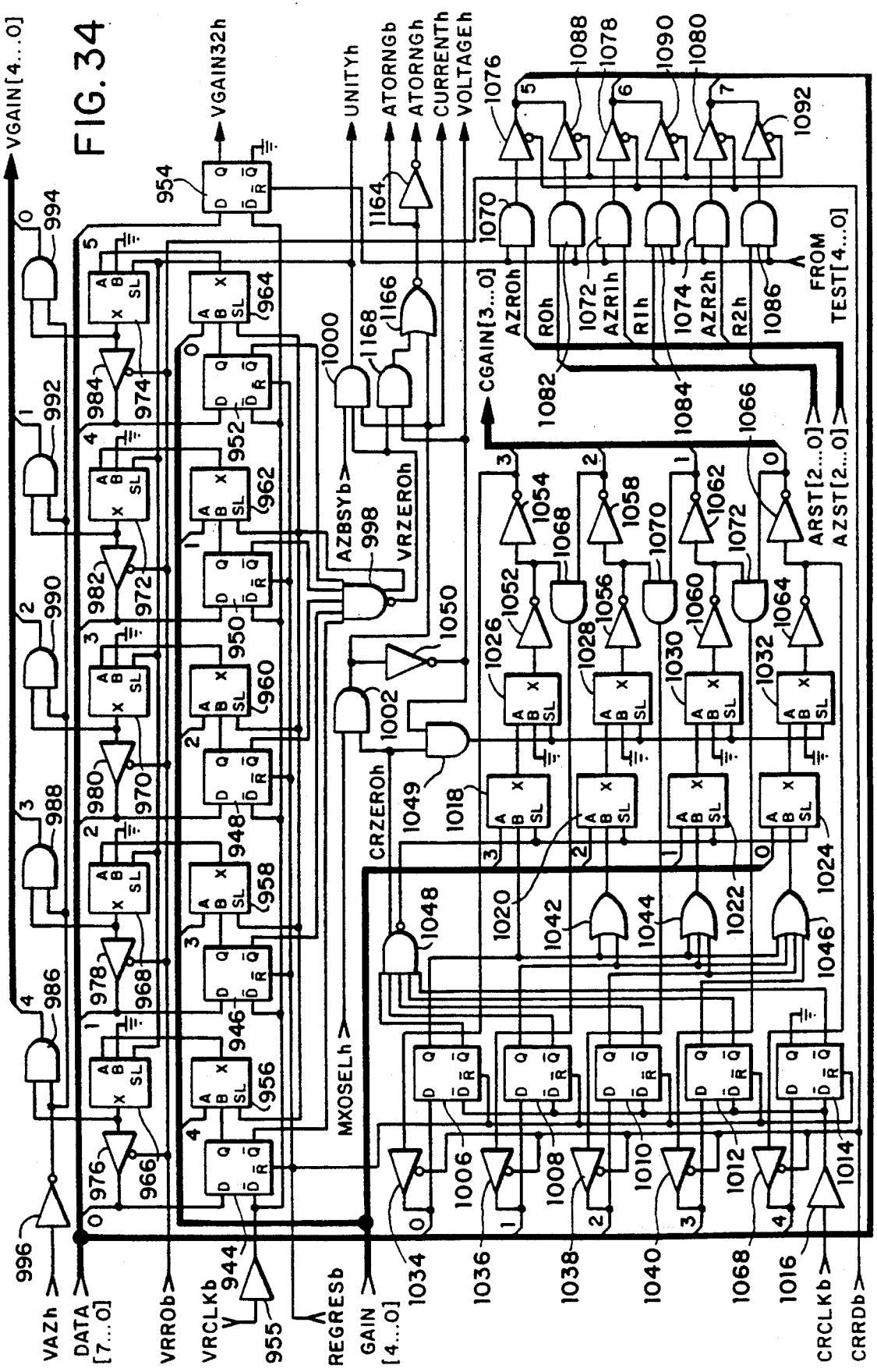
FIG. 34 is a schematic diagram of the auto-range control logic in accordance with the present invention.

ATORNGH—Auto-range Active. The auto-range active signal ATORNG represents that the auto-ranging has been activated when the microprocessor 30 writes a zero into a shift register 1170. More specifically, the ATORNGh signal is available at the output of an inverter 1164 (FIG. 34) while the ATORNGb signal is available at the output of a dual input NOR gate 1166 (FIG. 34). The NOR gate 1166 is controlled by two AND gates 1168 and 1002. The VOLTAGEh signal is applied to one input of the AND gate 1116. The signal VRZEROh is applied to the other input. The output of the AND gate 1002 in applied to the other input of the NOR gate 1166. The output of the AND gate 1002 indicates that the current mode has been selected and that the microprocessor has a zero to the ASCF register to initiate auto-ranging.

The ATORNGb and ATORNGh signals are applied to the state machine by way of circuitry which includes an AND gate 1172, an inverter 1173, an OR gate 1174 and an AND gate 1176. The OR gate 1174 is a two-input OR gate. One input is from the AND gate 1172. The AND gate 1172 is a three-input AND gate. The ATORNGb, TIMOUTh and RANGEh signals are applied to the AND gate 1172. The other input to the OR gate 1174 is from a two input AND gate 1176. One input to the AND gate 1176 is the ATORNGb signal. The other input is the TIMOUTh signal.

RANGEh—In Range Signal. This signal is active high to indicate that either the comparator 74 output signal COMPb has gone low or that the gain shift register 1170 has reached the maximum gain setting for the operating mode selected. The auto-ranging sequencing circuitry 76 includes the gain register 1170, an OR gate 1178, AND gates 1180 and 1182 and a flip-flop 1184. The RANGEh signal is available at the output of the NOR gate 1178.

The gain shift register 1170 is comprised of the flip-flops 1188, 1190, 1192, 1194 and 1196. The Q outputs of these flip-flops are tied to the D input of the next flip-flop in succession. The Q outputs are also tied to the gain bus GAIN[4 . . . 0]. A GCLKh signal is applied to the clock CK inputs of each of these flip-flops. The GCLKh signal is available at the output of an AND gate 1198. The inputs to the AND gate 1198 are the state register signals R0b, R1h and R2b which indicate the auto-range state machine is in S3. Also applied to the AND gate 1194 is the signal SMCLKb.

The GCLKh signal is used to shift a zero into the flip-flop 1188 when a voltage channel has been selected and to shift a 1 into the flip-flop 1188 when a current channel has been selected. More specifically, OR gates 1200, 1202, AND gate 1204 and a NAND gate 1206 control this function. A CURRENTh signal which is active high is applied to the input of the OR gate 1200. The other input to the OR gate 1200 is a signal GRESb available at the output of the AND gate 1204. The output of the OR gate 1200 is applied to the preset input of the flip-flop 1188 to shift a 1 into this flip-flop. This value is shifted across the shift register by the GCLKh signal.

Similarly, a VOLTAGEh signal is applied to one input of the OR gate 1202. The other input to the OR gate 1202 is a GRESb signal. The output of the OR gate 1202 is applied to the reset input R of the flip-flop 1188 to shift a zero into this flip-flop when the voltage channel is selected.

The comparator 74 output signal COMPb is monitored by the flip-flop 1184. The SMCLKb signal is applied to the clock CK input of this flip-flop. The REGRESb signal is applied to the reset input R. The output of this flip-flop indicates that the comparator 74 output signal has not yet switched which means that the comparator 74 output signal is less than, for example, 1.25 Vdc to indicate that one-half the maximum has not been reached. This signal is applied to one input of the OR gate 1178. The other inputs to the OR gate 1206 are from the outputs of the AND gates 1180 and 1182. These AND gates indicate that the shift register 1170 has reached the maximum gain setting for the operation modes specified. More specifically, the AND gate 1180 relates to the current mode. The CURRENTh signal is applied to one input of the AND gate 1188. The other input is from the output of the shift register flip-flop 1194 which when active indicates the highest gain setting when the current mode is selected.

Similarly, the VOLTAGEh signal is applied to an input of the AND gate 1182. The other input to the AND gate 1182 is the output of the shift register flip-flop 1196 which represents the highest gain setting when the voltage mode is selected.

The outputs of the AND gates 1180 and 1182 are applied to the inputs of the OR gate 1178 along with the Q output of the flip-flop 1184 to generate the RANGEh signal. The RANGEh signal indicates that either the comparator 74 output signal COMPb has gone low or that the gain shift register 1170 has reached the maximum gain setting for the operating mode selected.

TIMOUTh—Time Out. This signal is active high when the five microsecond time delay has expired. This signal is available at the output of the NAND gate 870 (FIG. 32).

SOC3b—Start of Conversion Three. This signal is active low when the start of conversion pulse has been active for three clock periods.

ANAEOCh—Analog End Of Conversion. This signal is active high when the A/D 78 has finished the conversion. This signal is applied to the AND gate 1140 and to the AND gate 1162 by way of an inverter 1208.

RESETh—Reset. This signal is active high to reset the state register flip-flops during system reset.

STADCh—Start Conversion. This signal is active high when the AMUX register is written. This signal is discussed below.

AUTO-RANGE OUTPUTS

The output signals of the auto-range state machine are as follows:

GRESh—Gain Shift Register Reset. This signal is active high to reset the shift register 1170 used to generate the gain. This signal is active in state S1.

GCLKh—Gain Shift Register Clock. This signal is active high to shift the shift register and is active in state S3.

TIMREQh—Time Request. This signal is active high to request a five microsecond delay period. This signal is active in state S2. The TIMREQh signal is generated at the output of an AND gate 1210. The signals R0b, R1h and R2h are applied to the input of the AND gate 1210 to generate the TIMREQh signal when the auto-range state machine is in state S2.

ARBSYh—Auto-Range Busy. This signal is active high to indicate when a conversion operation is active. This signal is also used to interlock the auto-zero and auto-range state machines. The ARBSYh also inhibits the microprocessor 30 from writing to the gain registers by disabling the NAND gates which decode the register select signals (AVSFh, ACSFh) and the write clock WRCLKh signal. This signal is active in states S1, S2, S3, S4, S5 and S6 and is available at an inverting output of a NAND gate 1212. The state variables R0b, R1B, R2b are applied to the inputs to the NAND gate 1212 to generate the ARBSYh signal in states S1, S2, S3, S4, S5 and S6.

The signal ARBSYb is used to control write and read operations to the ASCF and AVSF registers. More specifically, ARBSYb signals inhibits the microprocessor 30 from reading or writing to the ASCF or AVSF registers when the auto-range state machine is active. The signal ARBSYb is generated at a non-inverting output of the NAND gate 1212. A non-inverting output of this NAND gate is applied to inputs of NAND gates 1214 and 1216. The AVSFh signal, which is generated when the microprocessor 30 places the address $0026 on the address bus ADDR[5 . . . 0], is applied to the NAND gate 1214 and an AND gate 1218. An ACSFh signal is applied to the inputs of the NAND gate 1216 and a NAND gate 1220. This ACSFh signal is generated any time the microprocessor 30 places the address $0027 on the address bus ADDR[5 . . . 0]. The RDCLKh signal is applied to the inputs of the NAND gates 1218 and 1220. The WRCLKh signal is applied to the inputs of the NAND gates 1214 and 1216. The outputs of the NAND gates 1214 and 1218 are the VRRDb and VRCLKb signals, which are used to control read and write operations to the AVSF register. The outputs of the NAND gates 1216 and 1220 are the CRRDb and CRCLKb signals which are used to control read and write operations to the ACFS register.

EOCh—End of Conversion. This signal is active high which sets a flip-flop in the status register to indicate that the conversion process has finished. It also clears the flip-flop 1246 (FIG. 26) which generates the STADCh signal and is active in state S6. This signal is available at an output of an AND gate 1222. The signals R0h, R1b and R2b are applied to the inputs of this AND gate to generate the EOCh signal only when the state machine is in state S6.

ANASOCh—Analog Start of Conversion. This signal is active high to initiate an analog to digital conversion and is active for three clock cycles. This signal is active in state S4. The analog of start of conversion signal ANSOCh is generated by circuitry which includes flip-flops 1224, 1226 and 1228, buffer amplifiers 1230, 1232 and 1234 and an AND gate 1236. This signal is active high for three clock cycles and is active in state S4. A signal representing that the auto-range state machine is in state S4 is available at the AND gate 1156 and applied to the D input of the flip-flop 1224. The state machine clock signal SMCLKh is applied to the clock input of the flip-flop 1224. The Q output of the flip-flop 1170 is applied to the D input of the flip-flop 1226. The Q output of the flip-flop 1226 is applied to the input of a buffer amplifier 1230. The output of the buffer amplifier 1230 is applied to the D input of the flip-flop 1228. The Q output of the flip-flop 1228 is applied to the buffer amplifier 1232 and represents the analog start of conversion ANAS-OCh. The AND gate 1236 controls resetting the flip-flops 1224 and 1226 after the flip-flop 1228 is reset. More specifically, the REGRESb signal is applied to one input of the AND gate 1226 as well as to the reset input of the flip-flop 1228. The Q output of flip-flop 1228 is applied to the other input of the AND gate 1236. The output of the AND gate 1180 is applied to the R reset inputs of the flip-flops 1224 and 1226.

The clock inputs of the flip-flops 1226 and 1228 are controlled by the microprocessor 30 interrupt signal INTEh. More specifically, the interrupt signal INTEh, which is active high is applied to the input of an inverter 1234. The output of inverter 1234 is applied to the clock CK inputs of the flip-flops 1226 and 1228.

AUTO-RANGE STATE MACHINE OPERATION

The auto-range function is initiated by the software writing to the AMUX register. More specifically, a STADCH signal (FIG. 26) is active high whenever the register AMUX is written to by the microprocessor 30. This signal STADCH is available at the output of an AND gate 1238. One input to the AND gate 1238 is a test circuit. The other input to the AND gate 1238 is from circuitry which includes buffer amplifiers 1240, 1242, 1244; flip-flops 1246, 1248, 1250; a NAND gate 1252 and AND gates 1254 and 1256. The WRCLKh signal is applied to one input of the AND gate 1254. This signal indicates that the microprocessor 30 is writing to one of the registers. An AMUXh signal is applied to the other input of the AND gate 1254. The AMUXh signal represents that the microprocessor 30 has written to the AMUX register by writing the address $0021 on the ADDR[5 . . . 0] bus. The output of the AND gate 1254 is a begin conversion signal BEGCONh which indicates that the AMUX register has been written to. This BEGCONh signal is applied to the input of the NAND gate 1252. The other input to the NAND gate 1252 is from the TEST[4 . . . 0] bus. The output of the NAND gate 1254 is applied to the D input of the flip-flop 1250 by way of the NAND gate 1252. The other input to the NAND gate 1252 is from test circuitry. The output of the flip-flop 1250 is applied to the input of a flip-flop 1248. The R input of the flip-flop 1250 is connected to the output of the AND gate 1256. The AND gate 1256 is a two input AND gate. The RESETb signal available at the output of the inverter amplifier 516 is applied to one input. An ARBSYh signal is applied to the other input by way of the inverter amplifier 1244. The AND gate 1256 resets the flip-flop 1250 when the auto-range state machine is busy. A Q output of the flip-flop 1250 is applied to a D input of the flip-flop 1248. The output of the flip-flop 1248 is applied to the input of the buffer amplifier 1242. The output of the buffer amplifier 1242 is applied to the input of the flip-flop 1246. The clock inputs of the flip-flops 1246 and 1248 are tied to the output of the inverter 527. The SMCLKb is applied to the input of the inverter 527. The reset inputs R of both of the flip-flops 1246 and 1248 are controlled by the RESETb signal. The output of the flip-flop 1246 is applied to the input of a buffer amplifier 1240. The output of the buffer amplifier 1240 is applied to the other input of the AND gate 1236 to generate the STADCh signal to indicate that the microprocessor 30 has written to the AMUX register.

When the AMUX register has been written to, the control circuitry requests that the auto-range operation be performed followed by an analog digital conversion. More specifically, the auto-range state machine performs the following functions. First, the shift register 1170 is initialized. The output of the shift register 1170 is tied to a GAIN[4 . . . 0] bus which sets the gain for the amplifier. The initial state of the shift register 1170 depends on whether the voltage or current channel has been selected for conversion. If a voltage channel has been selected, the initial value is a binary 00001. If a current channel has been selected the initial value of the shift register 1170 will be a binary 0000. Next a five microsecond setting delay is timed. The TIMOUTh signal will be active high at the output of the five microsecond delay. When the TIMOUTh signal is active, the output of a comparator 74 is checked. If the comparator 74 has switched or if the maximum gain setting has been reached, a start of conversion signal is generated. Otherwise the gain is increased and the delay is timed again.

After the conversion has been initiated, the auto-range state machine waits for an end of conversion signal ANAEOCh to inform the microprocessor 30 to generate a processor interrupt.

A/D CONTROL LOGIC

The A/D converter 78 is an eight bit successive approximation A/D converter. The ranging circuitry for the voltage 80 and current amplifier 90 provides an additional four bits of dynamic range. The A/D converter 78 is described in detail in Section 7 of *MC68HC11A8 HCMOS SINGLE-CHIP MICROCOMPUTER* by Motorola, copyright 1987, hereby incorporated by reference.

ANALOG CONTROL LOGIC

The function block diagram for the analog control logic is shown in FIG. 3. This figure, in connection with the block diagram shown in FIG. 36 will be used to explain the analog control logic.

These figures illustrate the control logic for the current and voltage channel MUXes 66 and 68, zeroing of the voltage amplifier 80 and the current amplifier 90 and ranging of the voltage amplifier 80 and the current mirror 92. Also illustrated is an analog power supply subsystem 48 which consists of a band gap regulator subsystem 1400, a shunt regulator 1402 and the power monitor portion of subsystem 46. Biasing circuitry 1404 is illustrated for the quadcomparator subsystem 58 (FIG. 38), the band gap regulator 1400, the B$^+$ comparator subsystem 50, the power monitor subsystem 46, the voltage amplifier 80 and the current amplifier 90. Lastly, temperature monitoring circuitry 1406 is illustrated which allows the microprocessor 30 to read the ambient temperature.

MUX CONTROL

The MUXes 66 and 68 are illustrated in FIG. 37. The input channels MUX0, MUX1, MUX2 and MUX3 can be used for either voltage inputs or current inputs. The input channels MUX4 and MUX5 can only be used for voltage channels. The channel MUX8 is for temperature sensing while the MUX 66K is tied to analog ground. More specifically, the input channels are configured by MUXes 66a–66g. The MUXes 68a–68d allow the input channels MUX0, MUX1, MUX2 and MUX3 to be tied to the current channel IMUX. The MUXes 68e–68h allow the input channels to be tied to digital ground VSS.

Sample and hold MUXes 108, 110 and 112 are connected between the channels MUX0 and MUX1, MUX2 and MUX3, and MUX4 and MUX5, respectively. A sample and hold switch, shown connected between channels MUX6 and MUX7, is reserved.

ANALOG POWER SUPPLY

The analog supply pins AVDD and AVSS are used to provide power to the analog portion of the IC 10. The analog supply pin AVDD is designed to be connected to a current source. The IC 10 contains an internal shunt regulator (FIG. 40A) to regulate the voltage on the AVDD pin to approximately 5.0 Vdc. More specifically, the analog power supply consists of a 2.5 Vdc reference and a shunt regulator subsystem 1402. The 2.50 Vdc reference contains a +1.25 Vdc band gap regulator reference circuit 1406 (FIG. 39) and a buffer amplifier 1412 to generate a +2.50 Vdc reference: VREF. An adjustment pin VADJ is provided to allow the voltage to be trimmed to exactly +2.5 Vdc ±0.5 Vdc. In order to trim the reference, a two resistor voltage divider 1410 which includes resistors 1414 and 1416 is connected between the VREF and AVSS pins with the mid-point connected to VADJ. The buffer amplifier 1412 has a source follower output such that it can only source current. This will permit multiple devices to be paralleled. Also, the regulator of the IC 10 can be slaved to another by connecting its VADJ pin to the VREF pin.

The band gap regulator subsystem 1406 is illustrated in FIG. 39. A band gap reference is a precision voltage reference. In general, the band gap reference circuit utilizes as a reference the base-to-emitter voltage of a parasitic transistor which has a negative temperature coefficient (–TC) connected in series with a resistor which has a voltage developed across a resistor having a a positive temperature coefficient (+TC). The voltage developed across the resistor is a function of a predetermined current supplied to the resistor from circuitry internal to the band gap regulated reference. The difference in temperature coefficients between the base-to-emitter voltage of the parasitic transistor and the voltage cross the series connected resistor provides a voltage reference signal having an essentially zero temperature coefficient. As the base-to-emitter voltages of the parasitic transistors decreases with an increase in temperature, the voltage across the current-fed series connected resistor increases generally proportionally to provide an output reference voltage which remains relatively constant. This reference voltage is then applied to a noninverting input of an amplifier and the inverting input of the amplifier is connected to an externally resistive divided portion of the output of the amplifier. The output of the amplifier is a voltage proportional to the reference voltage, relatively independent of temperature.

More specifically, the output of the band gap regulator reference circuit 1406 is nominally 1.25 Vdc. This output voltage is doubled by a buffer comparator 1412 and the external resistors 1414 and 1416 to produce a +2.5 Vdc reference at the external pin VREF. The external resistors 1414 and 1416 are connected in series between the output of the buffer comparator 1412 and an analog ground pin AVSS. The midpoint of these resistors 1414 and 1416 is connected to the inverting input of the buffer comparator 1412 to allow the reference voltage VREF to be adjusted. The band gap regulator circuit includes diode connected parasitic transistors 1426 and 1428, a transistor 1418, resistors 1420, 1422 and 1424 and a comparator 1441. Start-up circuitry 1432 is provided for the condition when power is first applied to the IC 10. The start-up circuitry 1432 includes the transistors 1434, 1436 and 1438. During this condition, voltages begin to rise from a zero level to a level that will ultimately be regulated by the band gap reference circuit 1406. Initially there is no current in any of the devices. In this condition, the transistor 1438 is biased on by a PBIAS circuit 1440 which will be discussed below. This, in turn, turns on the transistor 1434 to generate a current that flows into a diode connected parasitic transistor 1428. This produces a voltage at the transistor 1428 which is applied to a non-inverting input of the comparator 1441. That generates a positive signal at the output of the comparator 1441 which, in turn, turns on the transistor 1418 and produces currents in the transistors 1426 and 1428. Consequently, the band gap reference approaches a stable regulating point based upon the voltages across the diode connected transistors 1426 and 1428. When these voltages reach a steady state value, the transistor 1436 is turned on which turns off the transistor 1434, in which case all of the current is generated by the transistor 1418.

During regulation, the current applied to the emitters of the transistors 1426 and 1428 is essentially equal. This is because the resistors 1420 and 1424 are the same value and are relatively large compared to the other voltage drops. The base emitter voltage across transistors 1426 and 1428 is dependent upon the current density through these transistors. The current density is the total current divided by the area of the transistors. The current densities of the transistors 1426 and 1428 are different by a factor of 11 to 1, thus, their base emitter voltages will be different. The difference in base emitter voltages appears across the resistor 1422. Since the temperature coefficient is a function of the voltage across the device, as the base emitter voltage across the transistors 1426 and 1428 goes down, their negative temperature coefficient increases. Due to the relative current density in the transistor 1426 relative to the current density in the transistor 1428, the series combination of the resistor 1422 and transistor 1426 will have a positive temperature coefficient (+TC) and is applied to an inverting terminal of comparator 1441. The base emitter voltage of the transistor 1428, which has a negative temperature coefficient (–TC), is applied to a non-inverting terminal of the comparator 1441. As the temperature changes voltage across the base emitter junctions of the transistors 1426 and 1428, the voltage across the resistor 1422 will change by a proportional amount, thus yielding an output signal from the comparator 1440 that is relatively temperature independent.

SHUNT REGULATOR

The shunt regulator 1400 (FIG. 40A) provides a nominal +5.0 Vdc at the AVDD pin based on the reference voltage at VREF. The shunt regulator 1400 includes an amplifier 1443 and resistors 1444 and 1446. More specifically, the output VREF from the buffer comparator 1412 is applied to a non-inverting input of a amplifier 1443. The AVDD bus is the regulated 5.0 Vdc supply. The inverting terminal of the amplifier 1443 is connected to the AVDD bus by way of the resistor 1444. The inverting terminal of the amplifier 1443 is also connected to the AVSS bus by way of the resistor 1446. The resistors 1444 and 1446 have equal value which causes the output of the amplifier 1443 to be twice VREF. Since VREF is nominally 2.5 volts, the regulated supply bus AVDD will nominally be 5.0 volts. A shunt element transistor 1447 is connected between AVDD and AVSS. The gate of the shunt element is controlled by output of the amplifier 1443. When the regulated supply AVDD becomes a little too high, the negative terminal of the amplifier 1443 will be a little higher than VREF. This will drive the output of the amplifier 1443 negative. This, in turn, will cause a shunt transistor 1447 to turn on a little bit more. This draws current away from the supply bus AVDD and brings the voltage down until the two inputs to the amplifier 1443 are essentially identical.

The circuitry which includes the transistors 1448, 1450 and 1452 is part of the start-up circuitry. Transistors 1448, 1450 and 1452 turn off the shunt transistor 1447 during start-up to avoid sinking a lot of current away from AVDD.

An important aspect of the invention relates to the fact that the IC 10 is current driven. This provides immunity to voltage spikes typical in applications in the automotive industry. More specifically, the IC 10 is driven by an input current, developed by an external resistor 1453 and an external voltage identified as VEXT applied to the AVDD bus.

POWER MONITOR SUBSYSTEM

The circuitry which consists of the transistors 1454, 1456, 1458 and 1460 and the comparator 1462 (FIG. 40A) performs the power on reset and loss of +5.0 Vdc function. Power on reset is a delay of 8128 oscillator cycles plus an additional 1 ms from the time the reset is removed by clearing the external pin RESN.

The series connected transistors 1454, 1456, 1458 and 1460 form a voltage divider circuit. The drain of the transistor 1454 is applied to a non-inverting input of the comparator 1462. The output of the amplifier 1443 is applied to an inverting input of the comparator 1462. The output of the comparator 1462 is a signal SHUNT, an output pin which may be applied to the RESN pin of microprocessor 30 for the power monitor function to reset the microprocessor 30 upon detection of an undervoltage.

The comparator 1462 monitors the conductive state or gate voltage of the shunt transistor 1447. Whenever the shunt transistor 1447 is determined to be off, as indicated by the amplifier 1442 output being at a more positive voltage than the divided voltage at the drain of the transistor 1454, the comparator 1462 output signal shunt will be driven negative indicating insufficient current available to maintain the AVDD bus regulated at 5.0 volts.

B+ COMPARATOR SUBSYSTEM 50

The B+ comparator subsystem (FIG. 40A) is used for power supply generation and includes the following circuitry, resistors 1462, 1464, a comparator 1466 and a transistor 1468. VREF is applied to an inverting input of the comparator 1466 providing a +2.5 Vdc reference. The output of the comparator 1466 is an external pin BDRIVE. Inputs to the comparator 1466 are applied to a non-inverting terminal of the comparator 1466 by way of an external pin BSENSE. The resistors 1464 and the transistor 1468 are exemplary of the hysteresis mask option, available for all comparators. The register 1464 and the transistor 1468 are connected in series to provide feedback from the output of the comparator 1466 to the inverting terminal.

FIGS. 40B and 40C illustrate exemplary circuitry for power supply generation and power supply regulation for the IC 10. FIG. 40B also illustrates the conditioning circuitry 19.

Referring first to FIG. 40B, the IC 10 is used to monitor the condition of the circuit breaker 12 (FIG. 1) by way of the current transformers (CT) 14, 16 and 18. These CT's may be of the donut type which consist of a secondary winding disposed about the A, B and C phase conductors of the circuit breaker 12. During certain loading conditions, the output from the CT's may be of the order of 100 milliamps (ma). In order to reduce this output current to a level suitable for the IC 10, for example, 20 microamps, the signal conditioning circuitry 19 is provided. Various conditioning circuitry may be utilized. It should be understood that the conditioning circuitry illustrated in FIG. 40B is merely exemplary.

The CT's 14, 16 and 18 may be connected to the diode bridge 1467 in various ways. For example, the CT's 14, 16 and 18 may be connected in series with the output connected to the terminals 1469 and 1471. A single CT, for example, the B phase CT 16, may be tied to the bridge 1467. Also, the CT's 14, 16 and 18 may be connected in parallel.

The conditioning circuitry 19 includes a full wave diode bridge 1467 defining a pair of alternating current terminals 1469 and 1471 and a pair of rectified terminals with the positive terminal identified as 1473 and the negative terminal identified as 1475. The conditioning circuitry 19 also includes a resistor 1477 and a resistor 1479. Exemplary values for the resistors 1477 and 1479 are 10 ohms and 50 kilo-ohms, respectively.

The resistor 1477 is connected between the negative terminal 1475 on the bridge 1467 and ground. One side of the resistor 1479 is also tied to the negative terminal 1475. The other side of the resistor 1479 is then connected to one of the MUX inputs MUX0, MUX1, MUX3 or MUX3.

In operation, the current from the current transformers 14, 16 and 18 will flow through the resistor 1477 from ground to the negative terminal 1475 of the bridge 1469 to produce a negative voltage across the resistor 1477. If the value of the resistor 1477 is, for example, 10 ohms, a −1.0 volts will be produced across the resistor 1477 for a CT current of about 10 mA. This will, in turn, cause a −1.0 volt drop across the resistor 1479. If the resistor 1479 has a value of, for example, 50 kilo-ohms, this will, in turn, produce a current of 20 microamps to be applied to one of the current inputs 62 (e.g., MUX0, MUX1, MUX2 or MUX3) to the IC 10 as discussed below.

The exemplary circuitry illustrated in FIG. 40B, identified within the dashed box 1481, in conjunction with the B+ comparator system 50 (FIG. 40A) is used for power supply generation. More specifically, the power supply circuitry 1481 includes a transistor 1483, connected between the positive terminal 1473 of the bridge 1469 and ground with its gate terminal connected to BDRIVE (FIG. 40A). Also connected to the positive terminal 1473 is the anode of a diode 1485. The cathode of the diode 1485 is connected to a terminal, identified in FIG. 40B as B+. A power supply capacitor 1487 is connected between the B+ terminal and ground. A pair of series connected resistors 1489 and 1491 are connected between the B+ terminal and ground with the junction between the resistors 1489 and 1491 identified as BSENSE.

In operation, the comparator 1466 (FIG. 40A) is used to monitor the voltage at the BSENSE junction, a fraction of the voltage at the B+ junction, for example, 2.5 volts, and compare it with the voltage available at the VREF terminal. When the BSENSE voltage is greater than the VREF voltage, the output of the comparator 1466 goes high and turns on the transistor 1483 to shunt excess current to ground. When the voltage at the BSENSE junction drops below VREF, the comparator 1466 goes low which allows the transistor 1483 to be turned off to allow the capacitor 1487 to be charged up the desired value, for example, 30 volts.

FIG. 40C illustrates exemplary circuitry for regulating the voltages at the VDD and AVDD pins and does not form a portion of the present invention.

BIASING CIRCUITRY FOR OPERATIONAL AMPLIFIER OFFSET CORRECTION

Biasing signal PBIAS 1440 for the comparators 1412, 1440 (FIG. 39) and 1442 (FIG. 40A) is illustrated in FIG. 41. Biasing signals PBIAS and NBIAS for the quadcomparator 200, 202, 204 and 206 (FIG. 38), the B+ comparator 1466 (FIG. 40A), the power monitor comparator 1462 (FIG. 40A), the voltage amplifier 80 (FIG. 44) and the current amplifier 90 (FIG. 45) are illustrated in FIG. 42. The PBIAS and NBIAS signals from such circuitry are reference voltages that are used to set the operating current of the particular operational amplifier to which they are applied. The above-mentioned biasing circuitry is in addition to the auto-zeroing circuitry for the voltage amplifier 80 and the current amplifier 90 are illustrated in FIG. 47 and identified as IOUT.

The circuitry illustrated in FIG. 41 is identified by the function block 1440. The PBIAS circuit 1440 includes a transistor 1470 and a resistor 1493, connected in series between AVDD and AVSS, forming a voltage divider. The voltage divider produces a gate to source voltage across the transistor 1470, identified as PBIAS.

The circuitry illustrated in FIG. 42 is used to generate the signals PBIAS and NBIAS for the quadcomparators 200, 202,204 (FIG. 38), the voltage amplifier 80 and the current amplifier 90. This circuitry includes its own band gap regulator reference circuit which includes diode connected parasitic transistors 1472, 1474, resistors 1476, 1478, a comparator 1480 and capacitors 1482 and 1484. These signals are identified as PBIAS/I and NBIAS/I to indicate that the signals are temperature independent since the circuitry includes the band gap reference. This band gap reference operates in a manner similar to the band gap reference 1406 described above with the exception of the additional capacitors 1482 and 1484 are used to control the biasing time of the circuitry. The output of the comparator 1480 is applied to the gates of transistors 1486, 1488 and 1490, forming current mirrors. The current mirrors 1486 and 1488 are used to source the band gap regulator portion of the circuitry. The output current mirror 1490 is the NBIAS/I signal. The current mirror 1490 turns on transistors 1492 and 1494 which develop a gate to source voltage across a transistor 1496 which is the PBIAS/I reference. The transistors 1498, 1500 and 1502 form start-up circuitry for the band gap regulator portion of the circuit.

TEMPERATURE SENSING

The circuitry illustrated in FIG. 42 allows the microprocessor 30 to sense the ambient temperature in which the IC 10 is located. This circuitry includes a transistor 1504 and a diode connected parasitic transistor 1506. The voltage of the parasitic transistors is temperature dependent as previously discussed. The resulting TEMP signal is applied to a MUX 66j and converted to a digital value and read by the microprocessor 30.

VOLTAGE AMPLIFIER RANGING

The voltage amplifier 80 and ranging circuitry is illustrated in FIG. 44. This circuitry includes the voltage amplifier 80, gain circuitry 84 and a plurality of MUXes 86 to produce a voltage signal for A/D conversion that is at least half scale. The voltage ranging may be controlled either automatically or manually to provide gains of 1, 2, 4, 8 or 16 of the input voltage signal VMUX applied to a non-inverting input of the voltage amplifier 80. The gain circuitry includes resistors 84a–84h and MUXes 86a–86f. The gain circuitry is controlled by the VGAIN[4 . . . 0] bus and the gain signal VGAIN32h as previously discussed. The resistor 84i and 1512 form test circuitry.

If the gain is one, the voltage signal is applied directly to the A/D converter 78 by way of a MUX 88a. In this condition the MUXes 86e and 88b disconnect the voltage amplifier 80 from the A/D circuitry 78 and the signal is connected directly to the A/D 78 by the MUX 88a. During ranging, the MUXes 86a–86f connect the gain circuitry 84 to an inverting terminal of the voltage amplifier 80. For gains other than one, the MUX 88b connects the output of the voltage amplifier 80 to the A/D 78. The MUXes 88a and 88b are selected by the AVSF register.

The comparator 74 is used for auto-ranging. This comparator is referenced to a fixed voltage, for example +1.25 Vdc, developed by a pair of serially coupled resistors 1508 and 1510, connected between VREF and AVSS. The midpoint of these resistors 1508 and 1510 is applied to a non-inverting terminal of the comparator 74. The output of the comparator 74 is a CAMPH signal, which is monitored by the flip-flop 1184 FIG. 35 and forms a portion of the auto-range logic as discussed above. The MUX 86f is used for auto-zeroing. This MUX 86f shorts the inverting and non-inverting terminals of the voltage amplifier 80 together to determine the offset correction value. During this condition, the offset value of the voltage amplifier 80 is loaded into the flip-flop 888 (FIG. 33). The MUX 86f is controlled by the VNULL signal available at the output of the buffer amplifier 756 (FIG. 30).

CURRENT AMPLIFIER RANGING

Current amplifier 90 ranging is accomplished by the current mirror 92 (FIG. 45) as previously discussed. Current inputs are applied to the current channel IMUX (FIG. 37). This channel IMUX is tied to the current mirror 92 and to an inverting input of the current amplifier 90. A non-inverting terminal of the amplifier 90 is tied to analog ground to maintain the current input channels MUX0, MUX1, MUX2 and MUX3 at virtual ground. Negative currents (e.g., currents flowing out of the MX0 pin) to be ranged are generated, for example, by connecting an external resistor (not shown) between the MUX0 pin and a negative voltage source. This causes ranged currents to flow out of the MUX0, MUX1, MUX2 or MUX 3 pins since these pins are maintained at virtual ground.

Figure 31:
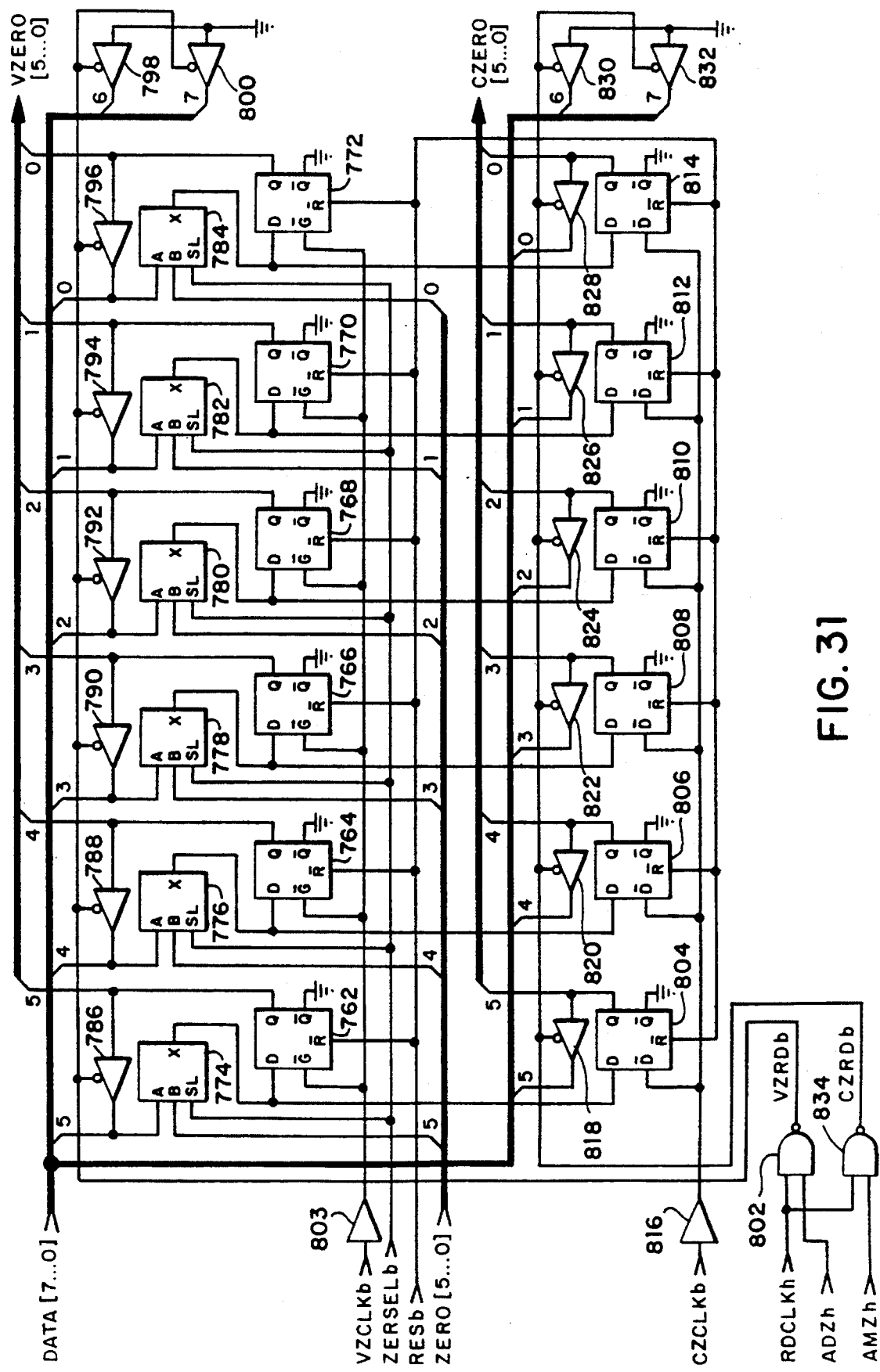
FIG. 31 is a schematic diagram of the auto-zero control registers in accordance with the present invention.

The MUXes 96a and 96b connect the output signal IOUT/I from the current mirror 92 either to the output pin MX0 or to the analog ground bus AVSS. More specifically, the MUX 96a is used to connect the output signal IOUT/I of the current mirror 92 to the MX0 pin under the control of a signal IOUTONh; available at the output of a NAND gate 759 (FIG. 35). The signal IOUTONh indicates that the integrator is not in a reset mode. An INTRESh signal as well as test signals are applied to the NAND gate 759. The MUX 96b is used to connect the current mirror 92 output signal IOUT/I to the analog ground bus AVSS under the control of a signal DISCHh, available at the output of a buffer 757. The input to the buffer 757 is an integrator reset signal INTRESh, available at the output of the AND gate 534 (FIG. 31).

The MUX 111a is used for auto-zeroing the current amplifier 90. Specifically, the MUX 111a connects both the inverting and non-inverting inputs of the current amplifier 90 to the analog ground bus AVSS under the control of a signal CSHRTh, available at the output of an inverter 581 (FIG. 34). The inverter 581 is serially connected to the output of the inverter 580. The input to the inverter 580 is the signal CAZh, which indicates the current amplifier 90 is being auto-zeroed.

The MUX 111b is used to connect the inverting input of the amplifier 90 to the IMUX output of the MUXes 68 (FIG. 42) whenever the amplifier 90 is not being auto-zeroed.

The ranged current from the current mirror 92 may then be dropped across an external resistor (not shown) to convert the signal to a voltage and converted by the A/D converter 78 as discussed above.

Figure 46:
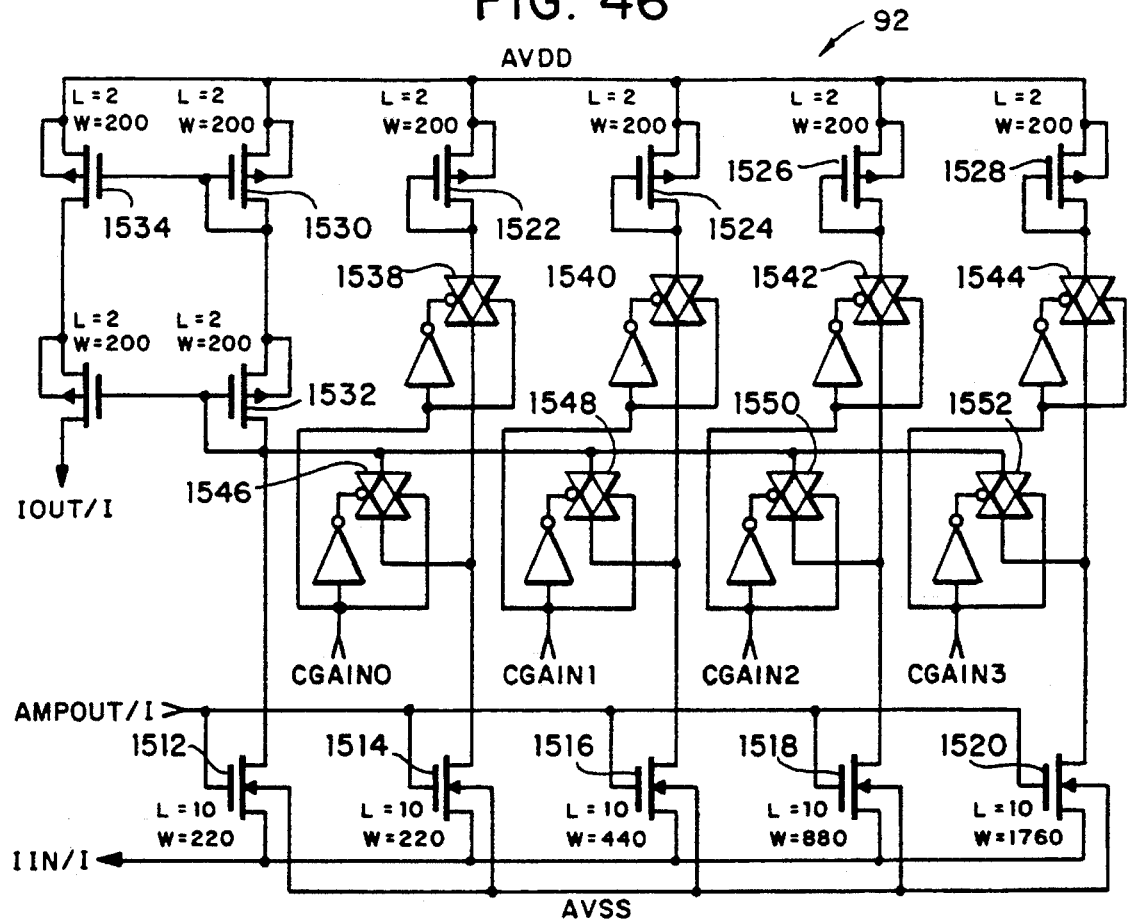
FIG. 46 is a schematic diagram of the current mirror in accordance with the present invention.

The current mirror 92 is illustrated in FIG. 46. The current mirror 92 includes current divider transistors 1512, 1514, 1516, 1518 and 1520, shunt transistors 1522, 1524, 1526 and 1528 and current mirrors 1530, 1532, 1534 and 1536. MUXes 1538, 1540, 1542 and 1544 control current shunting while MUXes 1546, 1548, 1550 and 1552 control the gain of the circuitry. These MUXes are controlled by the CGAIN[3 . . . 0] bus discussed above.

Negative currents are directed into the current mirror 92 at IIN/I. This input current is divided into five parts by the current divider transistors 1512, 1514, 1516, 1518 and 1520 which are all connected in parallel. More specifically, the sizes of the transistors 1512 and 1514 are maintained equal at a value, for example, A. The sizes of transistors 1516, 1518 and 1520 are 2A, 4A and 8A, respectively. Since the transistors 1512, 1514, 1516, 1518 and 1520 are connected as current mirrors, the current through each of the transistors will be a function of the size of the transistor. Thus, the output of transistors 1512 and 1514 each will be 1/16 of IIN/I. The output of transistor 1516 will be 1/8 IIN/I. The output of transistor 1518 will be 1/4 IIN/I. The output of the transistor 1520 will be 1/2 IIN/I. These fractions of the input current IIN/I are either summed together to produce the desired gain which is controlled by the MUXes 1546, 1548, 1550 and 1552 and directed to the output by way of the current mirrors 1530, 1532, 1534 and 1536 or shunted around the mirrors 1530, 1532, 1534 and 1536 by way of the transistors 1522, 1524, 1526 and 1528 and the MUXes 1538, 1540, 1542 and 1544.

This is an important aspect of the invention. Specifically, in known bipolar current ranging circuitry (for example, as disclosed in U.S. Pat. No. 4,626,831), the current dividers are cascaded. However, cascading of the current dividers is not viable for the IC 10 because of the relatively small operating voltage (e.g., +5.0 vdc).

CURRENT AND VOLTAGE AMPLIFIER ZEROING

Representative circuitry for the voltage and current amplifier 80 and 90 is illustrated in FIG. 48. These amplifiers are differential input amplifiers defining an internal bias current ITRIM/I. The differential inputs are identified as PLUS/I and MINUS/I. This internal bias current flows through resistors 1546 and 1548 which controls the offset voltage that appears at the amplifier 80 and 90 output. Known techniques have attempted to control the offset voltage by externally adjusting the resistor values of resistors 1546 and 1548, which requires precision variable resistors, such as digital-to-analog converter (DAC). Such DACs are relatively expensive. The auto-zeroing circuitry in accordance with the present invention, obviates the need for DACs and instead controls the bias current ITRIM/I to control the voltage across the resistors 1546 and 1548 to control the offset voltage. The bias current is ranged by a current dividing circuitry illustrated in FIG. 47. The ranged bias current is then applied to the amplifier 80 or 90 to control the bias current and the offset voltage.

The bias current ranging circuitry includes the MUXes 1600, 1602, 1604, 1606, 1608 and 1610, the current mirrors 1612, 1614, 1616, 1618, 1620, 1622 and 1624 and the transistors 1626 and 1628. The MUXes 1600, 1602, 1604, 1606, 1608 and 1610 are controlled by the VZERO[5 . . . 0] bus for the voltage amplifier 80 and the CZERO[5 . . . 0] bus for the current amplifier 90, as discussed below. These current mirrors are connected in parallel to allow the bias current to be divided into composite values and allow selected portions to be added together to generate the ranged current and operate in a similar manner as the current mirror 92.

GENERAL

Figure 49:
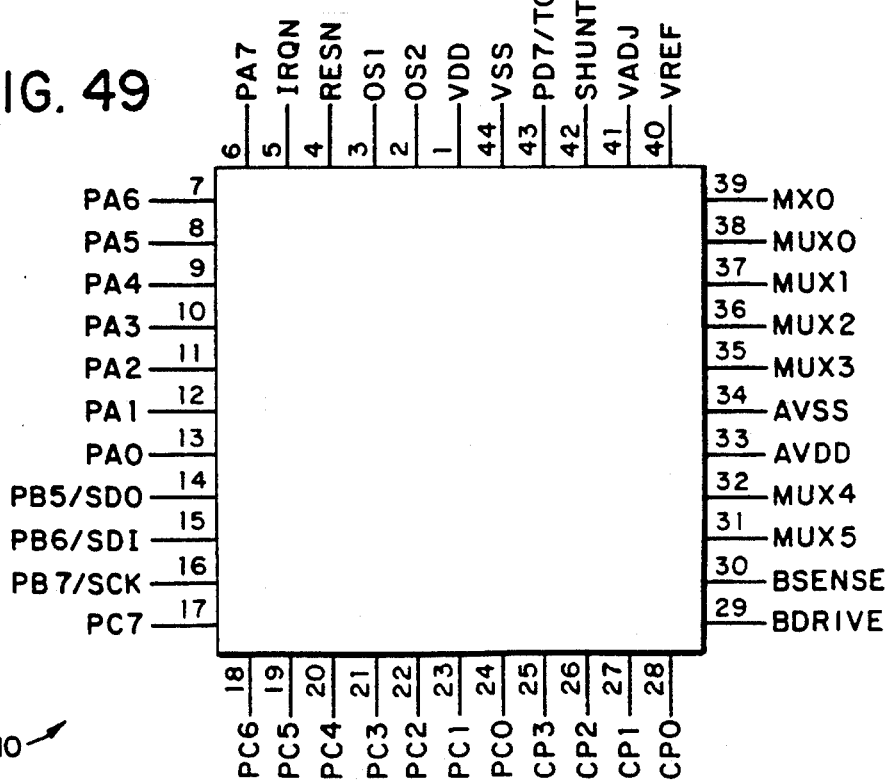
FIG. 49 is a pin out diagram of the IC in accordance with the present invention.

The IC 10 is a semi-custom CMOS integrated circuit. This integrated circuit is packaged in a 44-pin Plastic Leaded Chip Carrier (PLCC) J-lead, surface mount package. The IC 10 is illustrated in FIG. 49. Signal definitions are provided below. A pin summary is provided in Table 15. Stress ratings, recommended operating conditions and DC characteristics are provided in Appendix E. Current subsystem specifications and A/D specifications are provided in Appendix F.

SIGNAL DEFINITIONS

PA7 . . . PA0. These eight bidirectional port pins can be individually programmed to be inputs or outputs by the software.

PB7/SCK, PB6, SDI, PB5/SDO. These three bi-directional port pins can be individually programmed to be inputs or outputs by the software. They are shared with the Synchronous Serial I/O Port (SSIOP) and their functionality may be changed when that system is in use.

PC7 . . . PC0. These eight bidirectional port pins can be individually programmed to be inputs or outputs by the software. The low-order four pins can also be configured to be the logical OR of the outputs of the four comparators.

PD7/TCAP. This input only pin is the most-significant bit of port D. Its function is shared with timer 0 and is the input capture pin of the timer.

SHUNT. This output pin is high when the power supply is shunting current to AVDD.

MUX3 . . . MUX0. These four analog input pins are two thirds of the A/D subsystem inputs. They can be individually programmed to operate in either the voltage or current modes. In the voltage mode, they are high impedance inputs.

In the current mode, an active current source maintains a virtual ground level for currents out of the device pin. When unselected in the current mode, each pin is connected to digital ground.

MUX4 . . . MUX5. These two analog input pins are the other third of the A/D subsystem inputs. They can operate only in the voltage input mode. They are always high impedance inputs.

MXO. This analog output is used by the A/D subsystem in the current mode of operation. An external resistor or capacitor between this pin and analog ground converts the mirrored and ratioed current from the selected input into a voltage for A/D conversion. If an external capacitor is used, the internal amplifier is configured as an integrator and current auto-ranging must be disabled.

CP3 . . . CP0. These four high-impedance analog inputs are the inverting inputs of four comparators.

These pins are also used during testing to select various test modes.

IRQN. This low-true CMOS input is the asynchronous external input to the microcontroller. A mask programmable option permits selection of two triggering methods: 1) negative edge-sensitive triggering, or 2) both negative edge-sensitive and low level-sensitive triggering. In the latter case, either type of input to the IRQN pin will produce an interrupt. The interrupt request must be present at least 125 ns in edge-triggered mode.

If the level-sensitive mask option is selected, the IRQN pin requires an external resistor to VDD for wire-OR operation.

The IRQN pin also puts the IC 10 in a test mode when placed at +9 V during reset. This mode is for test only and should not be used during normal operation.

BSENSE. This analog input is the non-inverting input to the B+ comparator.

BDRIVE. This analog output is the output of the B+ comparator.

VADJ. This analog input is used to adjust the analog reference voltage: VREF.

VREF. This analog output is the internal +2.5 V reference. It is the output of the reference buffer amplifier and must be connected to the external reference trim resistor network.

AVDD. This pin is the +5 V analog supply voltage. An external resistor is used to create a current source for the shunt-regulated power supply. AVDD will be regulated to approximately 2 * VREF.

AVSS. This pin is the analog ground reference.

RESN. This low-true input provides an external method of initializing the IC 10. When using the external reset, RESN must stay low for a minimum of 1.5 processor phase 2 cycles. RESN is received by a Schmitt receiver.

OSC1. This is the input of the oscillator circuit.

OSC2. This is the output of the crystal oscillator circuit. It is the inversion of the OSC1 input.

VDD. This pin is the digital +5 V supply.

VSS. This is the digital negative supply. It should be connected externally to the AVSS pin.

TABLE 15

PIN - SIGNAL SUMMARY
SIGNAL DEFINITIONS

| SIGNAL | PIN | DIRECTION | TYPE |
|---|---|---|---|
| PA7 . . . PA0 | 6–13 | Bi-directional | CMOS |
| PB7 . . . PB5 | 14–16 | Bi-directional | CMOS |
| PC7 . . . PC0 | 17–24 | Bi-directional | CMOS |
| SHUNT | 42 | Output | CMOS |
| PD7/TCAP | 43 | Input | CMOS |
| MUX5 . . . MUX0 | 31, 32, 35–38 | Input | Analog |
| MX0 | 39 | Output | Analog |
| CP3 . . . CP0 | 14–18 | Input | Analog |
| RESN | 4 | Input | Schmitt |
| OSC2 | 2 | Output | Analog |

TABLE 15-continued

PIN - SIGNAL SUMMARY SIGNAL DEFINITIONS

| SIGNAL | PIN | DIRECTION | TYPE |
|---|---|---|---|
| OSC1 | 3 | Input | Analog |
| IRQN | 5 | Input | CMOS |
| BDRIVE | 29 | Output | Analog |
| BSENSE | 30 | Input | Analog |
| VADJ | 41 | Input | Analog |
| VREF | 40 | Output | Analog Reference |
| AVDD | 33 | Supply | Analog + Supply |
| AVSS | 34 | Supply | Analog − Supply |
| VSS | 44 | Supply | Digital − Supply |
| VDD | 1 | Supply | Digital + Supply |

APPENDIX A

The following specifications apply to the EEPROM 40A memory under the conditions that $V_{DD}$–5.0 vdc ±10% and the ambient temperature TA is between −40° C. and +85° C. The specifications are indicated in Table A1.

TABLE A1

EEPROM SPECIFICATIONS

| CHARACTERISTIC | SYMBOL | MIN | MAX | UNIT |
|---|---|---|---|---|
| EEPROM Erase Time | ERA | 10 | | ms |
| EEPROM Program Time 2 MHz osc. | PROG | 10 | | ms |
| EEPROM Program Time 1–2 MHz osc. | PROG | 20 | | ms |
| Write/Erase Endurance | | | 10,000 | cycles |

APPENDIX B

TABLE B1

B+ COMPARATOR SPECIFICATIONS

| SYMB. | PARAMETER | VALUE |
|---|---|---|
| $V_{IO}$ | Input offset voltage | ±20 mV max |
| $V_H$ | Hysteresis | 20 mV min |
| $I_{IO}$ | Input offset current | 1 nA max |
| $I_{IB}$ | Input bias current | 20 Na max |
| $V_{IN}$ | Input voltage range | $V_{SS}$ −0.5 V to $V_{REF}$ +.5V |
| $A_{VD}$ | Voltage amplification | 80 dB min |
| $V_{OL}$ | Output voltage @$I_{OL}$ = 3 mA | 700 mV max |
| $V_{OH}$ | Output voltage @$I_{OH}$ = −3 mA | $V_{DD}$ −700 mV min |
| $t_R$ | Response time $V_{DIFF}$ = 100 mV | 1 μs max |

TABLE B2

QUADCOMPARATOR SPECIFICATIONS

| SYM | PARAMETER | MIN | TYP | MAX | UNITS |
|---|---|---|---|---|---|
| $V_{IO}$ | Input offset voltage | | | ±20 | mV |
| $V_{IO}$ | Input offset current | 0 | — | ±1 | nA |
| $I_{IB}$ | Input bias current | | | 20 | nA |
| $V_{IN}$ | Input voltage range | $V_{SS}$ | — | $V_{DD}$ | V |
| $V_{TH-}$ | Negative threshold (output high) | 1.2 | 1.25 | 1.3 | V |
| $A_{VD}$ | Voltage amplification | 80 | | | dB |

TABLE B2-continued

QUADCOMPARATOR SPECIFICATIONS

| SYM | PARAMETER | MIN | TYP | MAX | UNITS |
|---|---|---|---|---|---|
| $V_{OL}$ | Output voltage @$I_{OH}$ = 3 mA | 0 | — | 700 | mV |
| $V_{OH}$ | Output voltage @$I_{OH}$ = 3 mA | $V_{DD}$ −700 | — | | $V_{DD}$ mV |
| $t_R$ | Response time $V_{DIFF}$ = 100 mV | | | 1 | μs |
| $t_R$ | Hysteresis | 20 | — | 80 | mV |

APPENDIX C

AUTO-ZERO STATE MACHINE STATE DIAGRAM

FIG. 50 is a state diagram for the auto-zero function. Each bubble represents an operating state. The arrows between state show permissible transitions and the conditions required for the transition. Table C-1 shows the transitions from state to state in table form.

TABLE C-1

STATE ASSIGNMENT AUTO-ZERO STATE ASSIGNMENT

| State | R0 R1 R2 |
|---|---|
| S0 | 000 |
| S1 | 010 |
| S2 | 110 |
| S3 | 011 |
| S4 | 001 |
| S5 | 101 |
| S6 | 111 |
| S7 | 100 |

STATE TRANSITION TABLE

Figure 51:
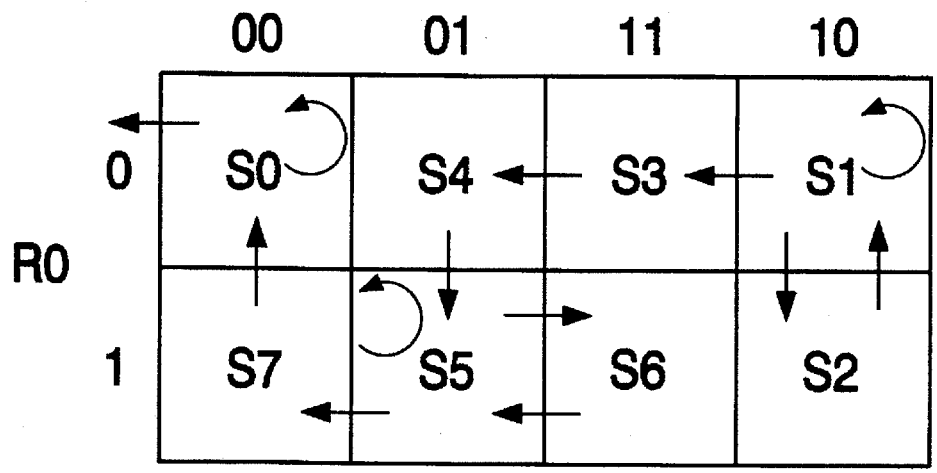
FIG. 51 depicts an auto-zero Karnaugh mapping.

FIG. 51 shows the state assignment on the 3-bit Karnaugh map along with the allowable state transitions.

Figure 52:
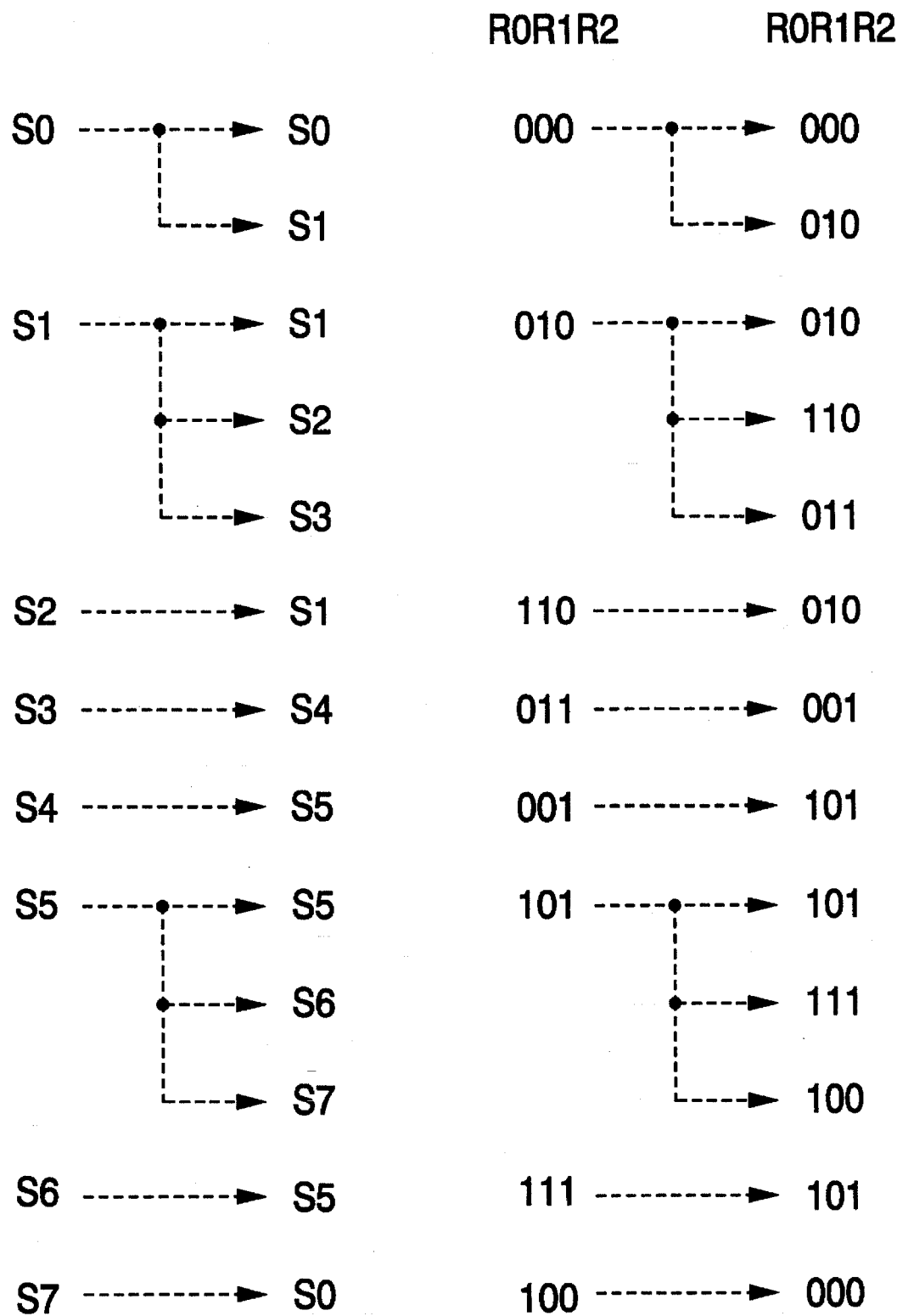
FIG. 52 depicts an auto-zero state transition table.

FIG. 52 shows the auto-zero state transition table.

TRANSITION TABLE STATE EQUATIONS

The logic equations for R0, R1 and R2 are given in the following sections. The equations are written for the states in the transition table where the resulting state is a logic 1. For example, in the first line of the transition table, the only equation that needs to be written is the equation for R1 resulting from the transition from state S0 to S1. The equations below are referenced to the transition table by the originating state.

The following notation is used:

| | |
|---|---|
| ! | not operator |
| * | and operator |
| + | or operator |
| h suffix | high true signal |
| b suffix | low true signal |
| d suffix | flip-flop D input signal |

The * operator has precedence over the + operator.

REDUCED STATE EQUATIONS FOR R0

Reducing the terms which only involve R0h, R1h and R2h, using Karnaugh map techniques, and combining with terms which cannot be reduced yields the following equation for R0d.

| | |
|---|---|
| R0d = | !R0h * R1h * !R2h * TIMOUTh * VAMPb & FULLb + !R1h * R2h<br>R0H * R2h |

STATE EQUATIONS FOR R1

| | |
|---|---|
| state S0 | R1d = !R0h * !R1h * !R2h * STAZh * !ARBSYh |
| state S1 | R1d = !R0h * R1h * !R2h |
| state S2 | R1d = R0h * R1h * !R2h |
| state S3 | No terms needed for this state. |
| state S4 | No terms needed for this state. |
| state S5 | R1d = R0h & /!R1h * R2h * TIMOUTh * CAMPb * FULLb |
| state S6 | No terms needed for this state. |
| state S7 | No terms needed for this state. |

REDUCED STATE EQUATIONS FOR R1

| | |
|---|---|
| R1d = | !R0h * !R1h * !R2h * STAZh * !ARBSYh +<br>R0h * !R1h * R2h * TIMOUTh * CAMPb & FULLb + R1 * !R2 |

STATE EQUATIONS FOR R2

| | |
|---|---|
| state S0 | No terms needed for this state. |
| state S1 | R2d = !R0h * R1h * !R2h * TIMOUTh * (!VAMPb + !FULLb) |
| state S2 | No terms needed for this state. |
| state S3 | R2d = !R0h * R1h * R2h |
| state S4 | R2d = !R0h * !R1h * R2h |
| state S5 | R1d = R0h * !R1h * R2h * (!TIMOUTh + TIMOUTh * CAMPb * FULLb) |
| state S6 | R2d = R0h & R1h * R2h |
| state S7 | No terms needed for this state. |

REDUCED STATE EQUATIONS FOR R2

| | |
|---|---|
| R2d = | !R0h * R1h * !R2h * TIMOUTh * (!VAMPb + !FULLb) + R0h * !R1h * R2h * !TIMOUTh +<br>R0h * !R1h * R2h * TIMOUTh * CAMPb * FULLb +<br>!R0h * R2h +<br>R1h * R2h |

OUTPUT EQUATIONS

!ZERRESb = !R0h * !R1h
ZERCLKh = R0h * R1h
TIMREQh = !R0h * R1h * !R2h + R0h * !R1h * R2h
AZBSYh = !(!R0h * !R1h * !R2h
EOAZh = R0h * !R1h * !R2h
CAZh = R0h * R2h + !R1h * R2h
VAZh = R1h * !R2h
CZCLKh = !CAZh
VZCLKH = !VAZh

APPENDIX D

AUTO-RANGE STATE MACHINE STATE DIAGRAM

Figure 53:
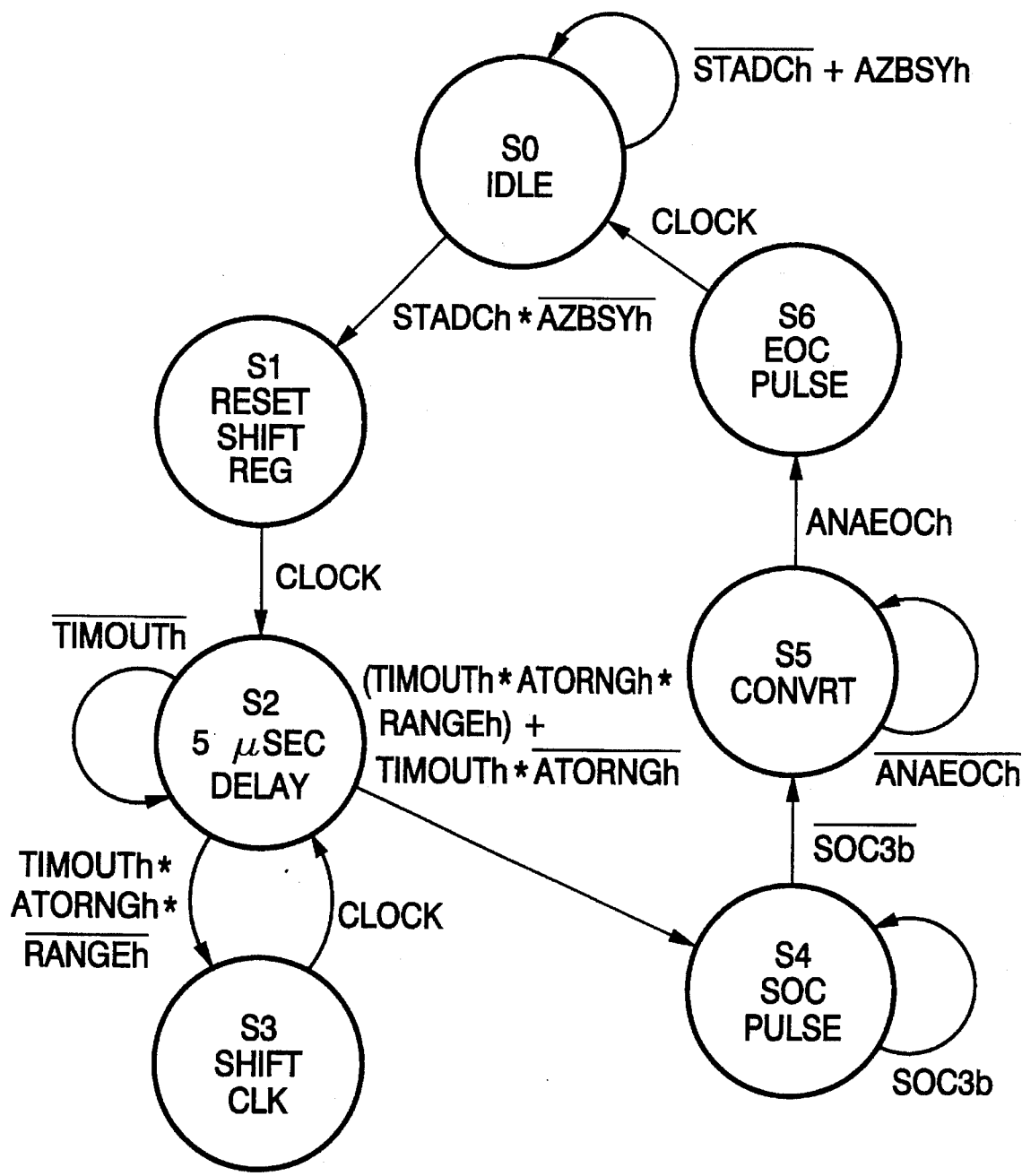
FIG. 53 depicts a state diagram for the auto-range function.

FIG. 53 is the state diagram for the auto-range function. Each bubble represents an operating state. The arrows between state show permissible transitions and the conditions required for the transition. Table D-1 shows the transitions from state to state in table form.

TABLE D-1

| STATE ASSIGNMENT AUTO-ZERO STATE ASSIGNMENT | |
|---|---|
| State | R0 R1 R2 |
| S0 | 000 |

TABLE D-1-continued

| STATE ASSIGNMENT AUTO-ZERO STATE ASSIGNMENT | |
|---|---|
| State | R0 R1 R2 |
| S1 | 001 |
| S2 | 011 |
| S3 | 010 |
| S4 | 111 |
| S5 | 101 |
| S6 | 100 |

STATE TRANSITION TABLE

Figure 54:
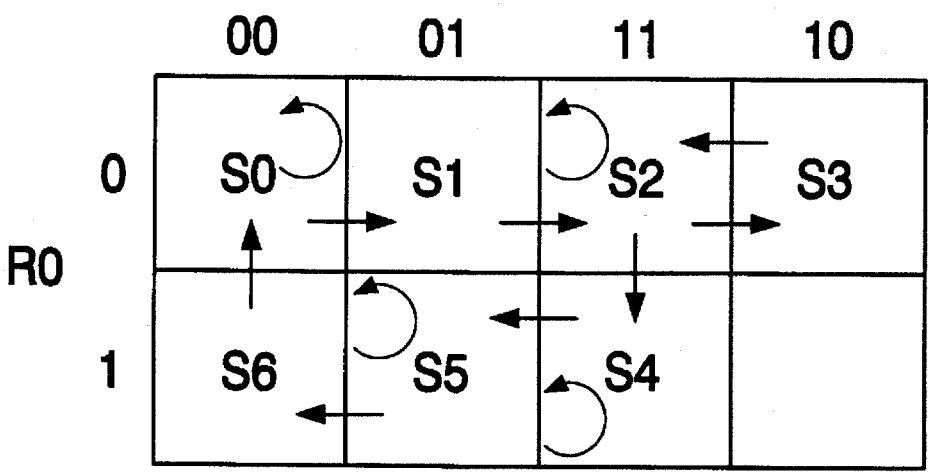
FIG. 54 depicts auto-range Karnaugh mapping.

FIG 54 shows the state assignment on the 3-bit Karnaugh map along with the allowable state transitions.

TRANSITION TABLE STATE EQUATIONS

The logic equations for R0, R1 and R2 are given in following sections.

STATE EQUATIONS FOR R0

| | |
|---|---|
| state S0 | No terms needed for this state. |
| state S1 | No terms needed for this state. |
| state S2 | R0d = !R0h * R1h * R2h * (TIMOUTh * ATORNGh * RANGEh + TIMOUTh * !ATORNGh) |
| state S3 | No terms needed for this state. |
| state S4 | R0d = R0h * R1h * R2h |
| state S5 | R0d = R0h * !R1h * R2h |
| state S6 | No terms needed for this state |

REDUCED STATE EQUATIONS FOR R0

Reducing the terms which only involve R0h, R1h and R2h, using Karnaugh map techniques, and combining with terms which cannot be reduced yields the following equation for R0d.

| | |
|---|---|
| R0d = | !R0h * R1h * R2h * TIMOUTh * ATORNGh * RANGEh + !R0h * R1h * R2h * TIMOUTh * !ATORNGh + R0H * R2h |

STATE EQUATIONS FOR R1

| | |
|---|---|
| state S0 | No terms needed for this state. |
| state S1 | R1d = !R0h * !R1h * R2h |
| state S2 | R1d = !R0h * R1h * !R2h |
| state S3 | R1d = !R0h * R1h * !R2h |
| state S4 | R1d = R0h * R1h * R2h * SOC3b |
| state S5 | No terms needed for this state. |
| state S6 | No terms needed for this state. |

REDUCED STATE EQUATIONS FOR R1

| | |
|---|---|
| R1d = | R0h * R1h * R2h *SOC3b +<br>!R0h * R1h +<br>R0h * R2 |

STATE EQUATIONS FOR R2

| | |
|---|---|
| state S0 | R2d = !R0h * !R1h * !R2h * !AZBSYh * STADCh |
| state S1 | R2d = !R0h * !R1h * R2h |
| state S2 | R2d = !R0h * R1h * R2h * (!TIMOUTh + TIMOUTh * ATORNGh * RANGEh) |
| state S3 | R2d = !R0h * R1h * !R2h |
| state S4 | R2d = R0h * R1h * R2h |
| state S5 | R2d = R0h * !R1h * R2h * !ANAEOCh |
| state S6 | No terms needed for this state. |

REDUCED STATE EQUATIONS FOR R2

Reducing the terms which only involve R0h, R1h and R2h, using Karnaugh map techniques, and combining with terms which cannot be reduced yields the following equation for R2d.

```
R2d =   !R0h * !R1h * !R2h * !AZBSYh * STADCh +
        !R0h * !R1h * R2h +
        !R0h * R1h * R2h * !TIMOUTh
        !R0h * R1h * R2h * TIMOUTh * ATORNGh * RANGEh + !R0h * R1h * R2h * TIMOUTh * !ATORNGh + !R0h * R1h * !R2h +
        R0h * R1h * R2h +
        R0H * !R1h * R2h * !ANAEOCh
```

OUTPUT EQUATIONS

```
GRESh = !R0h * !R1h * R2h * !SMCLKh
GCLKh = !R0h * R1h * !R2h * !SMCLKh
TIMREQh = !R0h * R1h * R2h
```

-continued

```
ARBSYh = !(!R0h * !R1h * !R2h)
EOCh = R0h * !R1h * !R2h
ANASOCh = R0h * R1h * R2h
```

APPENDIX E

Stress ratings for the IC 10 are provided in Table E1. Stresses above ratings provided in Table A1 can cause permanent damage to the device.

TABLE E1

| | |
|---|---|
| Supply Voltage Range | −0.3 V to +7.0 V |
| Temperature Under Bias | −55° C. to +125° C. |
| Storage Temperature | −65° C. to +150° C. |
| Input Diode Current | ±10-mA |
| Input Voltage (not IRQN or EXPN) | $V_{SS}$ − 0.3 V to $V_{DD}$ + 0.3 V |
| Input Voltage IRQN & EXPN | $V_{SS}$ −0.3 V to $2 \times V_{DD}$ + 0.3 V |
| Continuous Output Current | ±25 mA |
| Continuous Supply Current | 100 mA |
| Dissipation | 0.5 W |

Normal operating conditions for the IC 10 are provided in Table E2. These limits apply for normal operations of the IC 10.

TABLE E2
RECOMMENDED OPERATING CONDITIONS

| SYM | PARAMETER | MIN | TYP | MAX | UNITS |
|---|---|---|---|---|---|
| $T_A$ | Ambient Temperature | −40 | | +85 | °C. |
| VDD | Supply Voltage | 4.5 | 5.0 | 5.5 | V |
| $V_{IN}$ | Input Voltage | 0.0 | | $V_{DD}$ | V |
| $f_{OSC}$ | Oscillator | 0.0 | 7.3728 | 8.0 | MHz |

The DC characteristics of the IC 10 are provided in Table A3. The characteristics listed in Table A3 are valid over the operating range of temperature and voltage as defined in Table A1 unless otherwise specified.

TABLE E3
DC CHARACTERISTICS

| TEST | SYM | PARAMETER | MIN | MAX | UNITS |
|---|---|---|---|---|---|
| 1 | $V_{IL}$ | Input Low Voltage | 0.0 | $0.2 \times V_{DD}$ | V |
| 2 | $V_{IH}$ | Input high voltage | $0.7 \times V_{DD}$ | $V_{DD}$ | V |
| 3 | $V^+$ | + Schmitt | 2.7 | 4.1 | V |
| 4 | $V^-$ | − Schmitt | 1.1 | 2.1 | V |
| 5 | $V_H$ | Hysteresis | 0.6 | — | V |
| 6 | $I_{IN}$ | Input Current | — | ±1 | μA |
| 7 | $I_{OZ}$ | Tri-state Leakage | — | ±10 | μA |
| 8 | $V_{COL}$ | Output Voltage $I = -10$ μA | — | 0.10 | V |
| 9 | $V_{COH}$ | Output Voltage $I = 10$ μA | $VDD^{-0.10}$ | — | V |
| 10 | $V_{OL}$ | Output Voltage $I = 1.6$ mA | — | 0.4 | V |
| 11 | $V_{OH}$ | Output Voltage | $VDD^{-0.8}$ | — | V |
| 12 | $C_{OUT}$ | Capacitance, output | — | 12 | pF |
| 13 | $C_{IN}$ | Capacitance, input | — | 8 | pF |
| 14 | $I_{DD}$ | Supply Current @ 4 MHz | 0 | 10 | mA |

APPENDIX F

TABLE F1
CURRENT SUBSYSTEM AMPLIFIER SPECIFICATIONS

| SYMB. | PARAMETER | VALUE |
|---|---|---|
| $V_{OS}$ | Offset Voltage | 0 to −1.0 mV max |
| $I_{IO}$ | Input offset current | 1 nA max |
| $U_{IB}$ | Input bias current | 1 nA max |
| $V_{ICM}$ | Input common mode | $V_{SS}$ to 1.5 V |
| $A_{VD}$ | Voltage Amplification | 80 dB min |
| $I_O$ | Output Current | 100 μA max |
| BW | Unity gain bandwidth | 80 kHz min |

TABLE F2
A/D CONVERTER SUBSYSTEM SPECIFICATIONS

| SYMB. | PARAMETER | VALUE |
|---|---|---|
| $V_{OS}$ | Offset Voltage | 0 to −1.0 mV max |
| $I_{IO}$ | Input offset current | 1 nA max |

TABLE F2-continued

A/D CONVERTER SUBSYSTEM SPECIFICATIONS

| SYMB. | PARAMETER | VALUE |
| --- | --- | --- |
| $I_{IB}$ | Input bias current | 1 nA max |
| $V_{ICR}$ | Input common mode range | $V_{SS}$ to $V_{REF}$ −0.5 V |
| $V_{IN}$ | Input range | $V_{SS}$ to $V_{REF}$ +0.5 V |
| | Resolution | 8 bits min |
| | Linearity | ±1 LSB min |
| | Differential non-linearity | ±0.5 LSB max |
| $T_{CR}$ | Conversion Time | 24 μs max |

We claim:

1. A CMOS monolithic circuit comprising:
an analog subsystem including analog receiving means for receiving analog signals;
a digital subsystem including digital receiving means for receiving digital signals;
producing means interconnected with said analog receiving means and said digital receiving means for producing an output signal responsive to said analog subsystem or said digital subsystem; and
means for resetting said digital subsystem responsive to said analog subsystem and said digital subsystem.

2. A CMOS monolithic circuit as recited in claim 1, further including an analog power supply means for providing a first predetermined voltage to said analog subsystem and digital power supply means for providing a second predetermined voltage to said digital subsystem.

3. A CMOS monolithic circuit as recited in claim 2, wherein said resetting means includes means for monitoring said first predetermined voltage and resetting said digital subsystem when said first predetermined voltage falls below a predetermined value.

4. A CMOS monolithic circuit as recited in claim 2, wherein said resetting means includes means for monitoring said second predetermined voltage and resetting said digital subsystem when said second predetermined voltage falls below a predetermined value.

5. A CMOS monolithic circuit as recited in claim 2, wherein said resetting means includes means for monitoring said first and second predetermined voltages and resetting said digital subsystem whenever said first or second predetermined voltages fall below a predetermined value.

6. A CMOS monolithic circuit comprising:
an analog subsystem including analog receiving means for receiving differential input signals and producing an output signal as a predetermined function of said input signals and bias currents internally generated by said receiving analog means which control an input offset voltage to said analog receiving means;
a digital subsystem including digital receiving means for receiving digital signals;
producing means interconnected with said analog receiving means and said digital receiving means for producing an output signal responsive to said analog or digital subsystems; and
means for controlling said bias currents.

7. A CMOS monolithic circuit as recited in claim 6, wherein said controlling means is responsive to said digital subsystem.

8. A CMOS monolithic circuit as recited in claim 7, wherein said controlling means includes means for isolating said output signal and said differential input signals.

9. A CMOS monolithic circuit as recited in claim 7, wherein said controlling means includes means grounding said inputs.

10. A CMOS monolithic circuit as recited in claim 7, wherein controlling means includes means for varying said bias currents in discrete steps until said output signal is at a predetermined value.

11. A CMOS monolithic circuit as recited in claim 6, wherein said controlling means includes means for maintaining said bias currents at a predetermined value.

12. A CMOS monolithic circuit as recited in claim 11, wherein said digital subsystem includes a microprocessor.

13. A CMOS monolithic circuit as recited in claim 12, wherein said maintaining means is addressable by said microprocessor.

14. A CMOS monolithic integrated circuit comprising:
securing means for securing digital input signals;
receiving means for receiving analog signals;
producing means interconnected with said securing means and said receiving means for producing digital output signals as a predetermined function of said analog signals or said digital signals; and
disabling means for disabling said producing means as a predetermined function of said receiving means.

* * * * *